United States Patent [19]

Okuda

[11] Patent Number: 5,363,319
[45] Date of Patent: Nov. 8, 1994

[54] LOGIC SIMULATOR

[75] Inventor: Nobuo Okuda, Kanagawa, Japan

[73] Assignee: Kabushiki Kaisha Toshiba, Kawasaki, Japan

[21] Appl. No.: 766,380

[22] Filed: Sep. 27, 1991

[30] Foreign Application Priority Data

| Sep. 29, 1990 | [JP] | Japan | 2-258843 |
| Sep. 29, 1990 | [JP] | Japan | 2-258845 |
| Sep. 29, 1990 | [JP] | Japan | 2-258851 |
| Sep. 29, 1990 | [JP] | Japan | 2-258852 |

[51] Int. Cl.⁵ .......................................... G06F 15/20
[52] U.S. Cl. .................................. 364/578; 364/488; 341/122; 371/6; 371/23; 371/24; 371/27
[58] Field of Search ............... 364/488, 489, 490, 491, 364/578; 341/61, 121, 122, 123, 178; 371/6, 23, 24, 27

[56] References Cited

U.S. PATENT DOCUMENTS

| 4,668,880 | 5/1987 | Shoji | 307/469 |
| 4,697,241 | 9/1987 | Lavi | 364/488 |
| 4,706,216 | 11/1987 | Carter | 365/94 |
| 4,891,773 | 1/1990 | Ooe et al. | 364/578 |
| 4,945,503 | 7/1990 | Takasaki | 364/578 |
| 5,014,226 | 5/1991 | Horstman et al. | 364/551.01 |
| 5,051,911 | 9/1991 | Kimura et al. | 364/468 |
| 5,105,374 | 4/1992 | Yoshida | 364/578 |
| 5,128,871 | 7/1992 | Schmitz | 364/490 |

OTHER PUBLICATIONS

High Performance Systems, Oct. 1989, pp. 28–37; "ASIC Emulation Cuts Design Risk"; Michael D'Amour et al.

Primary Examiner—Thomas G. Black
Assistant Examiner—Susan Wieland
Attorney, Agent, or Firm—Oblon, Spivak, McClelland, Maier & Neustadt

[57] ABSTRACT

A logic simulator having plural logic function sections for realizing a logic circuit, plural connection sections for connecting these logic function sections, a control section for constructing a logic simulation circuit by controlling these logic function sections and connection sections, and a host computer as an interface and a controller of the logic simulator. Each logic element includes a memory for storing information to decide a logic function, another memory for storing other control information. A logic element having a PLA where each logic to be realized is developed by an AND plane and the result is obtained through an OR plane based on predetermined information. A logic element having a universal logic gate, the input terminals of the universal logic gate being respectively connected to the input terminals of the logic element through plural switches. A unit-delay multiples logic element having a sampling hold circuit including a specification section for specifying only one pulse signal from a multiplexed input signal, a sampling section for sampling a pulse signal specified by the specification section at a predetermined simulation cycle, and a hold section for holding a pulse signal sampled by the sampling section and converting the pulse signal into a restoration signal having a constant level at start of a new simulation cycle, a logic circuit for giving a predetermined logic operation to the restoration signal, and a pulse circuit for producing a multiplexable pulse signal from a signal processed by the logic circuit.

7 Claims, 93 Drawing Sheets

FIG.10

| ADDRESS | | | MEMORY DATA |
|---|---|---|---|
| $2^2$ C | $2^1$ B | $2^0$ A | |
| 0 | 0 | 0 | 1 |
| 0 | 0 | 1 | 0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 0 |
| 1 | 1 | 1 | 0 |

| INPUT | | | OUTPUT |
|---|---|---|---|
| C | A | B | Qn+1 |
| H | * | * | L |
| L | L | ⌐ | L |
| L | H | ⌐ | H |
| L | * | ¬ | Qn |

* : BOTH H/L CAN BE USED
 ⌐ : RISE TIMING
 ¬ : FALL TIMING

| A | B | C | MEMORY DATA |
|---|---|---|---|
| 0 | 0 | 0 | 0* |
| 0 | 0 | 1 | 0 |
| 0 | 1 | 0 | 0 |
| 0 | 1 | 1 | 0 |
| 1 | 0 | 0 | 0* |
| 1 | 0 | 1 | 0 |
| 1 | 1 | 0 | 1 |
| 1 | 1 | 1 | 0 |

| INPUT | | | OUTPUT |
|---|---|---|---|
| C | A | B | Qn+1 |
| H | * | * | L |
| L | L | H | L |
| L | H | H | H |
| L | * | L | Qn |

*: BOTH H/L CAN BE USED

| A | B | C | MEMORY DATA |
|---|---|---|---|
| 0 | 0 | 0 | 0* |
| 0 | 0 | 1 | 0 |
| 0 | 1 | 0 | 0 |
| 0 | 1 | 1 | 0 |
| 1 | 0 | 0 | 0* |
| 1 | 0 | 1 | 0 |
| 1 | 1 | 0 | 1 |
| 1 | 1 | 1 | 0 |

FIG.18(A)
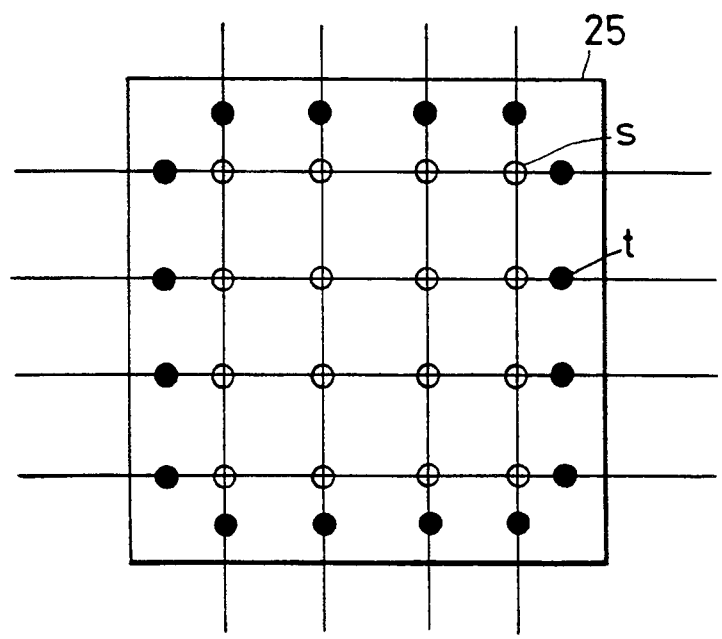
FIG.18(B)      FIG.18(C)
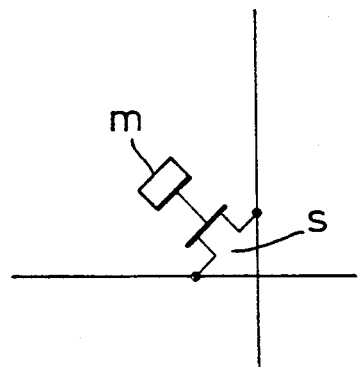    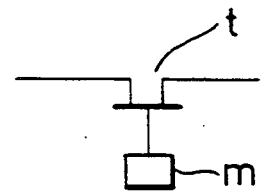

| REQ | ACK3 | ACK2 | ACK1 | ACK0 | RX | R1 | R0 |
|-----|------|------|------|------|----|----|----|
| 1 | 0 | 0 | 0 | 0 | 1 | 0 | 0 |
| 1 | 0 | 0 | 0 | 1 | 0 | 0 | 0 |
| 1 | 0 | 0 | 1 | 0 | 0 | 0 | 1 |
| 1 | 0 | 1 | 0 | 0 | 0 | 1 | 0 |
| 1 | 1 | 0 | 0 | 0 | 0 | 1 | 1 |

FIG.35

| A | B | C | H |
|---|---|---|---|
| 0 | 0 | 0 | 1 |
| 0 | 0 | 1 | 1 |
| 0 | 0 | U | 1 |
| 0 | 1 | 0 | 1 |
| 0 | 1 | 1 | 1 |
| 0 | 1 | U | 1 |
| 0 | U | 0 | 1 |
| 0 | U | 1 | 1 |
| 0 | U | U | 1 |
| 1 | 0 | 0 | 1 |
| 1 | 0 | 1 | 1 |
| 1 | 0 | U | 1 |
| 1 | 1 | 0 | 1 |
| 1 | 1 | 1 | 0 |
| 1 | 1 | U | U |
| 1 | U | 0 | 1 |
| 1 | U | 1 | U |
| 1 | U | U | U |
| U | 0 | 0 | 1 |
| U | 0 | 1 | 1 |
| U | 0 | U | 1 |
| U | 1 | 0 | 1 |
| U | 1 | 1 | U |
| U | 1 | U | U |
| U | U | 0 | 1 |
| U | U | 1 | U |
| U | U | U | U |

FIG. 38
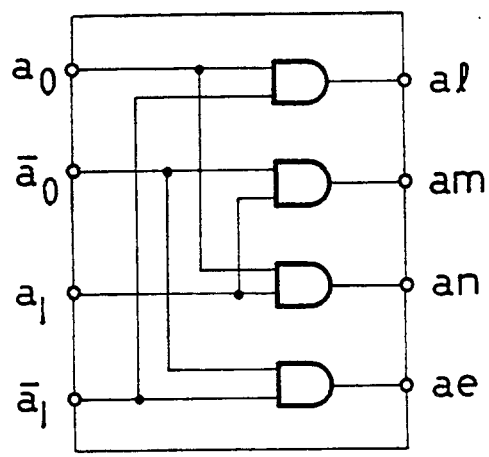
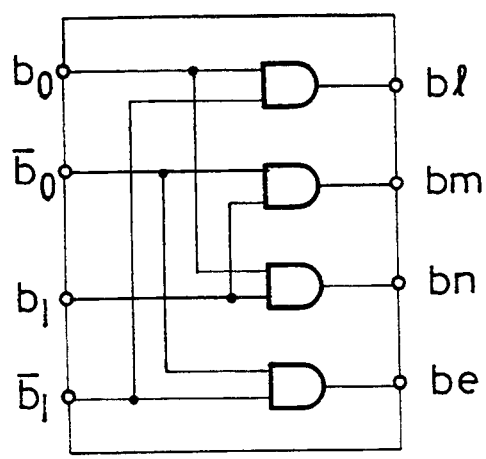
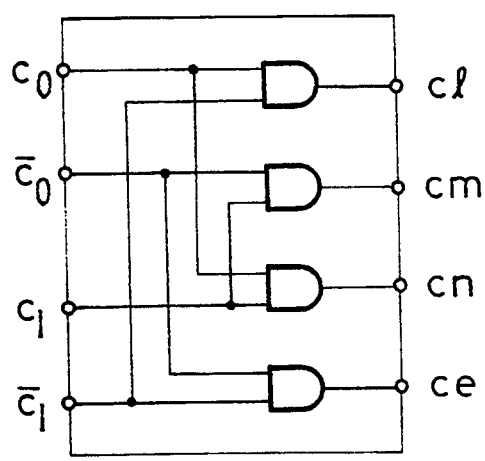

FIG.49
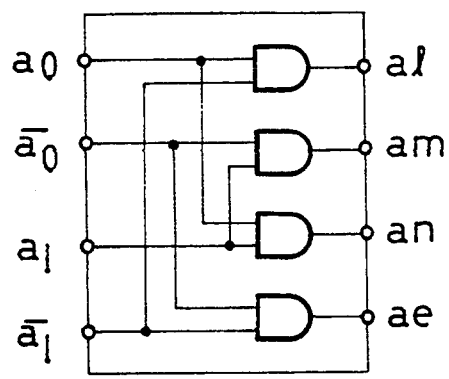
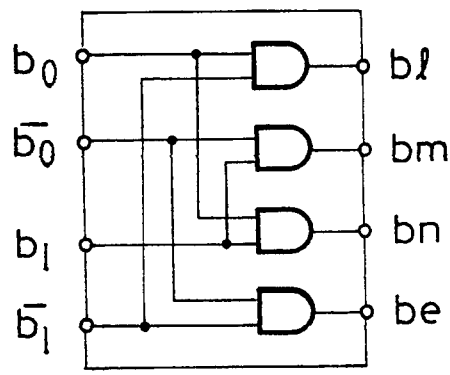
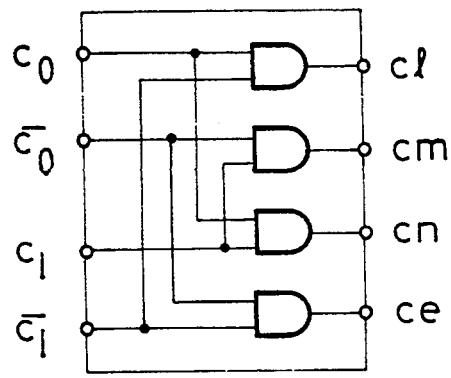
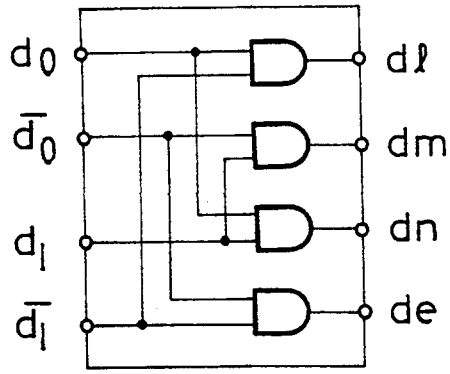

FIG.54(C)

| A | B | C | H |
|---|---|---|---|
| 0 | 0 | 0 | 0 |
| 1 | 0 | 0 | 0 |
| 0 | 1 | 0 | 0 |
| 1 | 1 | 0 | 0 |
| 0 | 0 | 1 | 0 |
| 1 | 0 | 1 | 0 |
| 0 | 1 | 1 | 0 |
| 1 | 1 | 1 | 1 |

FIG.55

| A | B | C | H |
|---|---|---|---|
| 0 | 0 | 0 | 0 |
| 1 | 0 | 0 | 0 |
| 0 | 1 | 0 | 0 |
| 1 | 1 | 0 | 1 |
| 0 | 0 | 1 | 0 |
| 1 | 0 | 1 | 0 |
| 0 | 1 | 1 | 1 |
| 1 | 1 | 1 | 1 |

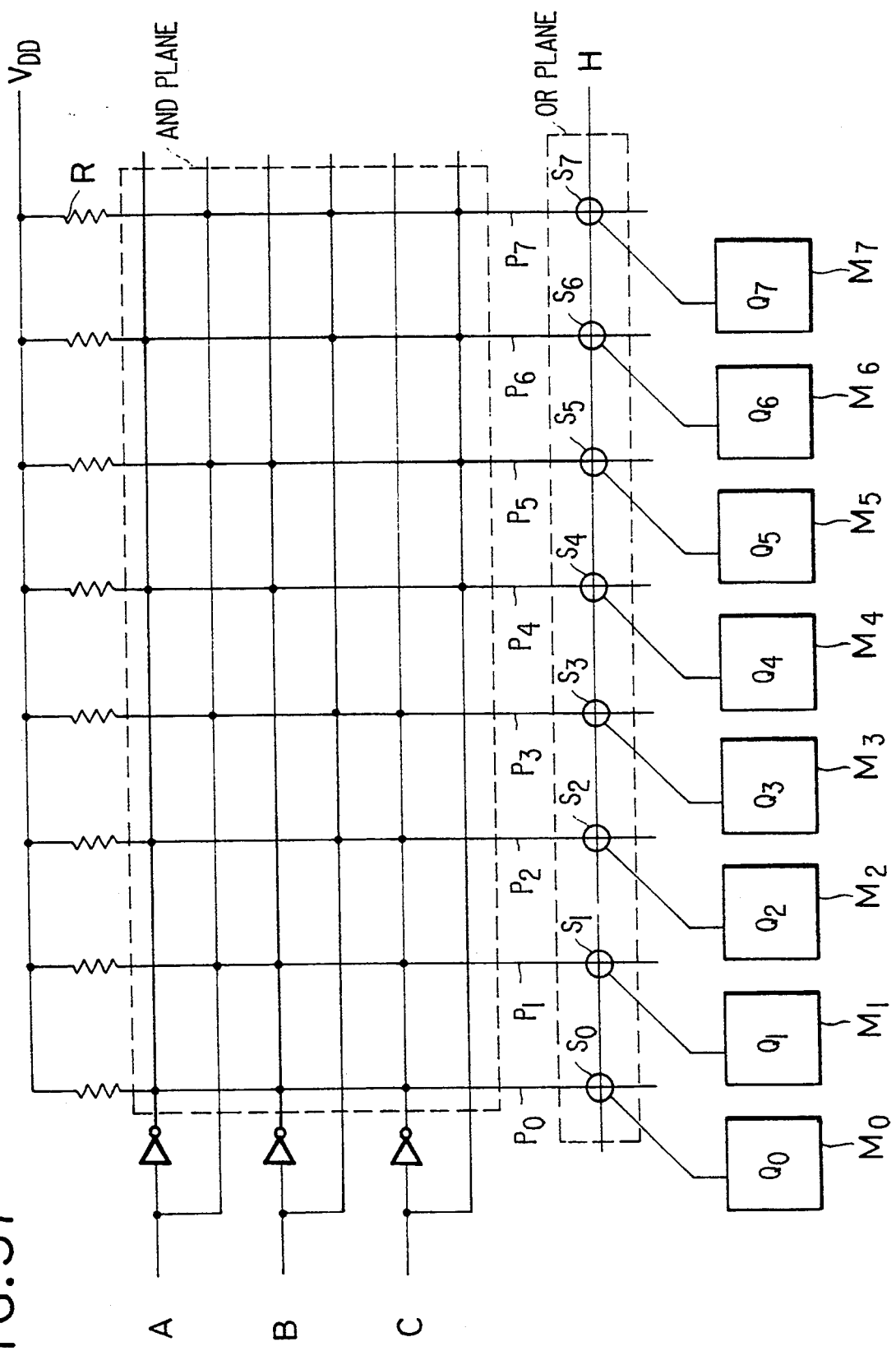

FIG.59

(*) SINCE THE SIGNAL B IS NOT CHANGED, DFF IS NOT OPERATED (**) DFF IS OPERATED ON THE RISE TIME THE SIGNAL B.

(***) DFF IS REST AT H=0 REGARDRESS OF THE SIGNALS A,B.

| A | B | C | H |
|---|---|---|---|
| 0 | 0 | 0 | 0 (*) |
| 1 | 0 | 0 | 0 (*) |
| 0 | 1 | 0 | 0 (**) |
| 1 | 1 | 0 | 1 (**) |
| 0 | 0 | 1 | 0 (***) |
| 1 | 0 | 1 | 0 (***) |
| 0 | 1 | 1 | 0 (***) |
| 1 | 1 | 1 | 0 (***) |

FIG.61

(*) SINCE THE SIGNAL B IS NOT CHANGED, THE CONNECTION IS NOT CARRIED OUT () ALWAYS A B WHILE THE SIGNAL B IS HIGH (*) ALWAYS H=0 WHILE THE SIGNAL C IS HIGH

| A | B | C | H |
|---|---|---|---|
| 0 | 0 | 0 | 0 (*) |
| 1 | 0 | 0 | 0 (*) |
| 0 | 1 | 0 | 0 (**) |
| 1 | 1 | 0 | 1 (**) |
| 0 | 0 | 1 | 0 (***) |
| 1 | 0 | 1 | 0 (***) |
| 0 | 1 | 1 | 0 (***) |
| 1 | 1 | 1 | 0 (***) |

FIG. 66

TRUTH TABLE

| $M_0$ | $M_1$ | $M_2$ | $M_3$ | $M_4$ | $M_5$ | $M_6$ | $M_7$ | OUTPUT F/F |
|---|---|---|---|---|---|---|---|---|

$R_0$ $R_1$ $R_2$ — — —

REGISTER

| | | FALL STATUS | RISE STATUS | FALL PERMISSION | RISE PERMISSION | DLATCH | DFF | LOGIC |
|---|---|---|---|---|---|---|---|---|

$R_{n-1}$ $R_{n-2}$ — — —

FIG. 69
|   | A | |
|---|---|---|
|   | 0 | 1 |
| B 0 | a | a |
| B 1 | a | a |
FIG. 70(A)
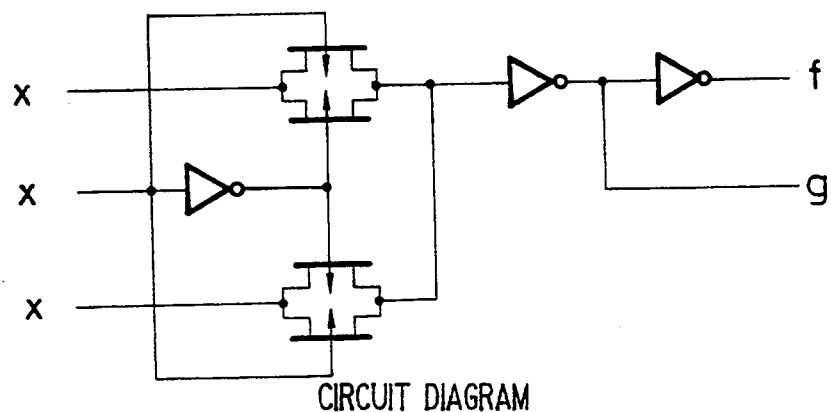
CIRCUIT DIAGRAM
FIG. 70(B)
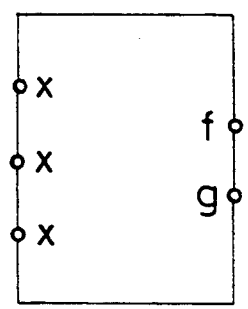
$f = x_i x_j + x_k \overline{x_j}$
$g = \overline{f}$
EXPRESSION METHOD

H = A

H = AB

H = A$\bar{B}$

H = $\bar{A}\bar{B}$

H = AB + $\bar{A}\bar{B}$

| K | $x_i$ | $x_j$ | $x_k$ | f |
|---|---|---|---|---|
| 1 | — | 0 | A | A |
| 2 | A | B | 0 | AB |
| 3 | 0 | B | A | $A\bar{B}$ |
| 4 | 0 | B | $\bar{A}$ | $\bar{A}\bar{B}$ |
| 5 | A | B | $\bar{A}$ | $AB + \bar{A}\bar{B}$ |

| K | M1 | M2 | M3 | M4 |
|---|----|----|----|----|
| 0 | 0 | 0 | 0 | 0 |
| 1 | 0 | 0 | 1 | 0 |
| 2 | 1 | 1 | 0 | 0 |
| 3 | 0 | 1 | 1 | 0 |
| 4 | 0 | 1 | 0 | 1 |
| 5 | 1 | 1 | 0 | 1 |

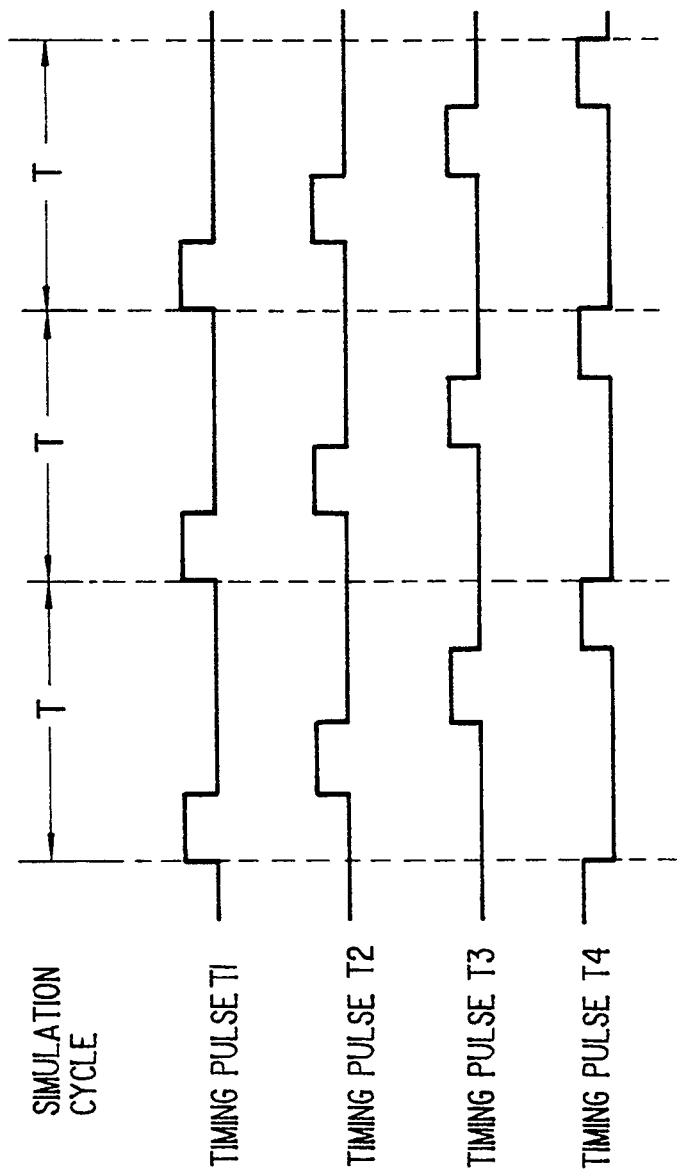

TERMINAL SELECTION SIGNAL CIRCUIT —411

LM': LOGIC FUNCTION SECTION

LM': LOGIC FUNCTION SECTION

LOGIC SIMULATOR

BACKGROUND OF THE INVENTION

1. Field of the Invention

The present invention relates to a logic simulator for carrying out simulation of a combinational circuit or sequential circuit.

2. Description of the Prior Art

A main object of logic simulation is to confirm a function of a logic circuit without actually realizing it with hardware. Particularly in case of LSI circuits, since the verification or alteration of the system becomes considerably difficult once it is constructed with hardware, this simulation method can be utilized as an effective means for verifying the correct operation of the circuit design. Moreover, because of a recent market trend of the verification time to be longer with increases in the circuit scale, a logic simulator applicable for processing a large-scale logic circuit at high speed is now expected.

As one of such logic simulation methods, there is a compiled method which is used mainly for verifying logic circuits used for computers.

In such a compiled method, logic circuits processed by simulation are respectively leveled in accordance with the order of signal propagation from the input stage to the output. Then, the operation of a logic element of each level is replaced with an instruction code of a computer, to obtain an output signal by executing these logic circuits in order of the respective levels.

Namely, as one of features of this compiled method, there can be mentioned high speed simulation realized by replacing each leveled logic element with an intrinsic instruction of a computer. However, because the above-mentioned leveling is applicable to processing only one-directional simulation, more improvement should be necessary for carrying out simulation of a circuit including loop elements such as flip-flops usually used in logic circuits. Moreover, in such a compiled method, since each logic circuit is replaced with a corresponding instruction of a computer to be subjected to the simulation, all of the process should be repeated again if any one of the logic circuits is changed to another in the middle of the design phase.

As another logic simulation method, there is an event-driven method.

This event-driven method means a method of carrying out simulation based on expressions of logic circuits including connection relation thereof given in a computer. Unlike the above-mentioned compiled method, the event-driven method does not require the leveling of logic elements, and is capable of simulation even in the presence of loops such as memory elements in each logic circuit. Moreover, since this method is so constructed as to estimate only a part (called an event hereinafter) to which is given a newly changed signal. Because of this a high speed simulation can be realized. Since the time required from input to output can be controlled by giving some appropriate delay time of each element to the element table, this simulation method can provide a state closer to an actual logic element.

In addition to the method of processing these two logic simulation methods by software of an ordinary computer, computers (or hardware processors) exclusively used for elevating the simulation speed are now developed.

Generally, both of the above-mentioned logic simulation methods are now widely used. However, it is also a fact that a greater enhancement of the processing ability (i.e., enlargement of the circuit scale and elevation of the processing speed) of the simulators is now required for logic systems or logic LSI's to be more largely constructed in response to tile development of information industries. As a method of satisfying this requirement, a method of enhancing the logic simulation speed by using a suitable multiprocessor constructed with a plurality of computers is widely tried.

However, since the progress of computer or LSI technology can not catch up with the demand of enlarging the scale of logic systems and reducing the development time, it is very difficult to satisfy these conditions only by using the above-mentioned methods. Namely, in order to solve the situation, it should be necessary to provide a system which can be operated with ease by any one of ordinary logic system developers and realize a high speed simulation process.

The main reason why the present technology level can not answer the user's demand is that both of the above-mentioned simulation methods basically depend on a software process (this is essentially the same as the case where a special-purpose hardware processor is employed.) Namely, these methods are all established on the basis of the processing speed determined by repetition of the computer operation in which instructions are taken out and then executed one by one. Moreover, even if a multiprocessor arrangement is applied to these methods in order to process the instructions in parallel, in case of the compiled method, it becomes difficult to elevate the processing speed because of time delay of communication caused by collision of information between processors for transmitting an output signal. While in case of the event-driven method, it becomes difficult to obtain satisfactory processing ability because of conflict of access executed by all processors to the circuit table placed in a common memory. Such a multiprocessor method generally enlarges the device scale, therefore it becomes difficult to provide a small-scale system.

Namely, as far as these conventional methods are utilized in this type of simulation technology, it is very difficult to obtain a logic simulator having processing ability improved enough for answering the current demand of enlarging the scale of logic systems and reducing the development time.

Hereinafter, reference materials concerning the abovedescribed prior art are given.

1) Kozo Kinoshlta, Kunihiro Asada, Osamu Karatsu: Design of VLSI II, Iwanami Shoten, 1985, 191–210 (in Japanese).
2) Kenji Omori, Akihiko Koike: Hardware Algorithm of TIle Logic Simulation Machine, Information Processing, Vol. 26, No. 6, 668–678, June 1985 (in Japanese).
3) Tom Blank: Special-purpose Hardware Engine for Greatly Improving The Processing Speed in CAD, Nikkei Electronics, 1985, Apr. 8, 207–232 (in Japanese).
4) Gregory F. Pfister: The Yorktown Simulation Engine, Proc. of DAC 19, 1982, 51–64.
5) Akihiko Kolke, Kenji Omori, Toru Sasaki: Architecture of The Logic Simulation Machine, Information Processing Society, Vol. 25, No. 5, Sep. 1984. 864-872 (in Japanese).

6) Hiroshi Yamada, Fumiyasu Hirose, Jun-ichi Niizuma, Tatsuya Shindo: Simulation Processor "SP", Electronic Information Communication Society, Vol.J71-D, No. 4, April 1988, 644-651 (in Japanese).

As described above, the conventional logic simulation method is essentially based on tile software processing. Therefore, it is Impossible in principle to avoid such an essential condition that the instructions must be taken out and executed by a computer one by one. Accordingly, even if the processing speed of tile computer can be elevated, it is still difficult to Improve the simulation speed when the scale of the circuit to be simulated is considerably large. Moreover, if a multiprocessor is applied to the compiled method in order to process the instructions in parallel, it becomes difficult to elevate the processing speed because of the time delay of communication for avoiding collision of information between processors when transmitting an output signal. In the case of the event-driven method, it also becomes difficult to enhance the processing speed because of conflict of access executed by all processors to circuit information placed on a common memory. Besides, such a multiprocessor method tends to enlarge the size of the logic simulator.

In short, the conventional logic simulator can not satisfy the recent demand of enlarging the logic circuit scale and reducing the development time of logic circuits.

SUMMARY OF THE INVENTION

The present invention was made in the light of the above-mentioned conventional situation. Therefore it is an object of the present invention to provide a logic simulator which can improve the simulation speed by parallel operation and carry out good simulation of logic circuits even if the circuit scale is considerably large.

In order to achieve the object, the present invention provides a logic simulator comprising a plurality of logic function sections for respectively realizing parts of a logic circuit to be simulated, a plurality of connection sections for connecting these logic function sections to construct the circuit to be simulated, a control section for executing logic simulation on the circuit to be simulated, and a host computer for controlling the logic simulator and an interface between the logic simulator and a designer.

Each of the logic function sections comprise a plurality of standard logic elements for realizing optional logic functions and connection elements for connecting these logic elements.

Each of the logic elements includes memory means for storing data and control information respectively corresponding to output data of an optional logic function so as to receive an output signal from a logic element on the previous stage as an address signal in the memory means and output data stored at an address designated by the address signal from the memory means. Moreover, each logic element is constructed to detect change of output data of the memory means and output an interruption signal to the control section.

The connection section and connection element respectively have a plurality of connection lines, switching elements arranged on the respective connection lines, and holding means for holding information for indicating ON/OFF of these switching elements, so as to connect or disconnect the connection lines in accordance with the information held in the holding means.

Furthermore, the control section writes output data and control information into the memory means and the ON/OFF indication information corresponding to each switching element into the holding means before logic simulation, or receives the interruption signal outputted from each logic element and stops the logic simulation.

Namely, the logic simulator according to the present invention generally comprises plural logic function sections, plural connection sections, and a control section and a computer for respectively controlling these logic function sections and connection sections. Moreover, the logic function sections comprise plural logic elements and plural connection elements.

Each logic element has an optional logic function corresponding to a logic circuit such as combinational circuits or sequential circuits. Moreover, the logic element is provided with a memory cell in which output data and control information corresponding to a logic function to be realized are stored in advance by the control section. If an output signal is given to any one of the logic elements from another of the previous stage, the signal is received in the memory cell as an address signal, thereafter an appropriate memory address corresponding to the received signal is selected. Then, the information stored at the selected memory address is transferred to another logic element of the next stage. Furthermore, if the logic element detects change of each output data, it gives an interruption signal to the control section.

The control section stops the logic simulation process when it receives an interruption signal.

The connection elements are used for connecting the plurality of logic elements to construct the entire body of one simulation circuit, and form a wiring network comprising plural signal lines. Each signal line is provided with a switch for controlling ON/OFF of the signal line. Moreover, each connection element has a memory cell in which data or information for controlling the switch operation is given in advance from the control section. Accordingly, it is possible to connect two optionally selected logic elements by giving data to a memory cell corresponding to the switch positioned between these two logic elements.

Furthermore, each connection section has a memory cell and a switch, like the connection element, to connect the logic function sections.

Accordingly, the logic simulator of the present invention can realize logic circuit simulation based on grasping the entire logic circuit construction expressed by connecting the logic function sections with the connection sections.

These and other objects, features and advantages of the present invention will be more apparent from the following description of a preferred embodiment, taken in conjunction with the accompanying drawings.

BRIEF DESCRIPTION OF THE DRAWINGS

FIGS. 10 to 12 are symbolic diagrams and truth tables to respectively show operation of a combinational circuit, D-type flip-flop (DFF) and D-type latch (DLATCH);

FIGS. 17 to 21 are diagrams to respectively show detailed construction of a connection section and a connection element;

FIGS. 35 to 44 are circuit diagrams to show an application in which a ternary simulator is used as the logic simulator according to the present invention;

FIGS. 47 to 53 are circuit diagrams to show an application for using the logic element as a memory in case of the ternary simulator;

FIGS. 54A to 54C are diagrams to respectively show construction and truth values of a logic element in a logic function section of a logic simulator as the second embodiment according to the present invention;

FIG. 55 is a diagram to show truth values of a logic circuit based on a programmable logic array circuit (PLA);

FIG. 57 is a diagram to show construction of a logic element based on the PLA;

FIGS. 58 and 59 are diagrams to respectively explain D-type flip-flop (DFF) operation;

FIG. 61 is a diagram to show truth values of a D-type latch memory element (LATCH);

FIGS. 62 to 68 are diagrams to show detailed construction and operation waveforms of a logic element;

FIG. 69 is a Karnaugh diagram of a two-input logic function to explain a universal logic gate in a logic function section of a logic simulator as the third embodiment according to the present invention;

FIGS. 70A and 70B respectively show a circuit diagram and a symbolic diagram of the universal logic gate explained in FIG. 69;

FIG. 85 shows a waveform chart of timing pulses used in the unit-delay multiplexed logic element shown in FIG. 83;

DETAILED DESCRIPTION OF THE EMBODIMENTS

Hereinafter, an embodiment of a logic simulator according to the present invention will be described with reference to the drawings.

Figure 1:
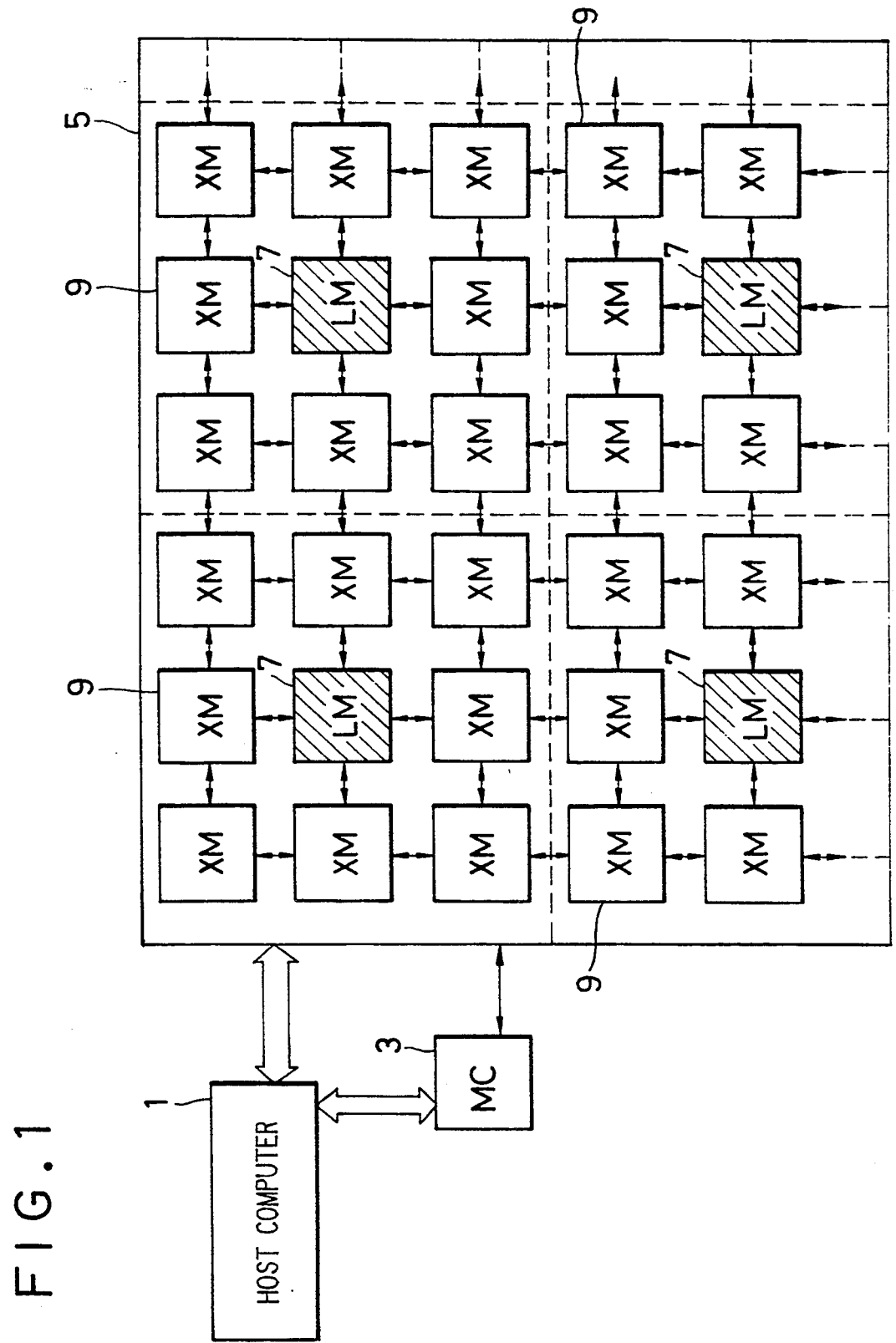
FIG. 1 is a block diagram to show entire construction of a logic simulator as an embodiment of the present invention.

FIG. 1 is a block diagram showing the entire body of a logic simulator as an embodiment of the present invention.

This logic simulator comprises a host computer 1, a control section MC3 and a physical module PM5. Moreover, the PM5 comprises plural logic function sections LM7 and connection sections XM9 both of which are regularly arranged. In such construction, the entire body of a logic circuit is expressed by connecting the plural LM7 and XM9.

Figure 2:
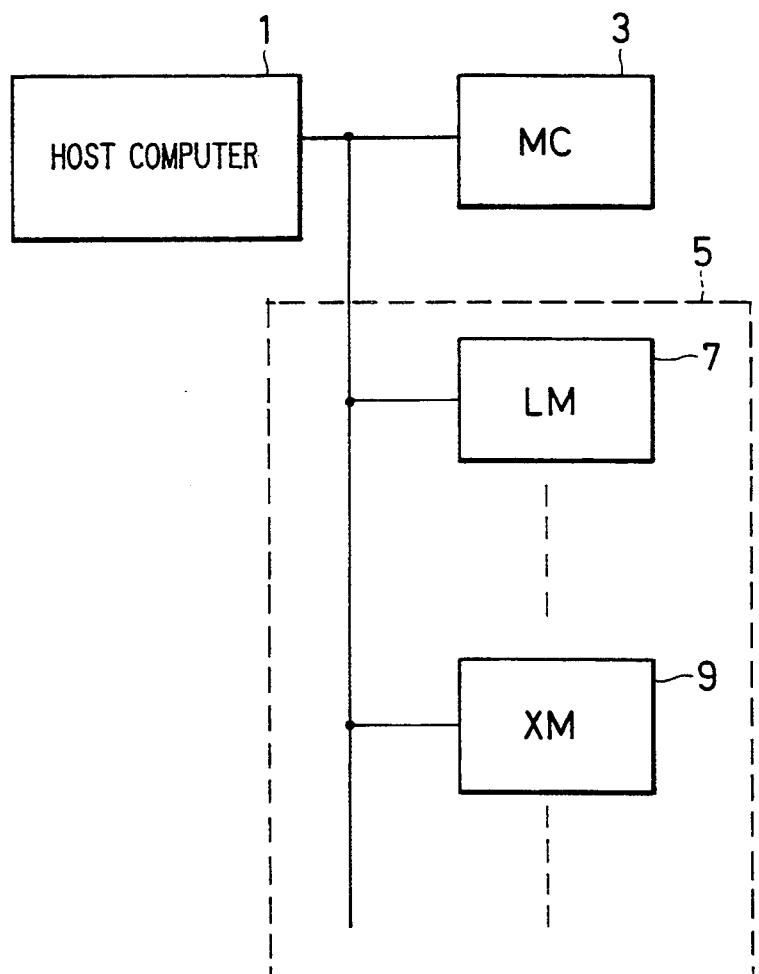
FIG. 2 is a diagram to explain the system connection in the entire body of tile logic simulator shown in FIG. 1.

FIG. 2 shows connection relation of the host computer 1, MC3, LM7 and XM9. As shown in the same drawing, MC3, LM7 and XM9 are respectively connected to the host computer 1 as peripheral instruments. Moreover, each of MC3, LM7 and XM9 has an independent address, and data access on read or write operation is carried out in accordance with indication by the host computer 1. Furthermore, an interruption signal is sent from each of MC3, LM7 and XM9 to the host computer 1.

Figure 3:
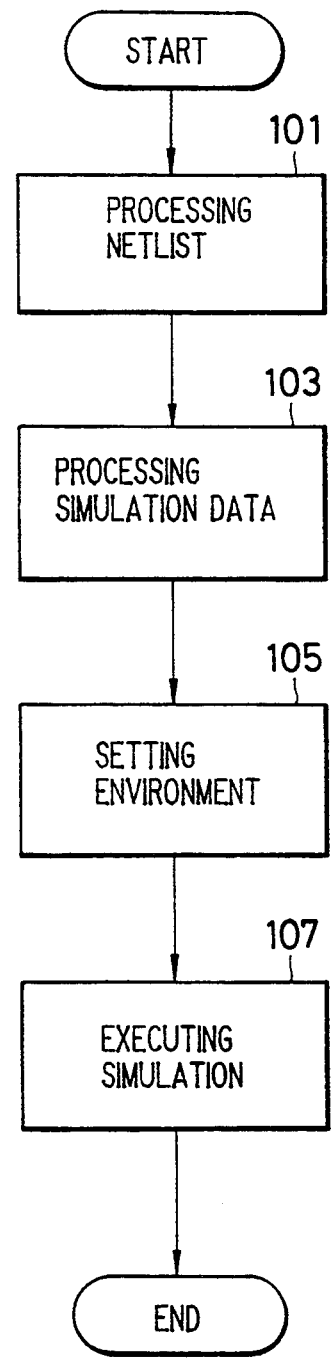
FIG. 3 is a flowchart to explain operation of a host computer shown in FIG. 2.

FIG. 3 shows a flowchart for explaining functions of the host computer 1.

First in step 101 shown in the same drawing, the host computer 1 receives logic circuit information Netlist given from a designer and divides it into parts respectively having suitable largeness, thereafter allocates them to each LM7 or XM9, so as to prepare data or information. Moreover, the data prepared (e.g., connection data for connecting LM7 and XM9 or logic data to be given to LM7) is sent to each LM7 or XM9, so as to construct the entire body of a logic circuit.

Then in step 103, the host computer 1 connects input-output terminals of PM5 to input-output signal lines of MC3 and also connects the output signal line to a register (not shown) incorporated in the system. Moreover, the host computer 1 prepares and gives data to the input signal line of MC3.

In step 105, the host computer i designates an appropriate LM7 to observe simulation data and determines an observation signal (data picking signal). A start and a stop time of the observation and other observation conditions (break points) are further determined by the host computer 1, and these data are sent to MC3 and LM7.

Thereafter in step 107, the host computer 1 instructs MC3 to start simulation. Moreover, during the simulation, the host computer 1 carries out an interruption process in accordance with an interruption signal given from MC3. For example, new data are inputted to LM7 and XM9 or simulation data are newly collected on the interruption process. Furthermore, after the simulation is ended, collected simulation data are respectively displayed or outputted in accordance with request of a designer.

Incidentally. MC3 gives clock signals or control signals to the plurality of LM7 and XM9 to control the logic simulation. Besides, MC3 also controls the collection of simulation data carried out by the host computer 1.

Figure 4:
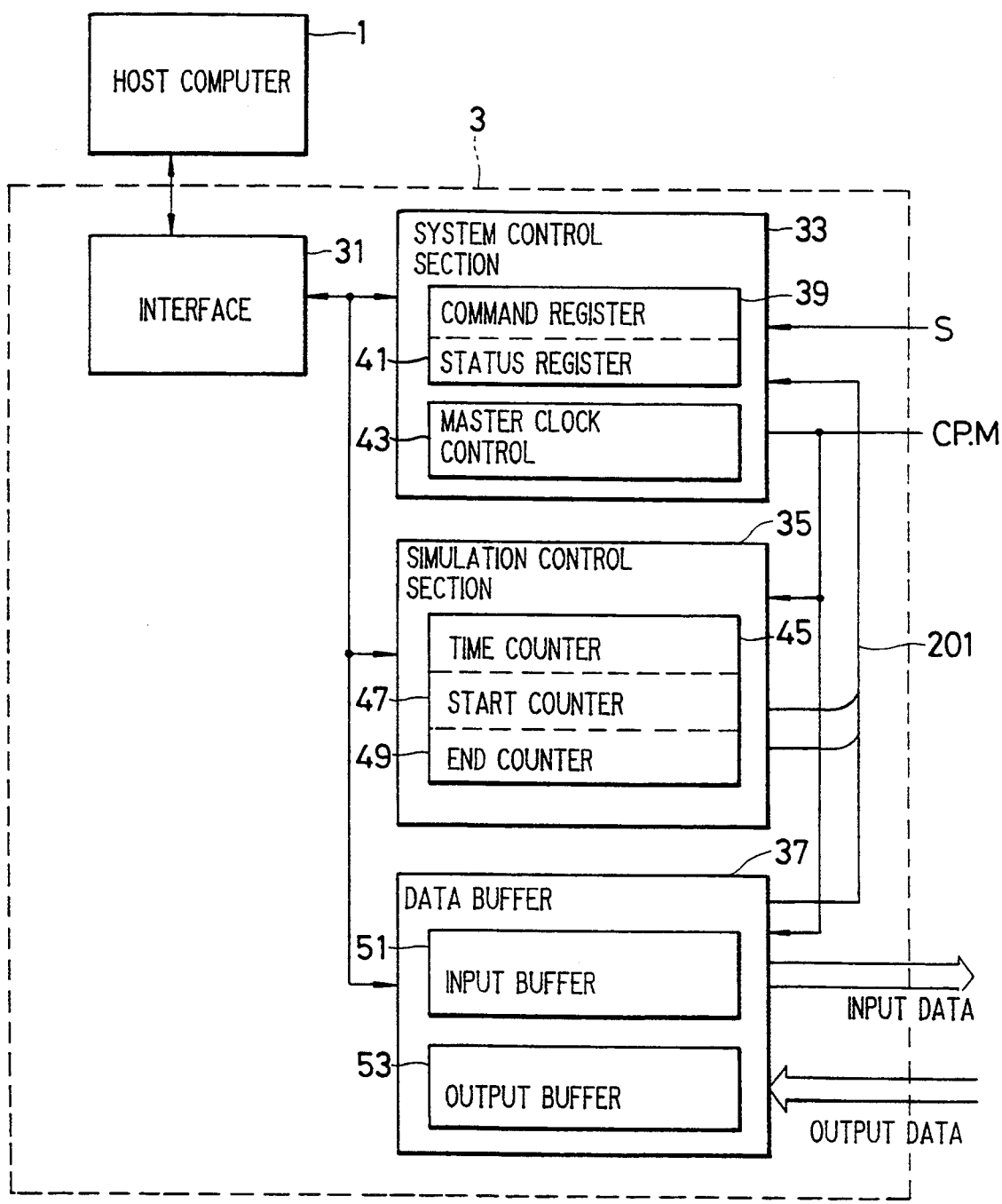
FIG. 4 is a block diagram to show construction of a control section shown in FIG. 2.

FIG. 4 shows a block diagram of a constructional example of MC3. As shown in the same drawing, MC3 comprises an interface 31, a system control section 33, a simulation control section 35 and a data buffer 37.

The interface 31 is a control circuit for controlling giving and receiving data between the host computer 1 and MC3.

The system control section 33 comprises a command register 39, a status register 41 and a master clock control section 43.

Further, the command register 39 holds an interruption permission command, read-write register designation command or simulation execution command.

The status register 41 indicates an interruption state, data request state or simulation stop state.

The master clock control section 43 supplies a master clock CP and a control signal M for executing simulation so as to control the whole simulation process.

The simulation control section 35 comprises counters respectively corresponding to predetermined simulation stages.

Among these counters, a time counter 45 counts the present time during simulation.

A start counter 47 and an end counter 49 respectively indicate a start and an end time of the simulation data collection. If the set value of the start counter 47 or end counter 49 coincides with that of the time counter 45, an internal interruption signal 201 is sent to the system control section 33.

Incidentally, the data buffer 37 comprises an input buffer 51 and an output buffer 53. The input buffer 51 holds input data to be given to the input terminal of PM5, while the output buffer 53 holds output data to be outputted from the output terminal during simulation. The reading or writing of these input and output data is carried out in parallel to the host computer 1, while in series to LM7 or XM9. If the input buffer 51 becomes empty or the output buffer 53 becomes full, the internal interruption signal 201 is transferred.

Hereinafter, the logic function section LM7 which is the most important portion of the present invention will be explained.

Figure 5:
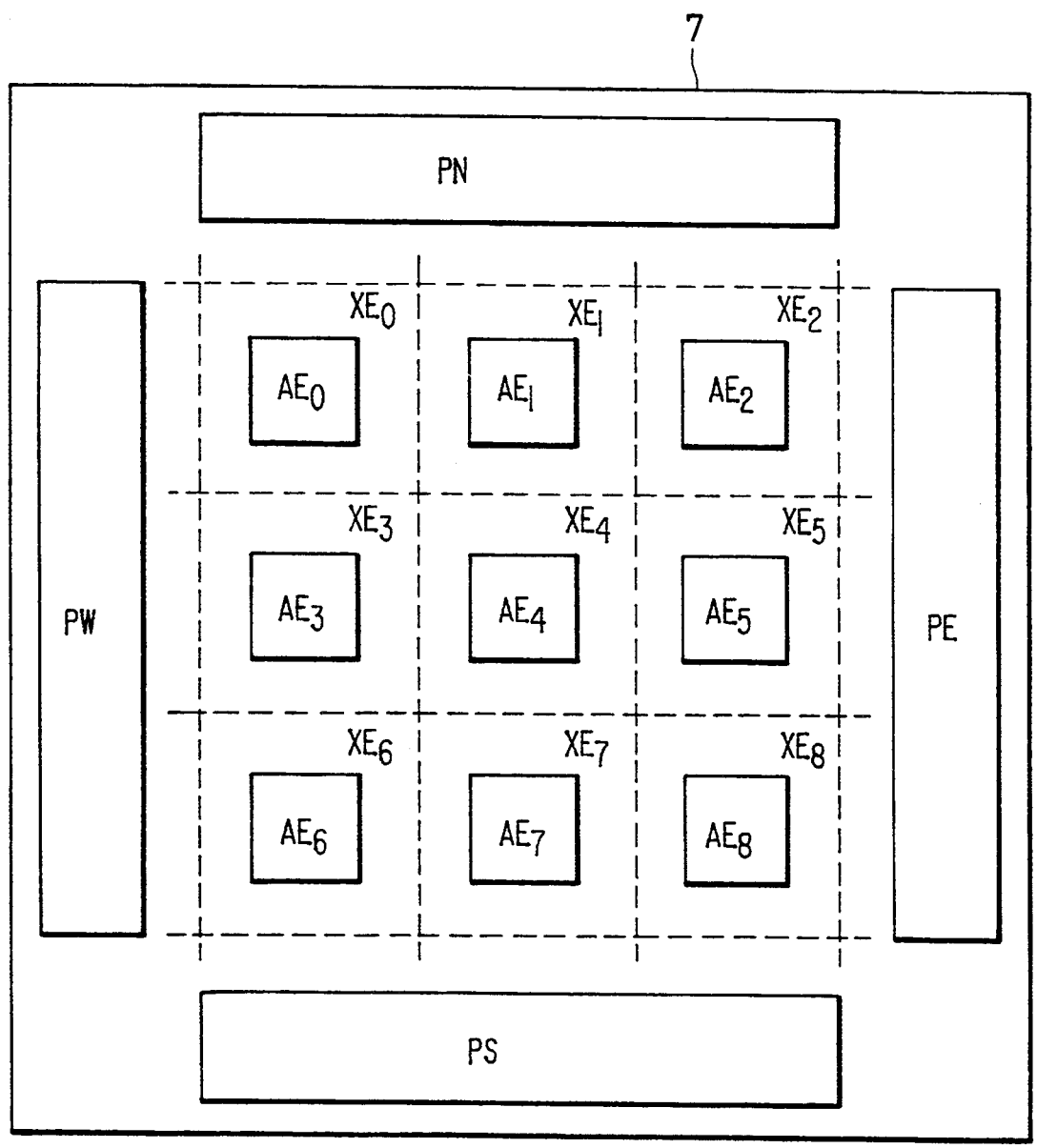
FIGS. 5 to 8 are schematic and block diagrams to respectively show construction of a logic function section in the logic simulator.

FIG. 5 shows the entire construction of each LM7.

In the same drawing, reference characters AE0 to AE8 respectively designate logic elements, XE0 to XE8 show connection elements, and PN, PE, PS, PW are peripheral circuits.

Each AE corresponds to an optional logic element, and each XE connects corresponding AE's and also connects each AE to the PN, PE, PS or PW. Incidentally, detailed explanation on these AE and XE will be given below.

Figure 6:
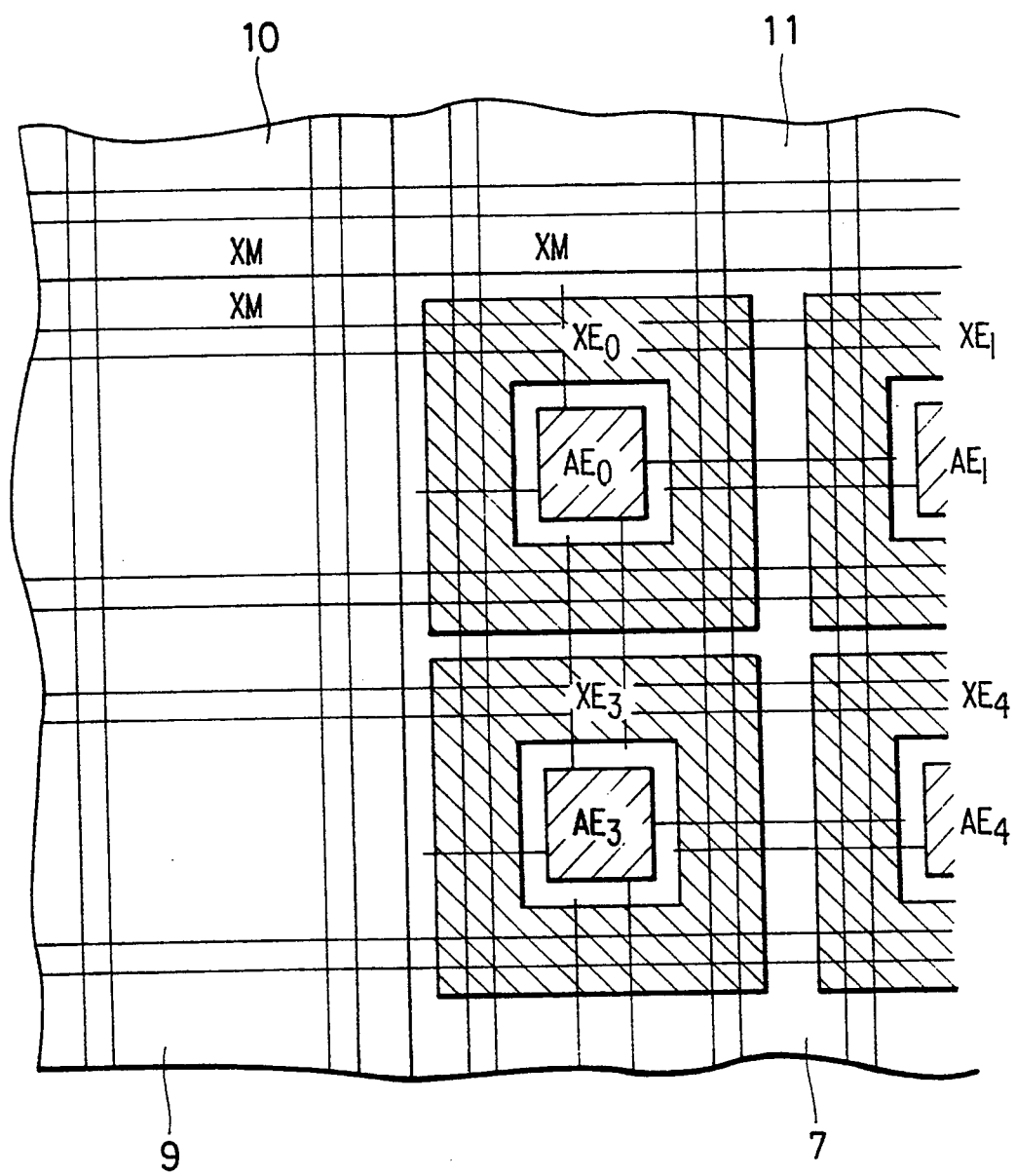

Now as shown in FIG. 6, the section LM7 also has external connection terminals so as to be connected with each adjacent XM9 (10 or 11) through each XE. Incidentally, each LM7 used in this embodiment is constructed with nine AE's.

Moreover, to PN, PE, PS and PW shown in FIG. 5 is prepared a control circuit for controlling LM7.

Figure 7:
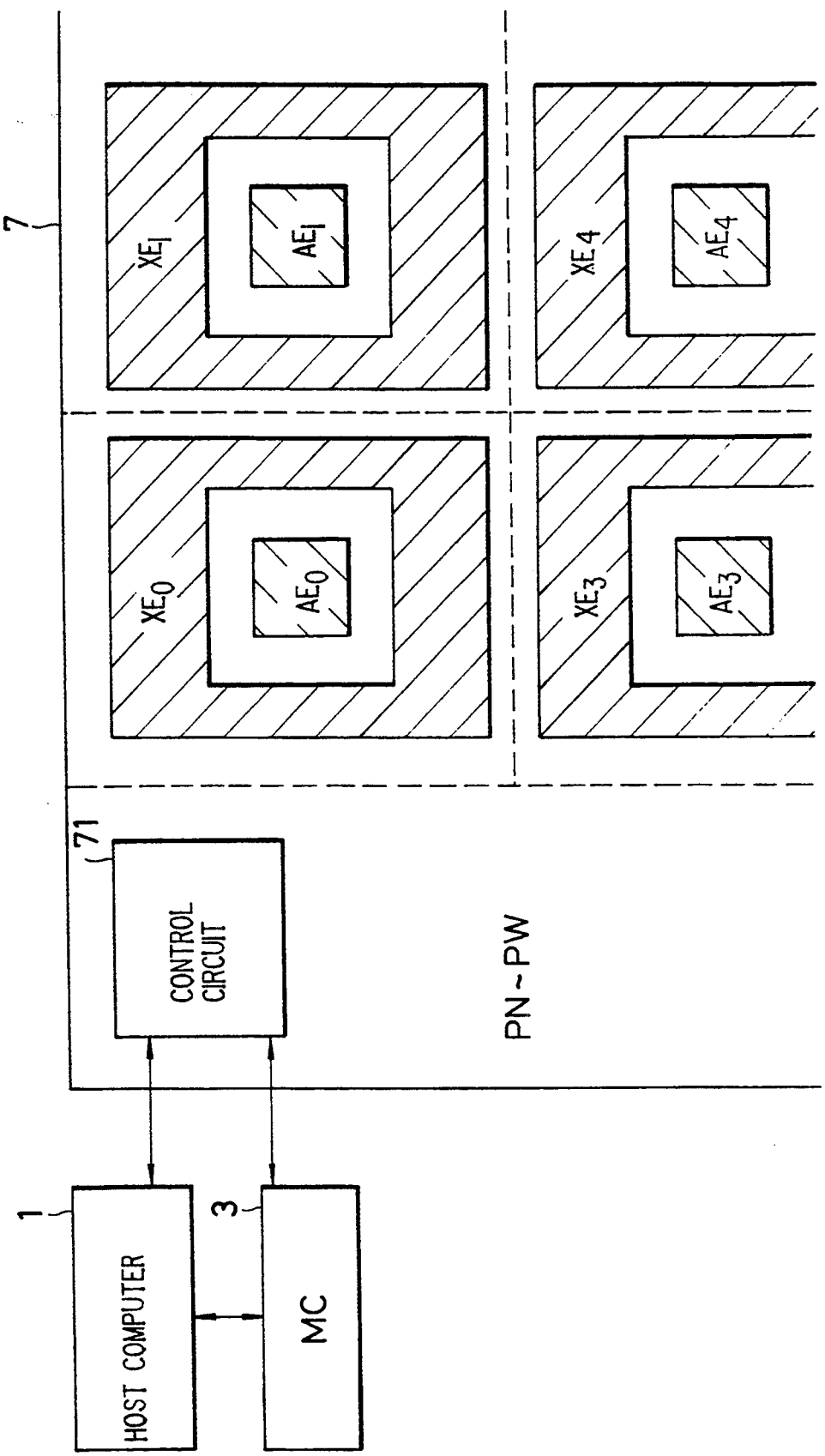

FIG. 7 shows connection relation between LM7 and the host computer 1 or MC3. As shown in the same drawing, a control circuit 71 is arranged in the vicinity of the circuits PN to PW arranged around the LM7. This control circuit 71 has a function to give and receive data to the host computer 1 and another to inform the host computer 1 of the state of each AE through MC3 during simulation.

Figure 8:
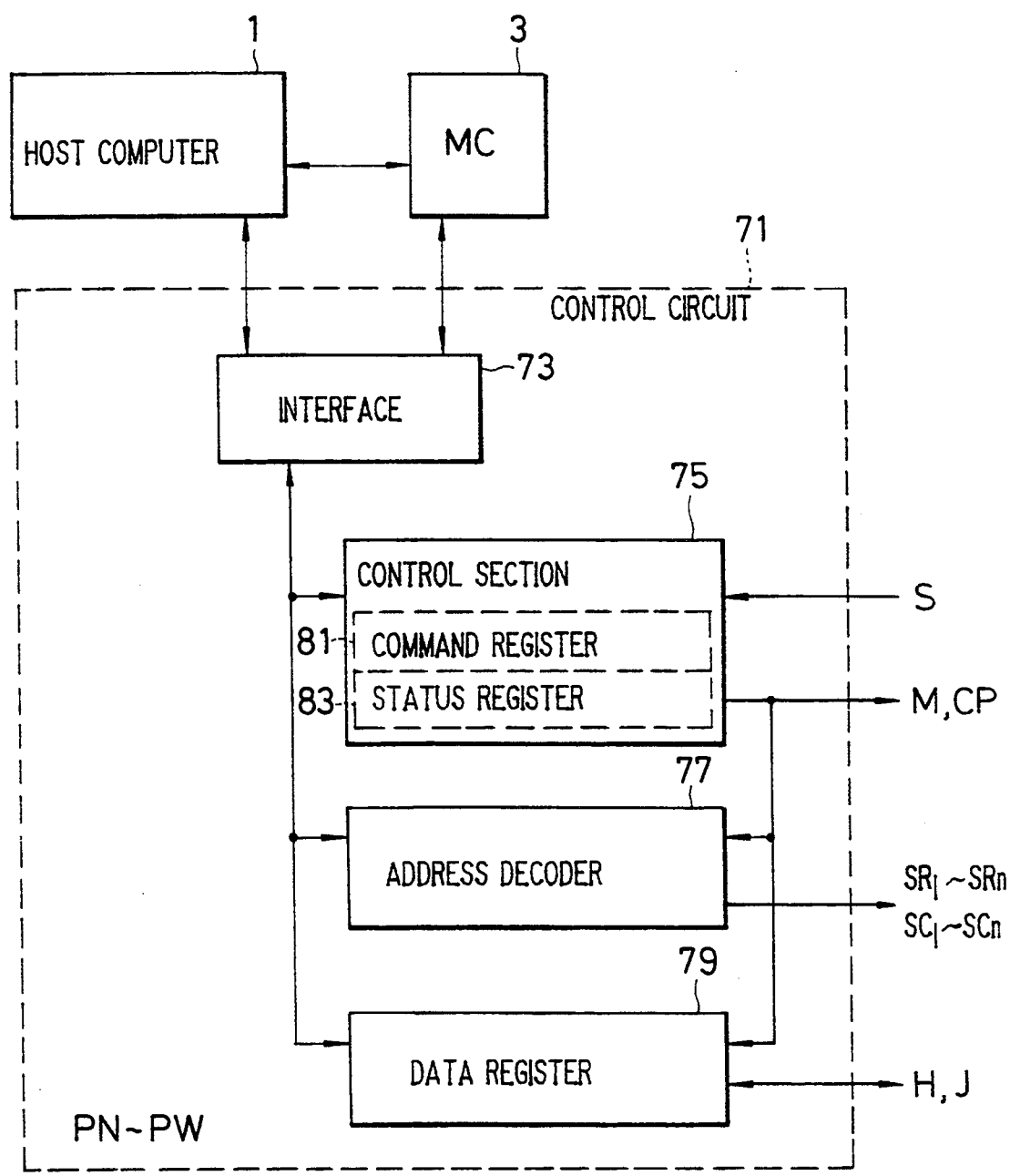

FIG. 8 shows a block diagram of the control circuit 71. Namely, the control circuit 71 comprises an interface 73, a control section 75, an address decoder 77 and a data register 79.

The control section 75 comprises a command register 81 and a status register 83. The command register 81 holds commands for indicating to read or write data, while the status register 83 stores an interruption state generated in LM7.

The address decoder 77 outputs decoded signals (SR1 to SRn, SC1 to SCn) for specifying one of the plurality of AE or XE in LM7. As the result, the column or row of the two-dimensional regular arrangement of AE or XE is suitably selected.

The data register 79 holds data given or received between the host computer 1 and AE or XE.

Namely, the control circuit 71 is constructed in the above-described manner, and LM7 is connected to the host computer 1 and MC3 through the interface 73.

Accordingly, when the host computer 1 designates a pair of column and row numbers through MC3, one AE or XE in LM7 is designated. Then, data are transferred to the designated AE or XE through the interface 73. By repeating such a program process to each AE and XE successively, the finally designated arrangement of AE realizes a predetermined logic function and that of XE forms a predetermined connection mode.

Next, the method of realizing a predetermined logic function with AE is explained.

Figure 9:
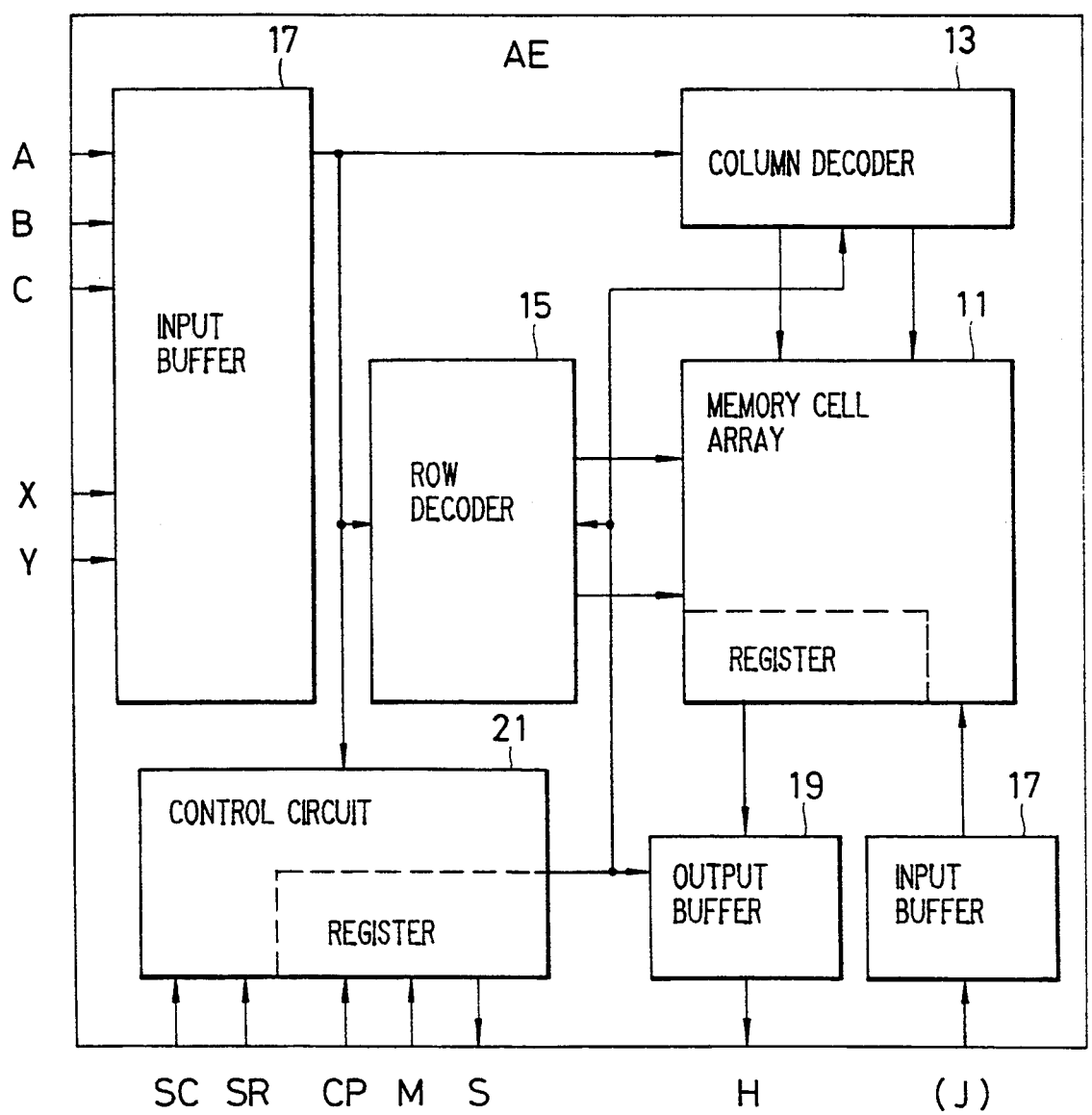
FIG. 9 is a block diagram to show construction of a logic element in the logic function section.

FIG. 9 is a block diagram to show the construction of AE.

As shown in the same manner, AE mainly comprises a memory cell array 11 around which are arranged a column decoder 13 and a row decoder 15 for designating the column and row of the memory cell array 11 respectively. Moreover, an input buffer 17, an output buffer 19 and a control circuit 21 which receiving and giving signals through XE are respectively placed at the inner circumference of AE.

Incidentally, in FIG. 9, reference characters A, B, C are respectively memory addresses to be given to the memory cell array 11, X is an enable signal and Y is a read/write signal, and J, H are respectively input and output data of the memory cell array 11. Moreover, SC, SR show column selection and row selection signals respectively, and a specific AE is selected by them. Besides, CP shows a master clock as a standard clock of this logic simulator, and S means an interruption signal for transmitting interruption generated in the AE to the outside. In addition, M shows a control signal to control the operation mode of the logic simulator. Namely, the logic simulator is in the simulation mode when the signal M is high, while in the program mode when M is low.

In the above construction, when data are given from the host computer 1, the operation mode becomes the write mode and the enable signal X becomes low. Moreover, this enable signal X is outputted in accordance with designation given by the host computer 1. In the write mode, the data J are inputted to an address designated by A, B, C. In this case, the terminal for J is used only in the program mode, and not used in the simulation mode.

While in the simulation mode, the operation mode is the read mode. In this case, memory data are read out as data H from an address designated by A, B, C. Moreover, in the read (or simulation) mode, the enable signal X is prepared as shown in FIGS. 13 and 15 (this preparation manner will be explained below) in each AE by using the clock CP and control signal M both supplied from MC3.

By the way, an ordinary logic circuit is generally formed with a combinational circuit and a sequential circuit including memory elements. Therefore, if it is possible to realize such combinational circuits and memory elements (flip-flops) by using the above-mentioned logic elements AE, it becomes possible to express any type of logic circuit by using LM7.

First, the method of realizing combinational circuits by using the AE is explained. Incidentally, a case of realizing a 3NOR as one of the combination logic circuits is described here.

Generally, an m-value n-input-one-output logic element can be constructed by a memory of $m^n$ words. For example, a binary 3-input-1-output logic element can be formed with a memory of $2^3 = 8$ words. Accordingly, an optional 3-input combinational circuit based on the following logic:

$$H = f(A, B, C)$$

can be realized by a 8-bit memory cell array 11 by assigning A, B, C to binary memory addresses $2^0$, $2^1$, $2^2$, respectively. Now assume that a logic circuit 3NOR to be realized can be expressed by a truth table shown in FIG. 10. As shown in the same drawing, the address of the memory cell array 11 corresponding to the case in which A, B, C are all 0 is set at 1, and the other addresses are all set at 0 in advance by the host computer 1. As the result, it becomes possible to realize the following logic with AE:

$$H = NOR\ (A, B, C).$$

Accordingly, by using such logic elements AE, it is possible to express any type of 3-input combination logic circuit.

Next, the method of realizing the flip-flop memory elements is explained. In this case, D-type flip-flops (DFF) and D-type latch memory elements (DLATCH) are mentioned as the typical flip-flop memory elements.

Figures 11A, 11B, 11C:
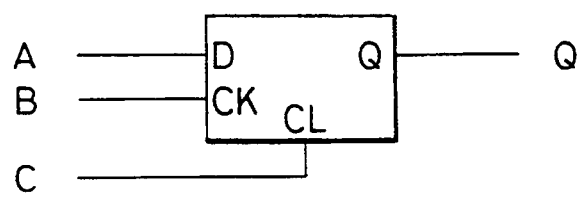

FIG. 11A shows a logic symbol of DFF, FIG. 11B is a state table for DFF, and FIG. 11C is the truth table of DFF.

As shown in FIG. 11B, when the input signal C is L (low), the state of the input signal A is outputted with rise of the input signal B. While, when the signal C is H (high), the output signal Q is compulsorily set in the low (reset) state. In other cases (e.g., in case of fall of the signal B and the like), the output signal Qn+1 is equal to Qn, thus the previous state is continued.

Accordingly, In case of realizing DFF with AE, the signals A, B, C are set based on address signals in the memory cell array 11 as shown in FIG. 11C. Moreover, the output signal Q is written at each address as a memory data in advance by the host computer 1. Furthermore, the memory data is always read out while the signal B rises (or is 1 in FIG. 11C) or while the signal C is high (1 in FIG. 11C). Namely, it is necessary to provide in the element AE a circuit for preparing an enable signal when the signal B rises. Incidentally in FIG. 11C, the mark * shows the case where the previous state is held. Therefore, since the memory data having * is not outputted actually, the value can take any of 1 or 0.

Figures 12A, 12B, 12C:
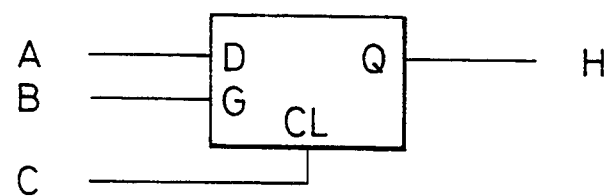

FIGS. 12A to 12C show the operation of DLATCH. Among these drawings, FIG. 12A is a logic symbol of the DLATCH, FIG. 12B is the state table for DLATCH, and FIG. 12C is the truth table for DLATCH.

In case of the DLATCH, the memory data are outputted whenever the signal B is 1 or C is 1. Moreover, like DFF, each data marked with * is not outputted actually, thus the value can take both 1 and 0.

Thus, according to the above-explained methods, it becomes possible to realize both combinational circuits and memory elements (flip-flops) with AE.

As stated above, the logic element AE can be used for realizing any one of the above-mentioned three functions. Therefore, It is necessary to produce an enable signal corresponding to a logic function assigned by controlling information given In advance from the host computer 1.

Next, the method of generating this enable signal in AE is explained with reference to FIGS. 13A and 13B. Among these drawings, FIG. 13A is a circuit diagram for producing the enable signal, and FIG. 13B is a signal waveform chart to show change of the signal B.

Figure 13A:
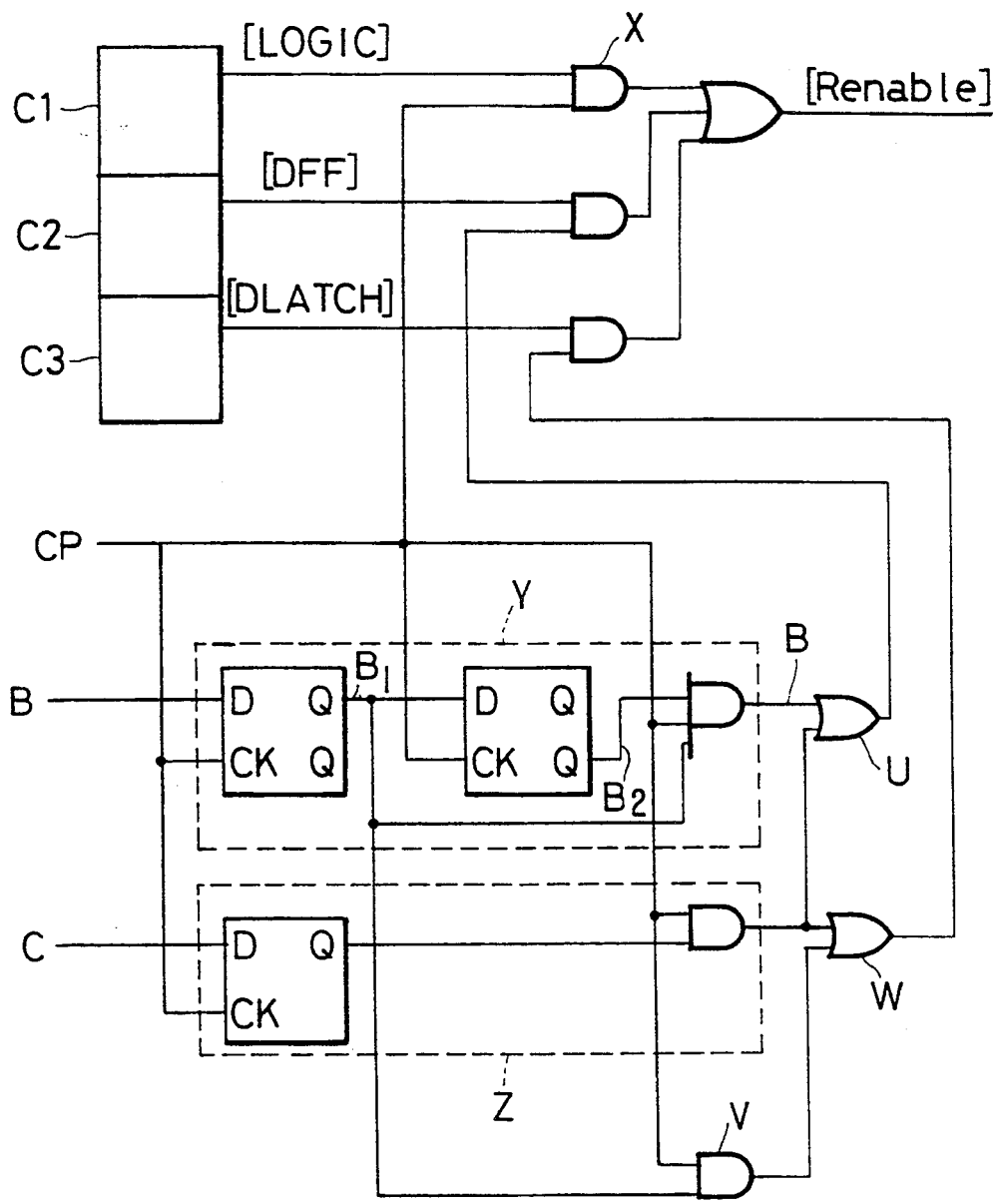
FIGS. 13 to 16 are detailed circuit diagrams and timing waveform charts of the logic element in the logic function section.
Figure 13B:
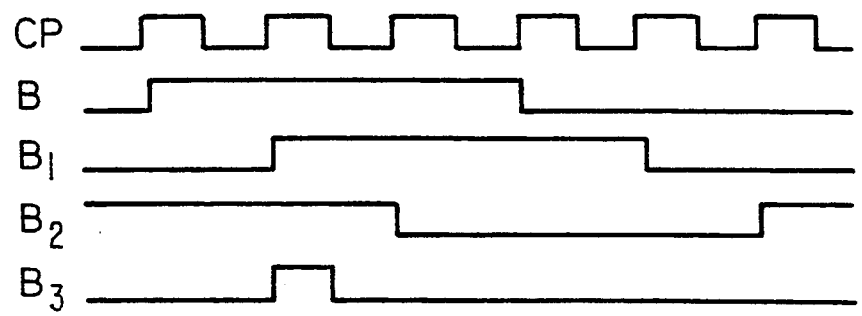

In FIG. 13A, command registers C1 to C3 are memory cells for constructing a memory cell array 11 which will be explained later. Namely, a read signal [Renable] is produced with data stored in these command registers C1 to C3, clock CP and signals B, C. Incidentally, the Renable signal is also used as a signal for giving unit delay.

In this case, the host computer 1 gives control information to the command register C1, C2 or C3 corresponding to a logic function to be given to the AE in advance to set it high.

For example, assume that the command register C1 corresponds to the combinational circuit (LOGIC), command register C2 to the DFF, and command register C3 to the DLATCH, respectively. In this case, a logic function corresponding to the command register C whose output, i.e., LOGIC], [DFF] or [DLATCH], is high is now designated.

If [LOGIC] is high, as shown by an AND circuit x, the master clock CP is always supplied as the Renable signal. Namely, in case of the combinational circuit, memory data or information corresponding to A, B, C is outputted whenever the signal CP becomes high.

If [DFF] is high, the Renable signal is produced in two cases when the signal B rises or while the signal C is high. In the former case, the Renable signal is produced from a signal B3 (see FIG. 13B) outputted from a circuit y, and memory data is outputted in accordance with the clock CP. While in the latter case, the Renable signal is produced by a circuit z in response to reset. Therefore, the logic sum of these two Renable signals obtained by an OR circuit u is used as the real Renable signal of [DFF].

If the [DLATCH] is high, the Renable signal is produced by an AND circuit v while the signal B is high, or it is produced by the circuit z while the signal C is high like the case of DFF. Therefore, the logic sum of these two Renable signals obtained by an OR circuit w is used as the real Renable signal of [DLATCH].

By the way, in the logic simulation, functions to detect change of data outputted from a specific AE during the simulation and to start collecting simulation data are required. These functions become possible when the corresponding interruption signals can be outputted from the AE to the host computer 1. Therefore, the method of generating such interruption signals is explained with reference to FIG. 14.

In the same drawing, command registers C4, C5 and status registers S1, S2, like the command registers C1 to C3 shown in FIG. 13A, are memory cells for constructing a memory cell array 11 which will be explained later. Therefore, read or write operation between the host computer 1 and these command registers C4, C5 and status registers S1, S2 can be carried out with ease.

In this case, to detect rise of the output H of the memory cell array 11, "1" is set in advance in the command register C4 by the host computer 1. To the contrary, to detect fall of the output H, "high" is set in the command register C5 in advance. Moreover, in case of detecting both rise and fall of the output H, "high" is set in both command registers C4, C5.

As described above, when such a desired state is generated by designating the command register C4 or C5, it is possible to store the state in the status register S1 or S2. At the same time, interruption information is transmitted to MC3 by an interruption signal S.

All interruption signals S from AE are connected to one signal line. Accordingly, if any one of AE is in the interruption state, the information is transmitted to MC3 through the signal line. Incidentally, it is well known that the interruption signal S can be realized with ease by using a common wiring including a pull-up resistor R.

When the interruption information is transmitted from AE, the MC3 sets the control signal M low to stop all of AE. Thereafter, the state stored in the status register S1 or S2 and the output H of the memory cell array 11 are read by the host computer 1.

Finally, with respect to the logic function of AE, a detailed example of the circuit construction expressed by the block diagram given in FIG. 9 and the operation are explained. FIGS. 15A to 15G are circuit diagrams corresponding to the column decoder 13, row decoder 15, input buffer 17, output buffer 19 and binary 3-input-1-output logic element of the control circuit 21 respectively shown in FIG. 9.

Figure 15A:
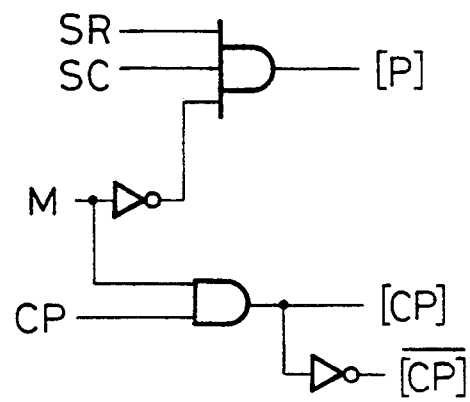

Among these drawings, FIG. 15A is a circuit diagram to show a control logic by the control circuit 21.

In the control logic, when the signal M is low (or in the program mode), only AE selected by SR, SC is operated ([P]: high). While, when the signal M is high (or in the simulation mode), the master clock CP is supplied to all AE to operate them.

Figure 15B:
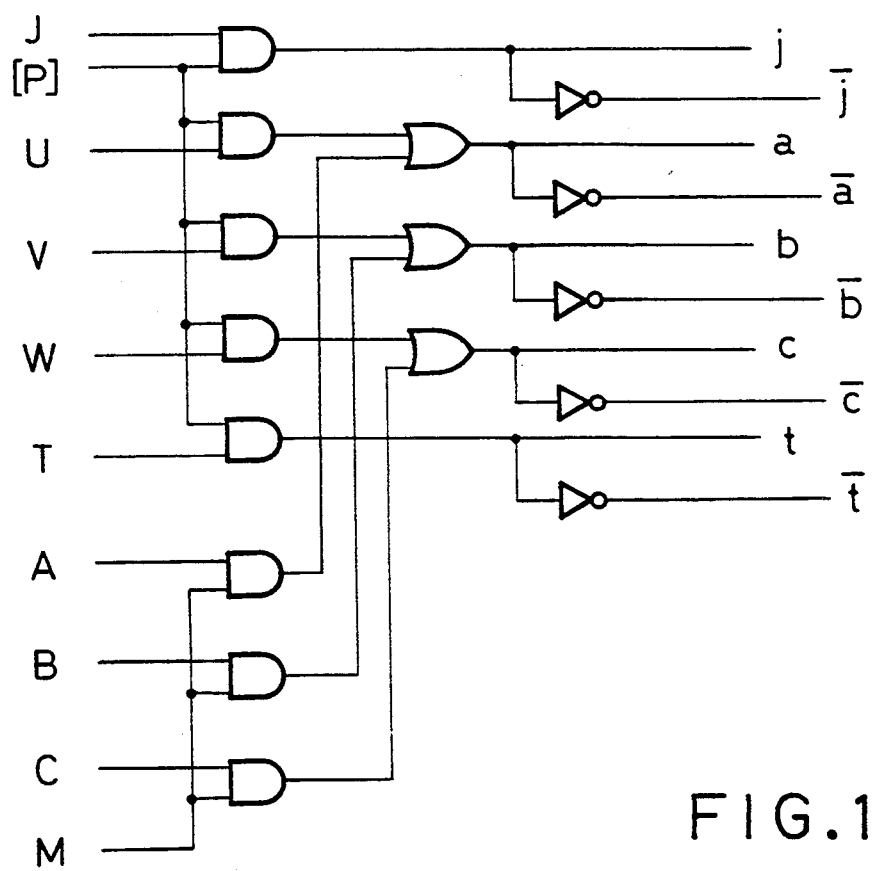

FIG. 15B is a circuit diagram to show a part of the input buffer 17.

In the same drawing, U, V, W, T, J are signals which are used only in the program mode. Among these signals, U, V, W respectively designate addresses of the memory cell array 11. While, the signal T is used for selecting memory cells used as the logic elements to which memory data are respectively written and other memory cells used as the command registers C1 to C5 and status registers S1, S2. As is already explained, the signal J shows data to be inputted to the memory cell array 11.

In the simulation mode, memory address selection signals a, ā, b, b̄, c, c̄, t, t̄ are respectively produced by the signals A, B, C, M. While in the program mode, these memory address selection signals are produced by the signals U, V, W, T, and write data j, j̄ are prepared by the signal J.

Figure 15C:
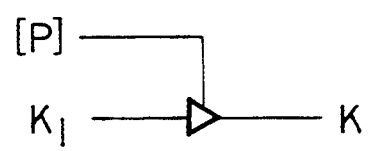

FIG. 15C is a circuit diagram to show a part of the output buffer 19, and an output signal K shows data in the program mode. The output signal K is prepared separately from the output signal H in the simulation mode. As the result, even if the simulation mode is discontinued by interruption and changed into the program mode, the simulation can be restarred after the host computer 1 collects simulation data. Incidentally, since this output circuit uses the signal K on a common signal line, the output should be a tristate output.

Figure 15D:
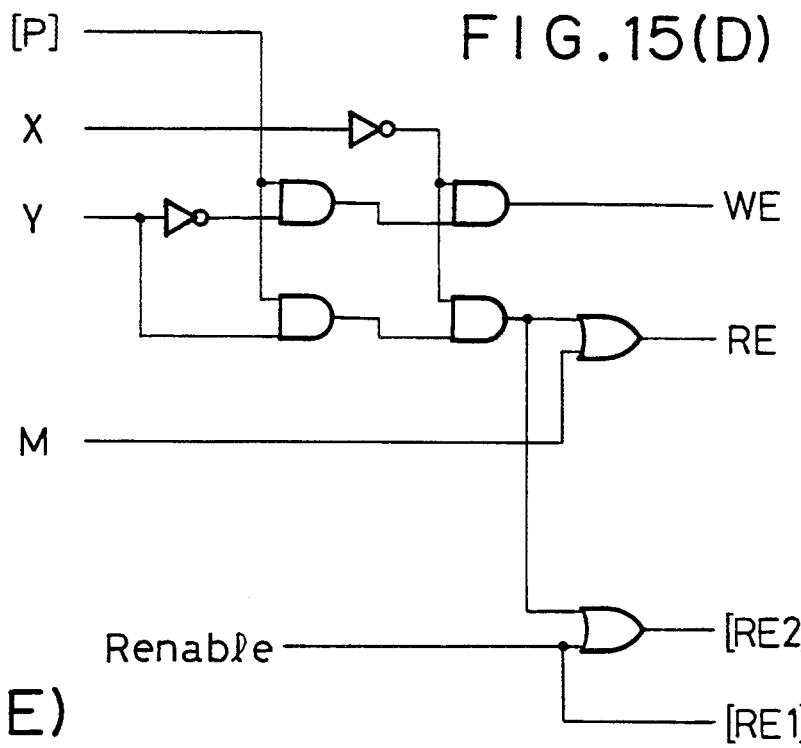
Figure 15E:
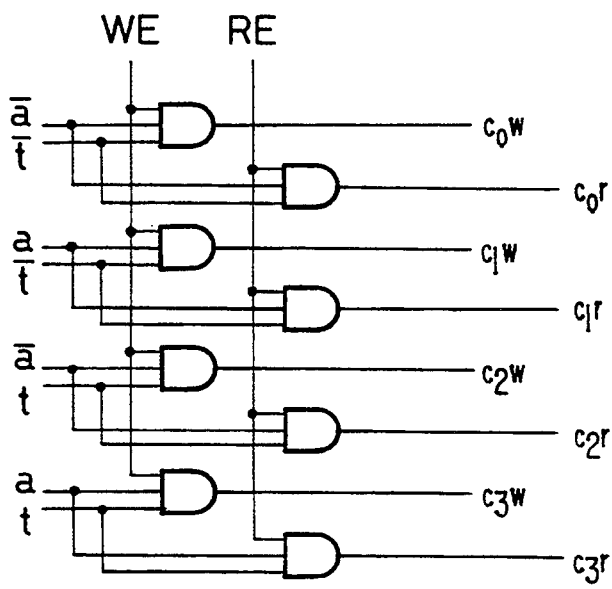

FIG. 15D shows a circuit for generating control signals WE, RE of the column decoder 13 shown in FIG. 15E and set signals [RE1], [RE2] given to the output buffer 19.

In the program mode ([P]=high), the control signals WE, RE are produced by the enable signal X and read-/write signal Y respectively given from MC3. While in the simulation mode, WE, RE are produced from the mode signal M.

The signal [RE1] is a set signal of an output buffer Bs which will be described below, and it is produced by the Renable signal shown in FIG. 13A. While, the signal [RE2] is a set signal of an output buffer Bp used in the program mode.

Figure 15F:
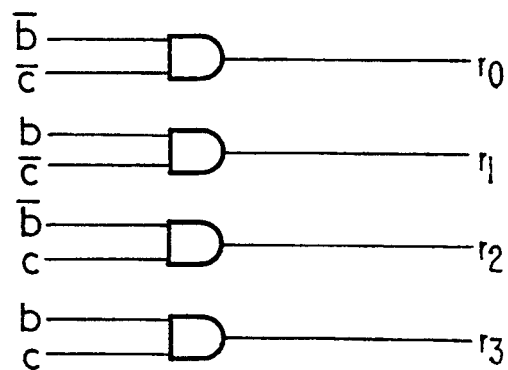
Figure 15G:
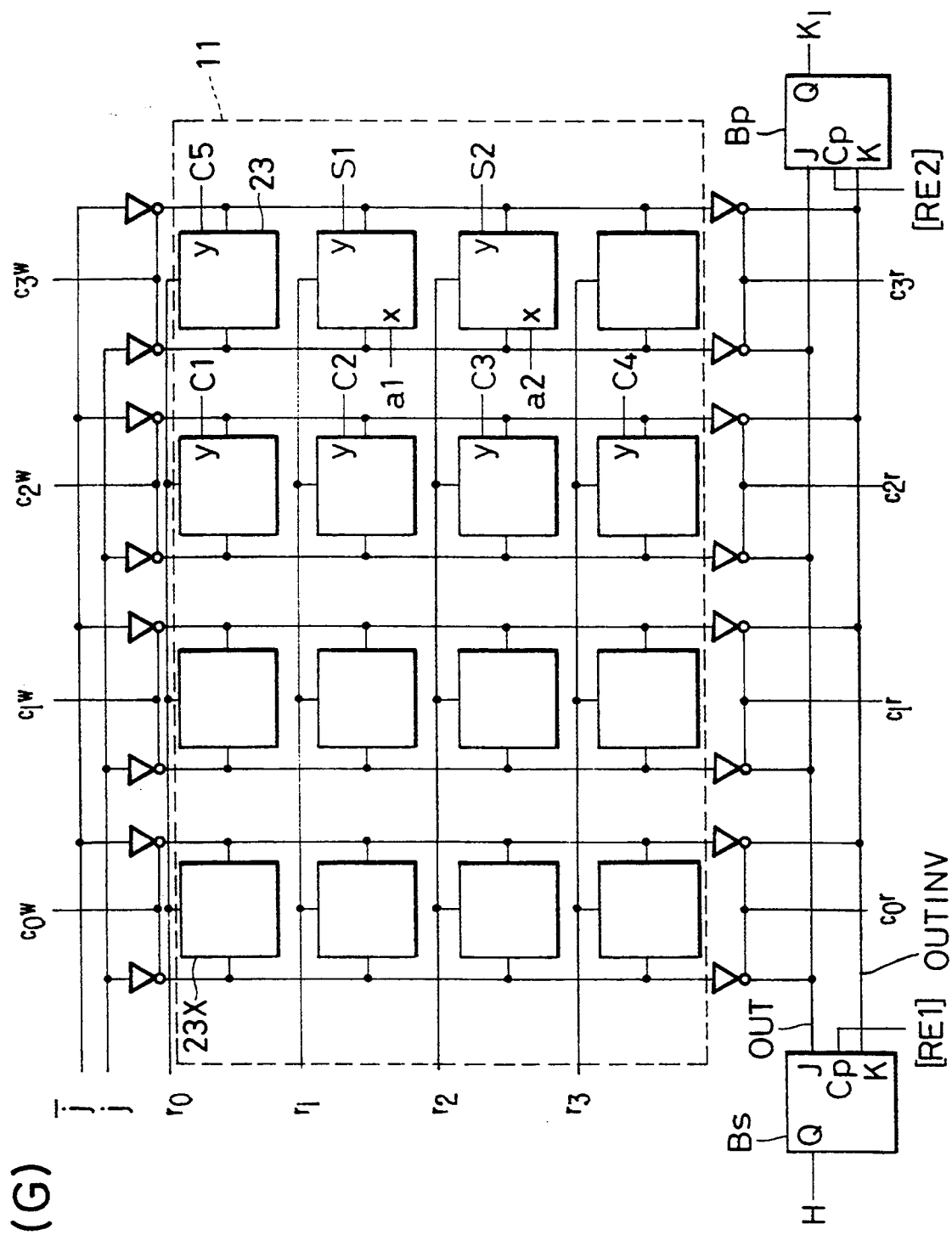

FIGS. 15E, 15F, 15G show the column decoder 13, row decoder 15 and memory cell array 11, respectively.

As shown in FIG. 15E, the column decoder 13 outputs read/write signals (C0r to C3r/C0W to C3W) respectively corresponding to the column address based on the memory selection signals a, ā, t, t̄ and the control signals WE, RE. While as shown in FIG. 15F, the row decoder 15 produces row address selection signals r0 to r3 from the memory address selection signals b, b̄, c, c̄.

Moreover as seen from FIG. 15G, the memory cell array 11 comprises regular arrangement of memory cells 23 generally divided into two 8-word blocks. Incidentally, the left 8-word memory cells 23x in the memory cell array 11 are used as memory cells for storing memory data of logic elements when the signal T shown in FIG. 15B is 0. While, the right 8-word memory cells 23 are used as the command registers C1 to C5 and status registers S1, S2 when T is 1.

Figure 14:
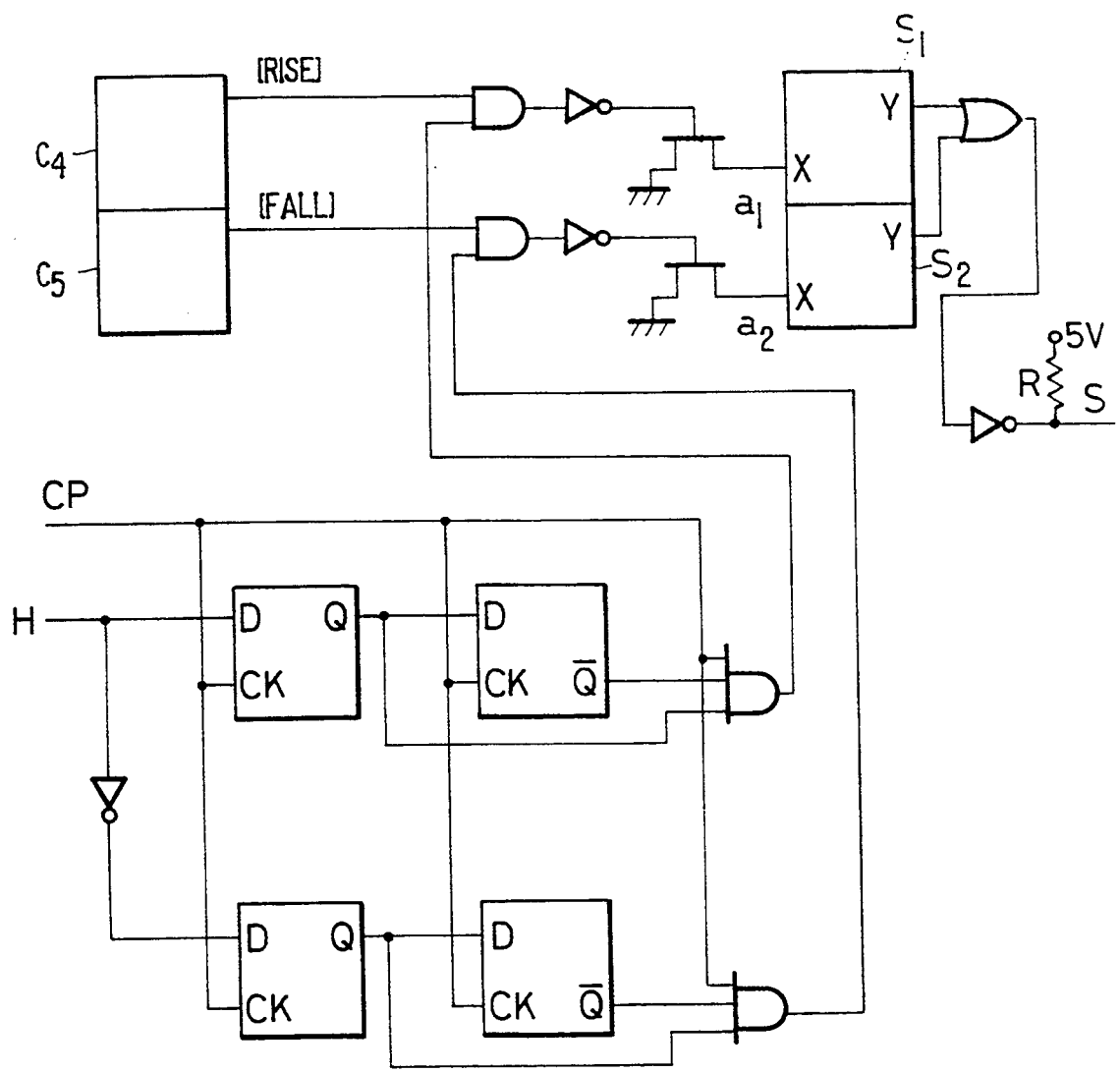

In this case, output signals C1 to C5 and S1, S2 from the command registers C1 to C5 and status registers S1, S2 are respectively supplied to the circuit already shown in FIG. 13A or FIG. 14. Moreover, when change of the output data H shown in FIG. 14 is detected, 1 is written into the status register S1 or S2 through a1 or a2 shown in FIG. 15G.

While, one memory cell 23 is designated by the write signals COW to C3W corresponding to the column address and row address selection signals r0 to r3, and the write data j, j̄ are stored. Likewise, when data are read out, data stored in a memory cell 23 designated by the read signals C0r to C3r and r0 to r3 are outputted.

In the simulation mode (M=high), data stored in a memory cell 23 designated by the address signals A, B, C are always read out on an output line OUT shown in FIG. 15G.

As stated above, the output buffer Bs is used in the simulation mode, and tile other output buffer Bp is used in the program mode. To the output buffer Bs or Bp, the output data H or K1 is given In accordance with the signal [RE1] or [RE2]. In this case, by change of any one of the address signals A, B, C, the output data H or K1 is set with time delay corresponding to one clock. Incidentally, the output buffer shown in FIG. 15C is connected to the output buffer Bp.

Figure 16A:
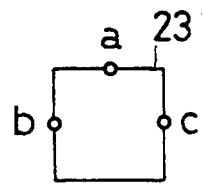
Figure 16B:
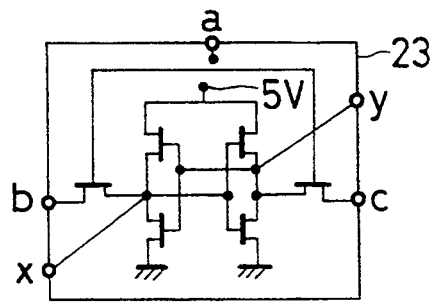

FIGS. 16A and 16B are respectively a symbolic diagram and an internal circuit diagram of the memory cell 23 used in the memory cell array 11.

Namely, based on the above circuit construction and operation, it becomes possible to realize any optional logic function of AE.

By the way, in order to realize LM7 shown in FIGS. 5 to 7 with a plurality of logic elements AE, it is necessary to provide a plurality of connection elements XE. Thus, the connection element XE will be explained hereinafter.

Figure 17:
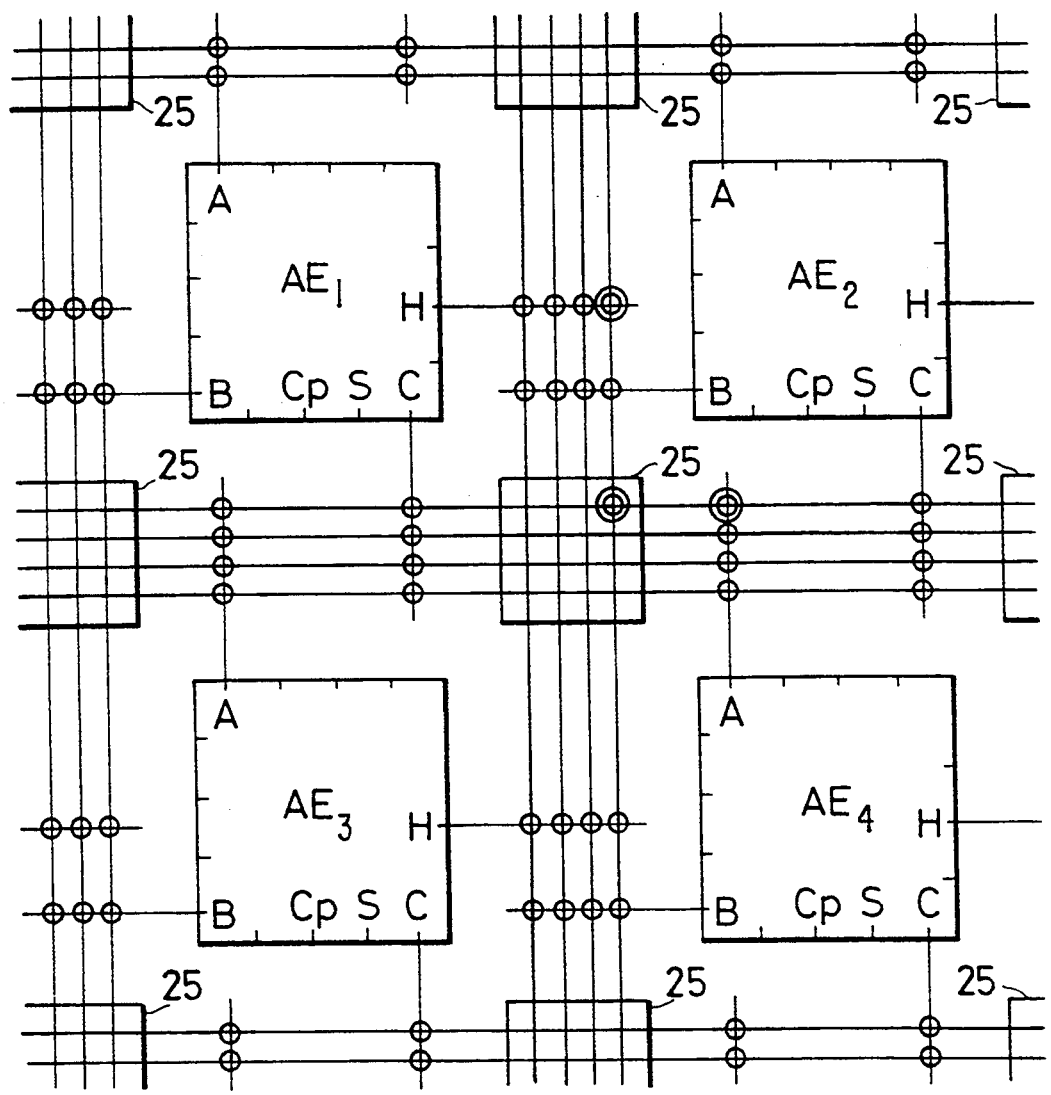

FIG. 17 is a diagram to show an enlarged wiring part of XE.

As shown in the same drawing, a wiring network comprising a plurality of signal lines is arranged around four logic elements AE1 to AE4. Moreover, input-output lines are respectively extend from input terminals A, B, C and an output terminal H respectively disposed in each AE so as to vertically cross the signal lines of XE. Incidentally, the wiring comprising these network and input-output lines are used in the simulation mode.

Ordinarily each signal line included in the wiring is not connected to other lines at respective intersections, and a switch for connecting or disconnecting two signal lines is provided at each intersection. When each pair of AE's are connected, corresponding switches are suitably set ON/OFF in accordance with indication from the host computer 1. For example, to connect the output terminal H of AE1 to the input terminal A of AE4, the switches designated by ⊙ in the drawing are set ON.

Namely, such an XE is constructed with two connection elements comprising switches. One is a connection element (designated by in the drawing) relating to each input-output line from AE and the other relates to a switch matrix 25 for giving an extension/division function to each signal line. FIGS. 18A to 18C show examples of the switch matrix 25 and switches.

As shown in FIG. 18A, the switch matrix 25 comprises 16 switches s (designated by O) and 16 switches t (designated by ● ).

Each switch s is provided at each intersection of two signal lines as shown in FIG. 18B. Moreover, at the gate of tile switch s, a memory m for controlling the switch s is connected. In the memory m data (0/1) is stored in advance in accordance with indication from the host computer 1. Namely, the switch s connects/disconnects tile two signal lines by its ON/OFF operation in accordance with the data.

While, the switch t is provided on each signal line as shown in FIG. 18C. Like the switch s, the switch t also has a memory m, and extends/disconnects the corresponding signal line by its ON/OFF operation in accordance with tile data stored in the memory m. Therefore, according to the switch t, it becomes possible to prepare a long wiring portion often required in designing logic circuits or increase the integration degree of a circuit by packaging many short wiring sections.

Incidentally, in FIG. 17, the switch s is used as each connection element designated by O on each input-output line from AE.

Namely, by connecting AE's according to such ON/-Off operation of the switches s and t, each logic circuit included in the logic function section LM7 can be realized.

Figure 19:
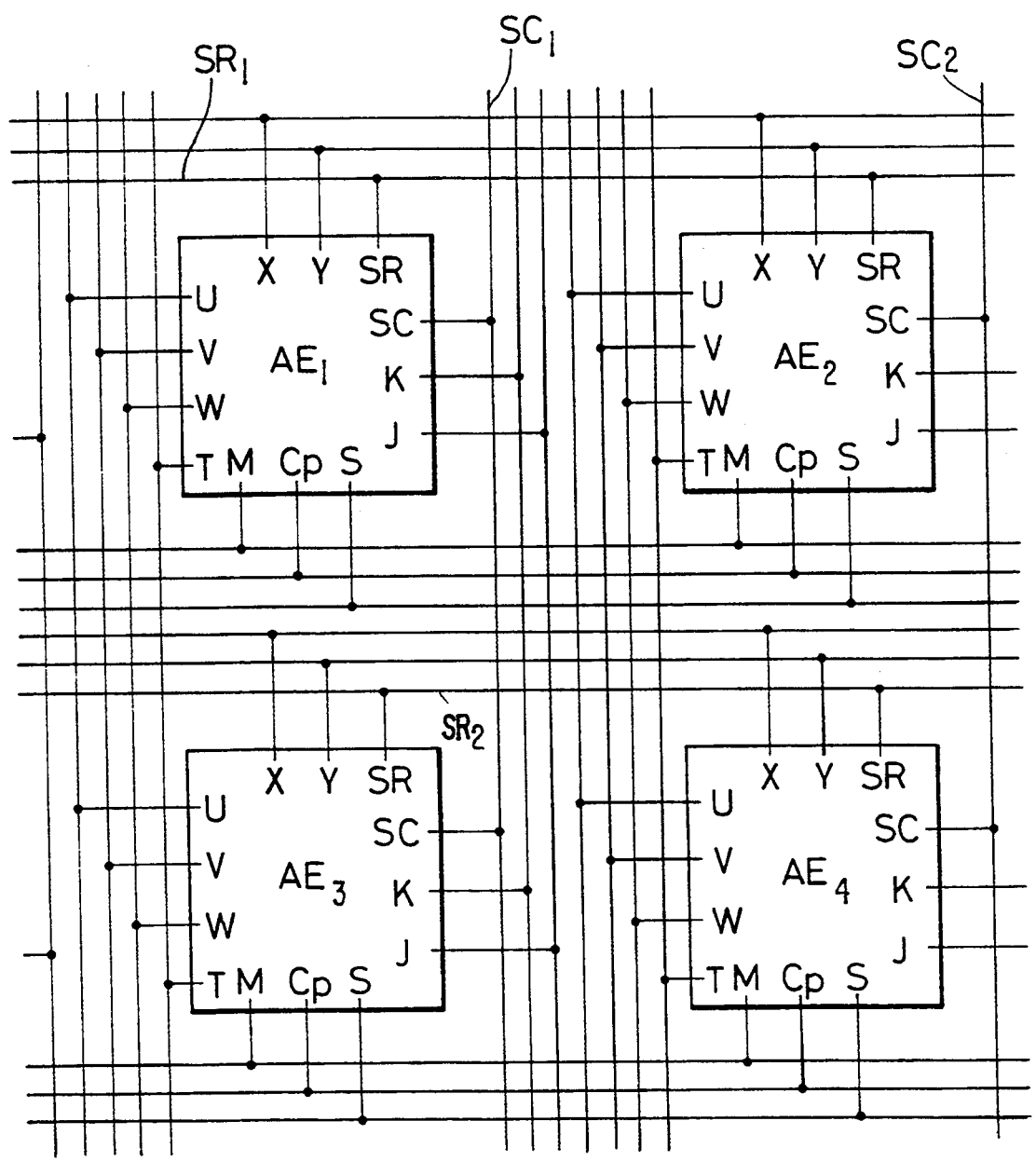

Besides the wiring section to be used in the simulation mode, each connection element XE has another wiring section to be employed in the program mode. FIG. 19 shows a fixed wiring network mainly used in the program mode.

In the same drawing, a wiring network comprising a plurality of signal lines as shown in FIG. 17 is arranged around the logic elements AE1 to AE4. Moreover, an input-output line extends from each signal terminal of the logic elements AE1 to AE4. Unlike the network shown in FIG. 17, the switches s, t are not provided, and each input-output line from AE is fixedly connected to each corresponding signal line.

Moreover, since the signals M, CP, S for the simulation mode are used in common to all AE, they are also fixedly connected to corresponding signal lines respectively. While, the other signals are used only in the program mode, and thus fixedly connected to the wiring used in common to AE and XE.

Moreover, SR terminals of AE1, AE2 are connected in common to a signal line SR1, and those of AE3, AE4 are connected to in common to a signal line SR2. While, SC terminals of AE1, AE3 are connected in common to a signal line SC1, and those of AE2, AE4 are connected to in common to a signal line SC2. Besides, these signal lines SR1, SR2, SC1 and SC2 are respectively connected to the address decoder 77 shown in FIG. 8. Namely, AE as an object is selected by a suitable combination of SR1 to SRn and SC1 to SCn respectively outputted from the address decoder 77.

By the way, in the program mode, the above-described switches s, t are controlled by a control section provided in XE in accordance with designation of these signals given from the host computer 1.

Figure 20A:
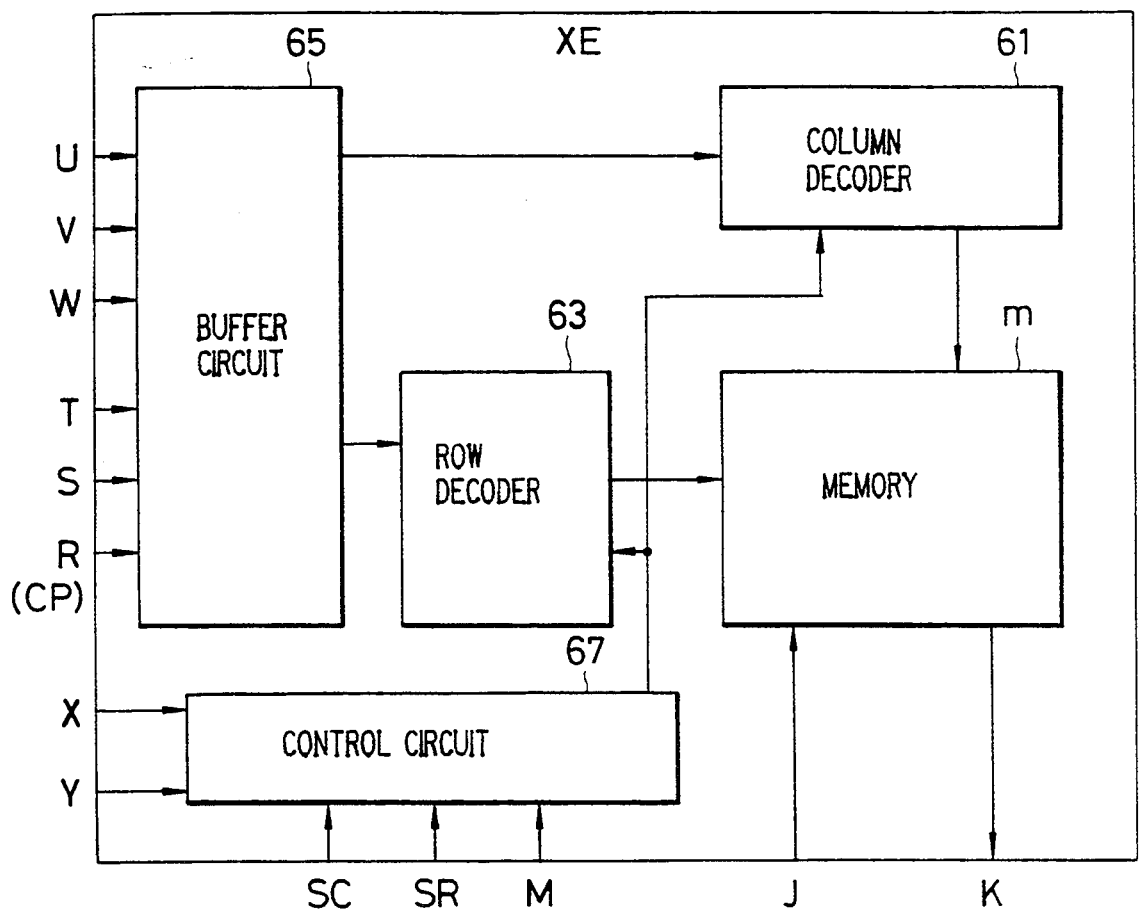

FIG. 20A shows a block diagram of the control section provided in the connection element XE.

As shown in the same drawing, the control section comprises a memory m, a column decoder 61, a row decoder 63, a buffer circuit 65 and a control circuit 67.

Figure 20B:
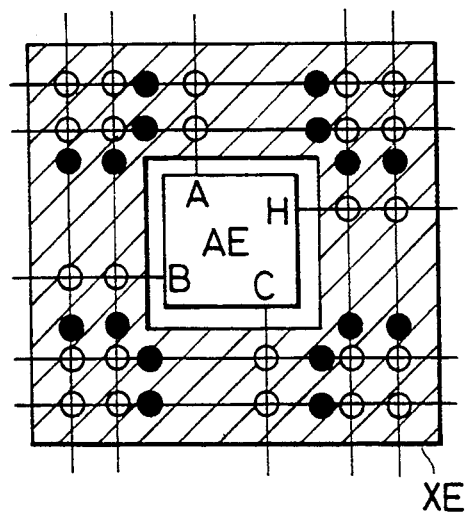

The memory m is constructed with memory cells corresponding to the number of the switches s or t included in the wiring network. The construction is similar to that of AE shown in FIG. 9, and comprises only simple fixed wiring patterns. The difference from AE is that the memory capacity depends on the wiring capacity (the number of switches). For example, in case of wiring in FIG. 20B which corresponds to the circuit diagram in FIG. 6, 40 switches s, t are used in XE. Therefore, the memory m requires memory cells for controlling these 40 switches. As stated above, the output H from the memory m is connected to the respective gates of the switches s, t.

Signals S, R to be inputted to a buffer circuit 65 respectively correspond to the status signal or master clock CP in AE. However, since being not used in XE, these signals are used as address signals. As the result, the signal lines are used in common to AE and XE. Moreover, as in the case of AE, one XE is selected by an optional combination of SR1 to SRn and SC1 to SCn.

Incidentally, in the program mode, there are two methods accessing to AE or XE. One is a method using a switching signal given in advance to AE, XE. The other is a method using a different address given in a memory cell comprising the memory cell array 11 in AE and the memory m in XE. Namely, the former half 16 words correspond to tile memory cell array 11, while the latter half (40 words, for example) corresponds to the memory m. Accordingly, it becomes possible to access to AE or XE by designating the memory address.

As explained above, each logic circuit section of LM7 can be realized with the logic element AE and the connection element XE.

Next, the connection section XM 9 for connecting the logic function sections LM7 is explained. As shown in FIG. 1, XM9 is used for mutually connecting the plurality of LM7.

Figure 21:
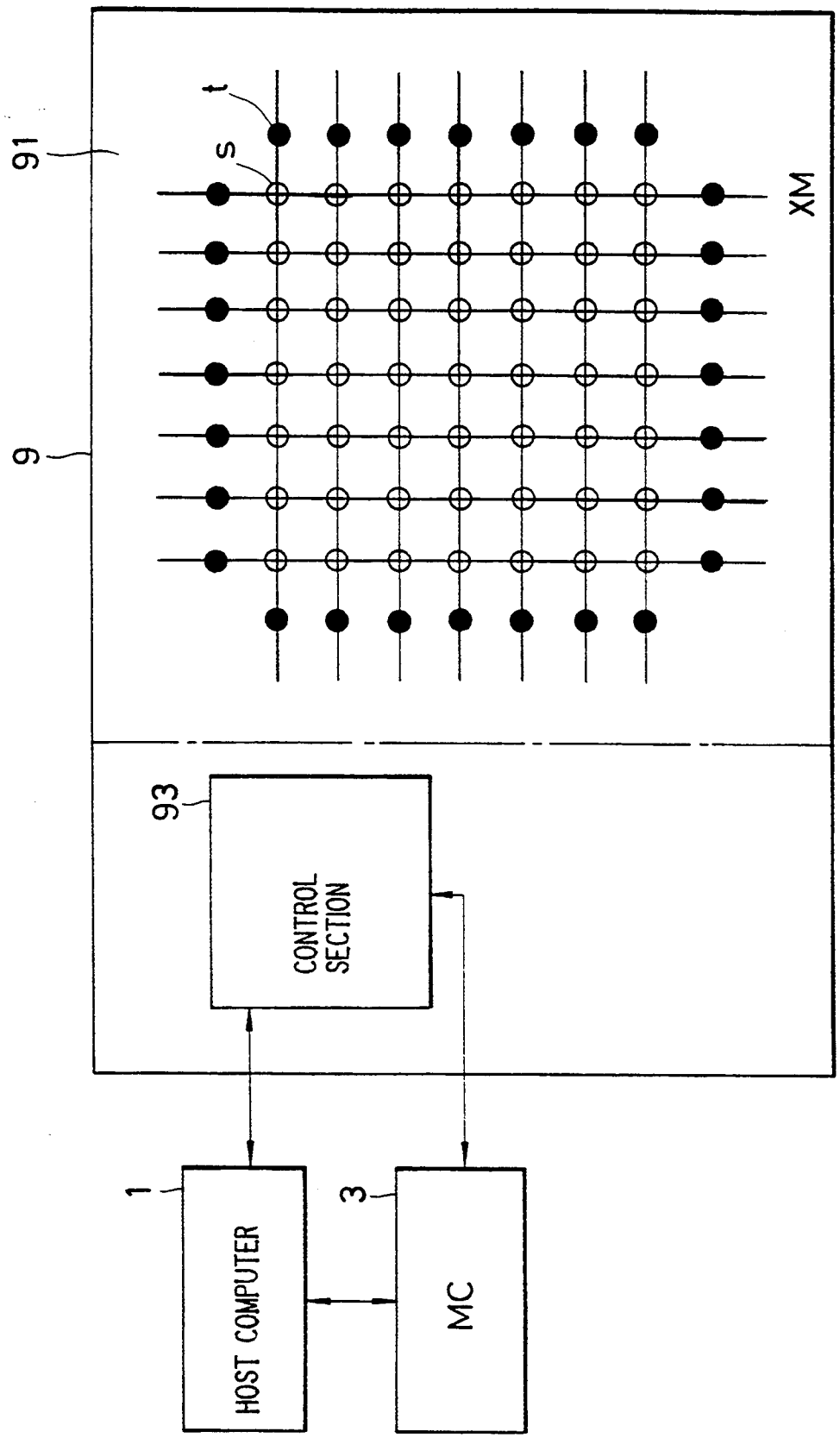

FIG. 21 is a constructional diagram to explain the function of XM9.

As shown in the same drawing, like XE, XM9 comprises a switch matrix 91 and a control section 93.

In the switch matrix, as shown in FIGS. 18A to 18C, switches s for connecting/disconnecting two signal lines and switches t for extending/disconnecting each signal line are respectively given.

The control section 93 is connected to the host computer 1 and MC3, and has substantially the same construction as that of the control section of XE shown in FIG. 20A. Moreover, in a memory (not shown) in the control section 93, memory cells corresponding to the number of the switches used in the switch matrix 91 are arranged.

The connection section XM9 having the above-mentioned construction sets the switches s or t ON/Off in accordance with indication given from the host computer 1. As a result, the logic function sections LM7 are connected to one another, so that it becomes possible to express the entire body of a large-scale logic circuit.

Though the switches s, t and memory m are respectively independent in the above explanation on this embodiment, it is also possible to realize the same function with combination of SRAM, DRAM and switch transistors. Moreover, it is also possible to use combination of nonvolatile memories and switch transistors or switches (not rewritable program) employing special fuses.

These methods are already known, and there are the following reference materials relating to them.

1) Ross H. Freeman: "LCA" for Supplying Gap between Gate Arrays and Known PLD, Nikkei Electronics, 1986. 9. 8 (no 403), 245–265.
2) Williams S. Carter, Khue Duong, Ross Freeman, Hung-Cheng Heieh, Jason Y. Ja, John E. Mahoney, Luan T. Ngo, Shelley L. Sze: A User programmable Reconfigurable Logic Array, 1986 CICC, 233/235.
3) Abbas El Gamal, Jonathan Greene, Justine Reyneri, Eric Rogoyskl, Khaled El-Ayat, Amr Mohsen: An Architecture for Electrically Configurable Gate Arrays, 1988 CICC, 15.4.1/15.4.4.
4) Yasuo Ikawa, Kiyoshi Urui, Masashi Wada, Tomoji Takada, Masahiko Kawamura, Misao Miyata, Noboru Amano, Tadashi Shibata: A One Day Chip: An Innovative IC Construction Approach Using Electrically Reconfigurable Logic VLSI with On- Chip Programmable Interconnections, IEEE JSSC, Vol.SC-21, No. 2, April 1986, 223-227, (in Japanese).

Finally, the method of collecting simulation data by the host computer 1 is explained.

The host computer 1 realizes the entire body of a logic circuit desired by a designer based on LM7 and XM9. Thereafter, the designer sets the command register C4 or C5 (see FIG. 14) of AE to which is given a specific signal (or signals) to be detected so as to generate interruption. Then simulation is started after the setting.

When interruption is generated during simulation, MC3 sets the signal M low. As the result, the simulation is stopped and the host computer 1 is subjected to interruption.

There are two types of interruption, that is, interruption by LM7 and internal interruption (see interruption signal 201 in FIG. 4) at a specific time by MC3. In this case, the host computer 1 investigates whether or not the interruption given thereto is the interruption by LM7 based on an interruption processing program.

If the interruption is judged to be given by LM7, the host computer 1 next investigates which LM7 sent the interruption signal. Incidentally, since LM7 are arranged around the host computer 1, it is not so difficult to find out the specific LM7.

Thereafter, the host computer 1 reads the output signals H and states of the status registers S1, S2 (see FIG. 14) of all AE in the specific LM7, so as to specify AE which generated the interruption.

In such a manner, the host computer 1 knows respective states of AE, and collects simulation data or restarts simulation through MC3 based on the state information.

As stated above, according to the host computer 1, MC3, LM7, XM9, AE and XE, it becomes possible to realize a logic simulator which can construct simulation circuits corresponding not only to combinational circuits but also to sequential circuits. However, in order to execute the logic simulation more efficiently, it Is necessary to further improve the logic simulator. Hereinafter, such application of the logic simulator is described.

Application 1

If AE described in the above embodiment have to be connected to bus lines which are usually used in a logic circuit, a great number of AE is required. Therefore, the use efficiency of AE becomes low. A means of solving this problem is a method of making the output of AE selectable among ordinary output H and tristate output.

Figure 22A:
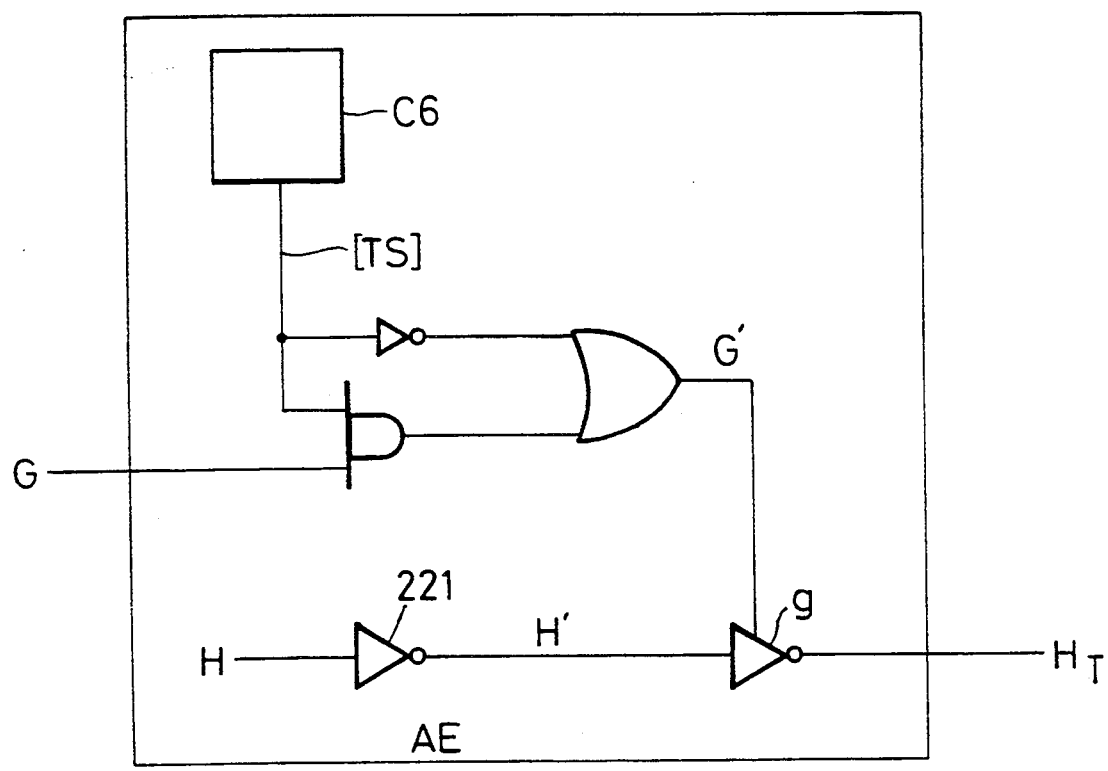
FIGS. 22A and 22B are circuit diagrams to show an application of the embodiment of this invention in which a tristate output is used as the output signal.

FIG. 22A shows a partial circuit diagram of AE including a tristate circuit.

In the same drawing, the output H from the memory cell 11 is outputted as $H_T$ from AE through an inverter circuit 221 and a tristate circuit g. In this case, a control signal G' of the tristate circuit g is generated from a S signal [TS] outputted from a command register C6 and a signal G given from the control section MC3.

The command register C6 is a register added for selecting whether or not the final output should be tristate output. When the tristate output is selected, TS=1 (high) is written in advance in the program mode. While, when the ordinary output is selected, 0 (low) is written.

Figure 22B:
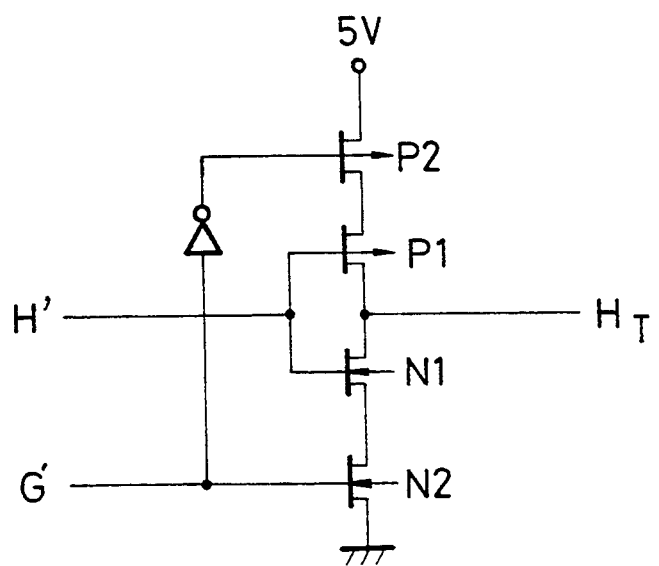

FIG. 22B shows construction of the tristate circuit g. This tristate circuit g comprises a CMOS (complementary MOS) in which P channel transistors P1, P2 and N channel transistors N1, N2 are connected in series.

During simulation in case of the tristate output, when the signal G is set low, the control signal G' becomes low. As the result, P2 and N2 in tile tristate circuit g become OFF so that the output $H_T$ becomes high impedance. Therefore, AE is disconnected from a bus line not shown. To the contrary, when the signal G is set high, the control signal G' also becomes high. Therefore, both P2 and N2 become ON so that H' is inverted and $H_T$ is outputted from AE.

On the other hand, when TS=0 is written in the command register C6 in order to select the ordinary output, the control signal G' becomes high regardless of the signal G. As the result, both P2 and N2 become ON so that H is outputted as $H_T$.

Accordingly, by adding the command register C6 in AE, it becomes possible to select whether or not the output should be tristate output in accordance with data to be written in the register C6.

Application 2

The logic simulator of the present invention is operated based on the unit-delay method where the output H appears one clock later after any one of the address signals A, B, C is changed. Incidentally, in the above embodiment of the present invention, AE has three inputs. Therefore, to construct a 4-input circuit with the 3-input AE, it is necessary to combine a plurality of circuits having three inputs or less. Accordingly, it is possible in certain combinations that the final output delay becomes 2 clocks or more. However, in case of constructing a logic circuit (hereinafter called macrocell) by combining a plurality of AE, it is preferable to set the final output delay at one clock. To this end, it is necessary to set the delay between each connecting pair of AE at 0. Therefore, in this application, it is possible to take out read signals (OUT, OUTINV shown in FIG. 15G) from the memory cell 23.

Figure 23:
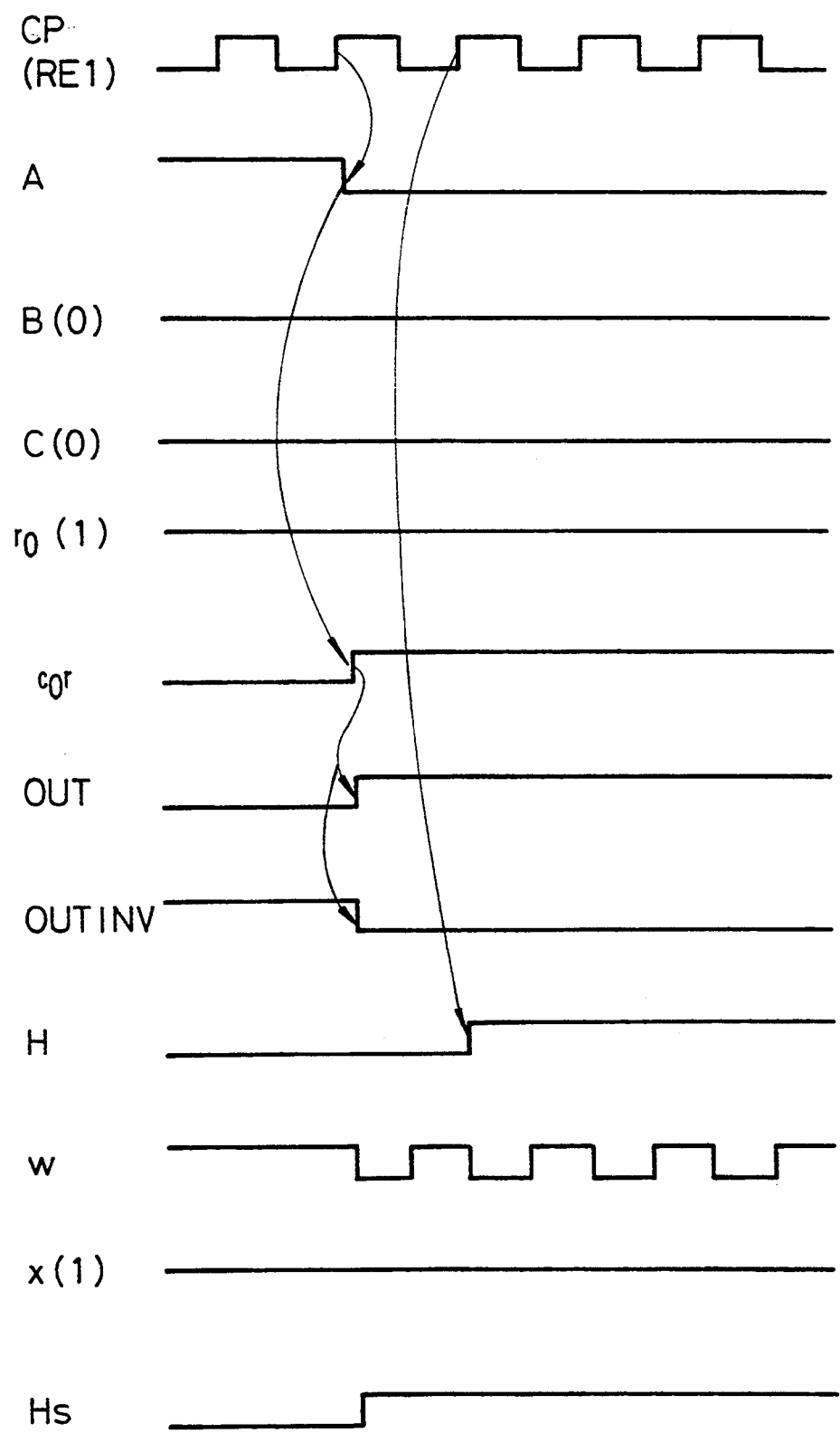
FIGS. 23 to 26 are diagrams to show an application in which delay of the output signal is set at 0.

For example, among the memory cells 23 shown in FIG. 15G, assume that "1" is stored in a memory cell 23x selected by the row address selection signal r0 and column selection signal C0r. Moreover, consider the case where "0" is written in all of the other memory cells 23. In such a case, when $\overline{A}$, $\overline{B}$, $\overline{C}$ are inputted as address signals respectively, signal waveforms as shown in FIG. 23 are obtained on read operation of the memory cell 23x.

As shown in the same drawing, A is changed from "1" to "0". If both B and C are "0", the row address selection signal r0 is expressed as follows:

$$r0 = b \cdot c = 1$$

(see FIG. 15F).

Moreover, the column selection signal c0r is changed from "0" to "1" in synchronism with the change of A, thus OUT, OUTINV are read out from the memory cell 23x. Then, these read signals are set in the output buffer Bs by In this case, RE1 can be thought to be the same as the clock CP. Therefore, the output signal H from AE is outputted one clock later after the address signal A is changed. Namely, the read signal H can be outputted in The unit-delay manner.

Figure 24:
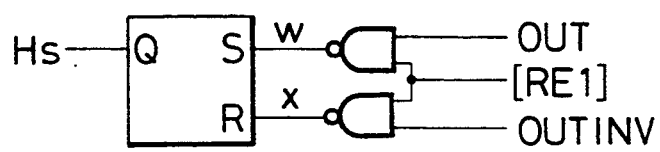

However, the read signals OUT, OUTINV appear at substantially the same time as the change of A. Therefore, by inputting these signals to an early-stage read circuit constructed with a set/reset flip-flop as shown in FIG. 24, an early-stage read signal Hs can be obtained.

Figure 25:
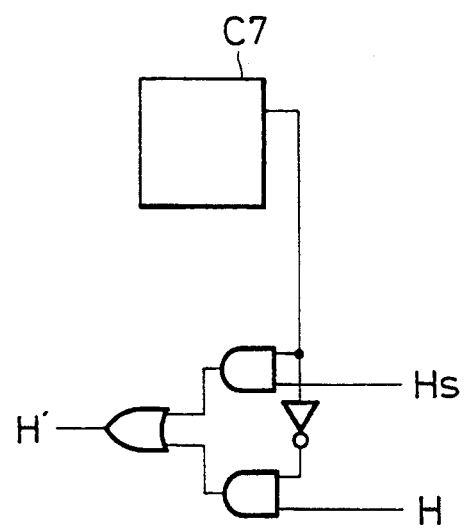

The selection whether the early-stage read signal Hs or unit-delay read signal H be outputted is carried out by a selection circuit shown in FIG. 25. In case of outputting the early-stage read signal Hs, "1" is stored in advance in a command register C7. While in case of outputting the unit-delay read signal It, "0" is stored therein. As a result, the signal H' can be outputted from AE as final output.

A macrocell can be constructed by obtaining the early-stage read signal Hs. This is explained in case of JK type flip-flops (JKFF).

Figure 26A:
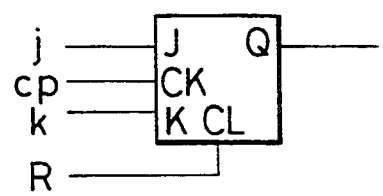
Figure 26B:
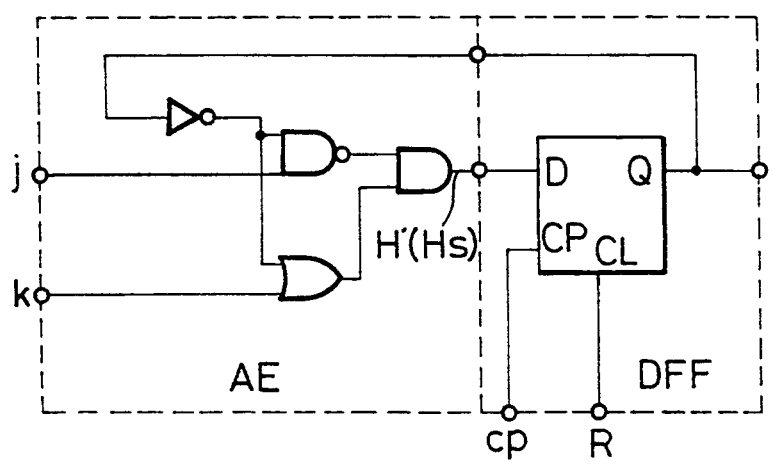

FIG. 26A is a symbolic diagram of JKFF, and FIG. 26B shows a circuit diagram of JKFF constructed by combination of one logic-AE and one DFF-AE. By selecting early-stage read signal Hs as output H' from AE, output Q from DFF becomes unit-delay output. Namely, this JKFF can be operated as a unit-delay circuit.

Application 3

In this embodiment, when the interruption state is stored in the status registers S1, S2 shown in FIG. 14, the interruption signal S is given to the host computer 1. As the result, the host computer 1 retrieves each logic element AE generating the interruption information, and specifies it. Namely, the host computer 1 reads and analyzes states of the status registers S1, S2 of all of AE in which the interruption is permitted to specify them. Therefore, when the number of AE which permit the interruption is relatively large, it takes much time to specify the AE generating interruption.

To reduce the retrieval time, there is a method of outputting a request signal (REQ) from the host computer 1 to each logic function section LM7 so that AE which receive the REQ signal and is generating an interruption at the time transmit of an information signal of the interruption generation to the host computer 1.

Figure 27:
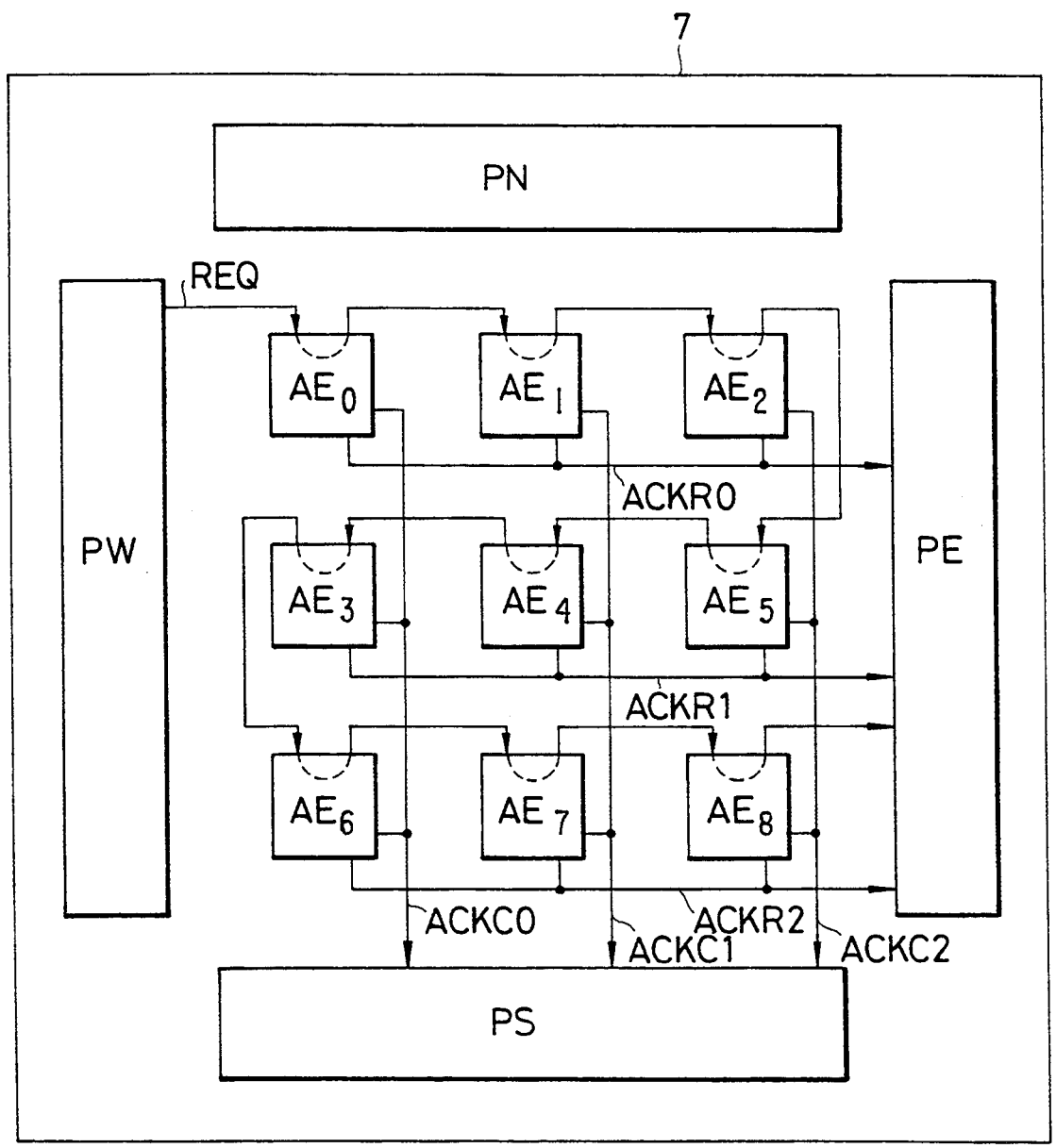
FIGS. 27 to 29 are circuit diagrams and one truth table to respectively show an application in which an interrogation signal corresponding to an interruption signal is outputted from a host computer.

FIG. 27 is a schematic diagram of the entire body of LM7 to explain this application.

As shown in the same drawing, an REQ signal line extending from a peripheral circuit PW is connected in series through all AE. From each AE, two answer (ACK) signal lines for transferring interruption information to the host computer 1, i.e. ACKR 0, 1 or 2 on the row side and ACKC 0, 1 or 2 on the column side, are respectively connected to peripheral circuits PE and PS.

When the interruption signal S is given to the host computer 1 from AE in which interruption is generated, the host computer 1 outputs the REQ signal to corresponding LM7. Then, the REQ signal is transmitted from the peripheral circuit PW of LM7 to AE0, and transferred to the next AE successively. The REQ signal passes through AE in which interruption is not generated without giving any action thereto, and goes to the next AE. While, any AE generating interruption outputs the signals ACKR and ACKC to the peripheral circuits PE, PS and stops transferring of REQ signal to the next AE when the REQ signal reaches there. Then, peripheral circuits PN to PE prepare information for specifying only AE generating interruption based on ACKR and ACKC, and the resultant data are stored in registers (not shown) of the respective peripheral circuits PN to PE. Thereafter, the host computer i reads the data of the registers to know each AE generating interruption, and resets contents of the status registers S1, S2 of this AE. As the result, the interruption signal S from this AE is eliminated.

If the interruption signal S is generated from other AE, the host computer 1 transmits the REQ signal again to each AE. In this case, AE in which are reset the contents of the status registers S1, S2 transfers the REQ signal directly to the next AE. Then, the REQ signal is taken in AE generating the interruption signal S. As a result, the same process as mentioned above for giving interruption information to the host computer 1 is carried out.

In such a manner, the host computers can know AE generating interruption by giving the REQ signal to LM7 correspondingly to the number of AE from which the interruption is outputted.

Figure 28:
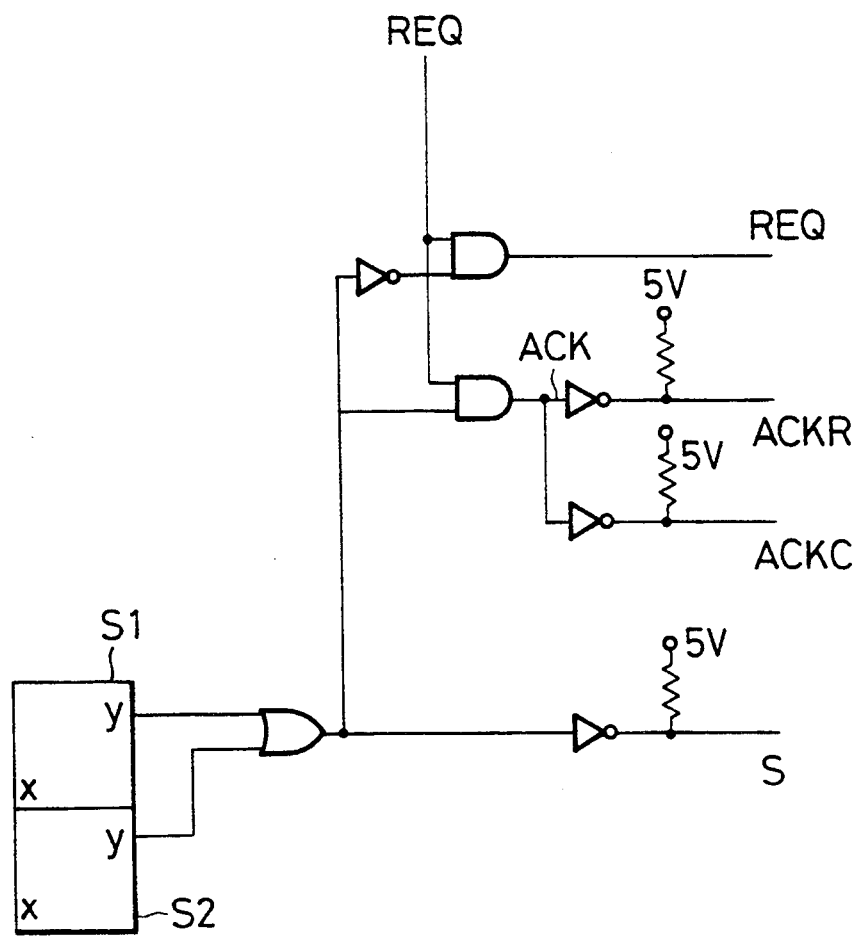

FIG. 28 shows an output circuit of the interruption signal S, ACKR, ACKC and REQ signal in AE. Namely, this circuit comprises adding a circuit for generating the signals ACKR, ACKC and REQ to a circuit portion corresponding to the status registers S1, S2 shown in FIG. 14.

When interruption is not generated, both contents of the status registers S1, S2 are 0. Thus, all of the interruption signal S. ACKR, ACKC become high, and the REQ signal is transmitted to the next AE. While, when interruption is generated, the output of the status registers S1 or S2 becomes high. Thus, the REQ signal becomes low, and is not transmitted to the next AE. Moreover, since an ACK signal becomes high, ACKR, ACKC become low and are transmitted to the peripheral circuits PN to PE.

Figures 29A, 29B:
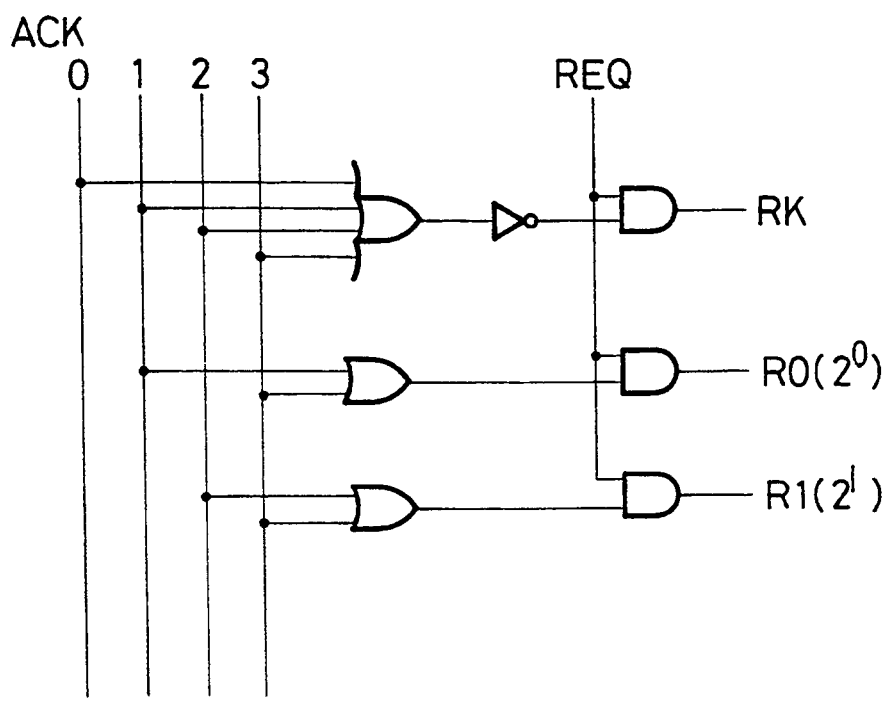

FIG. 29A shows a control circuit included in the peripheral circuits PN to PE for generating Information to specify AE from which interruption is generated based on the signals ACKR, ACKC are outputted from this AE. Incidentally, though this control circuit has four ACK signal lines, ACK0 to 3, corresponding to ACKR in FIG. 27, the number of the ACK signal lines is not limited to four. Moreover, the signal lines ACK0 to 3 respectively correspond to ACK in FIG. 28. In FIG. 29, RX, R0, R1 respectively show information held in the registers included in the peripheral circuits PN to PE.

The operation of this control circuit is shown in FIG. 29B.

When ACK0 to 3 are all 0, or when interruption is not generated from any AE, only RX becomes 1 and informs that the interruption signal is not generated. When at least one of these ACK signal lines becomes 1, RX becomes 0. While, R0, R1 are held in the registers as binary addresses, and one of the ACK signal lines transferring the interruption information is specified in accordance with the contents of R0, R1. For example, when only ACK2 transfers the interruption information, only ACK2 becomes 1, and R0, R1 become 0, 1 respectively. As a result, the number of the ACK signal line transferring the interruption information is specified as 2.

A similar circuit is also provided on the column side, in which CX, C0, C1 are held in the registers as signals respectively corresponding to RX, R0, R1. Namely, full information on a specific AE generating interruption is transmitted to the host computer 1 by R0, R1 on the row side and C0, C1 on the column side.

Accordingly, it is possible to reduce the time required for specifying AE generating interruption only by the REQ signal line and control circuits provided in the peripheral circuits PN to PE.

Incidentally, by linking the ACKR, ACKC signal lines to the signals for selecting a specific AE (SR1 to SRn, SC1 to SCn), the wiring amount can be reduced.

Application 4

To realize a memory system using AE, there is a method of constructing memory elements with DLATCHes and combinational circuits. However, such a method requires a great number of AE for realizing a large capacity memory system. Therefore, in this application, a method of realizing such a large capacity memory system by utilizing a memory cell array 11 for constructing AE is adopted. As a result, it becomes unnecessary to use such a great number of AE in realizing the memory system.

Figure 30:
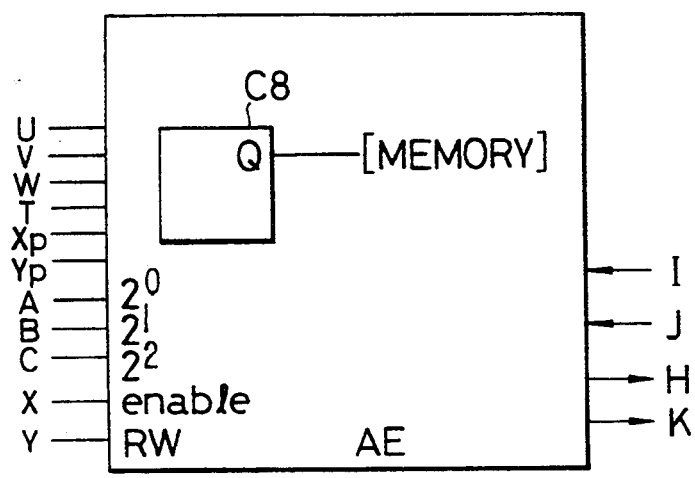
FIGS. 30 to 34 are circuit diagrams and one block diagram to respectively show an application in which the logic element is used as a memory.

FIG. 30 is a schematic diagram of a command register and external signals to be given thereto, which is necessary for utilizing AE as a memory system. Namely, a command register C8 is provided in AE so as to select whether or not this AE be used as a memory system in accordance with a signal MEMORY stored in the register. Moreover, to operate the memory cell array 11 in the simulation mode, the Enable signal X, R/W signal Y and input data are set to be accessible on the simulation mode. In the same drawing, U, V, W, T, Xp, Yp, J, K are signals or data all used in the program mode, while A, B, C, X, Y, I, H are signals or data used in the simulation mode.

Figure 31:
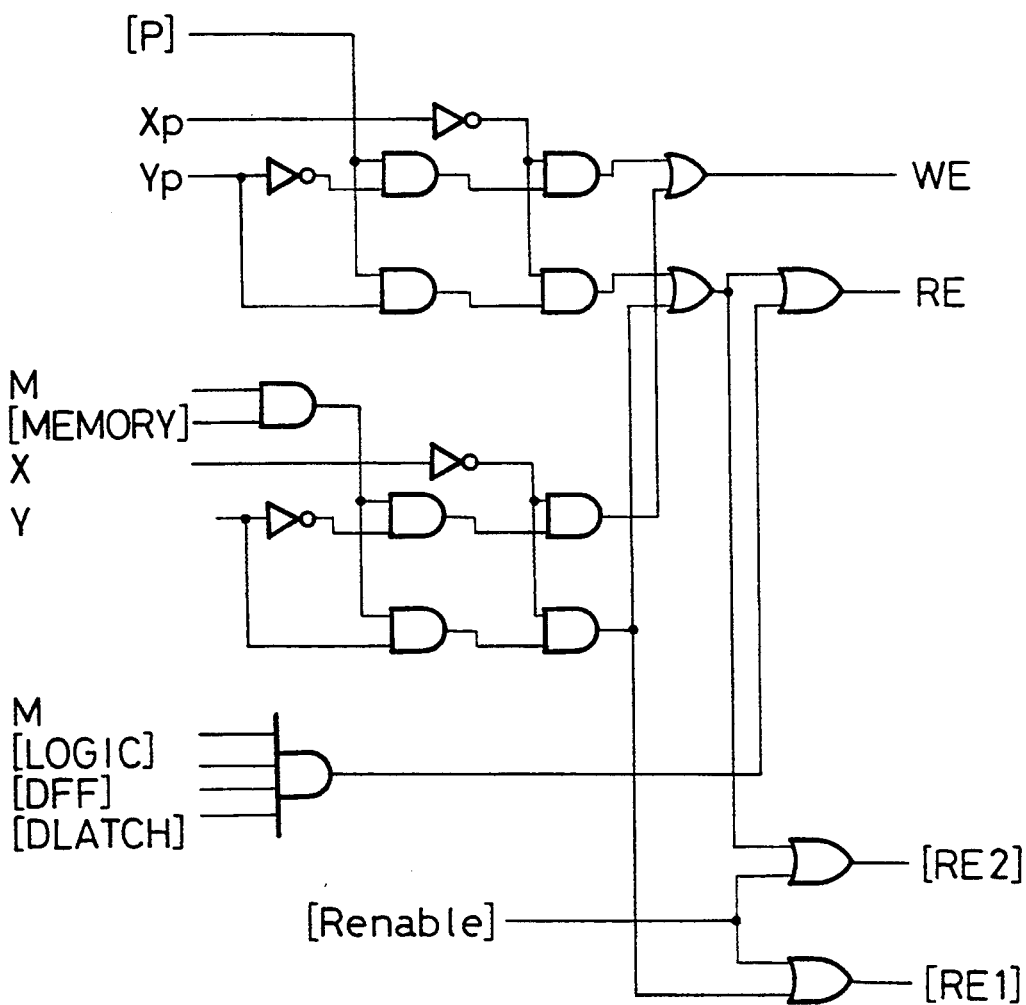
Figure 32:
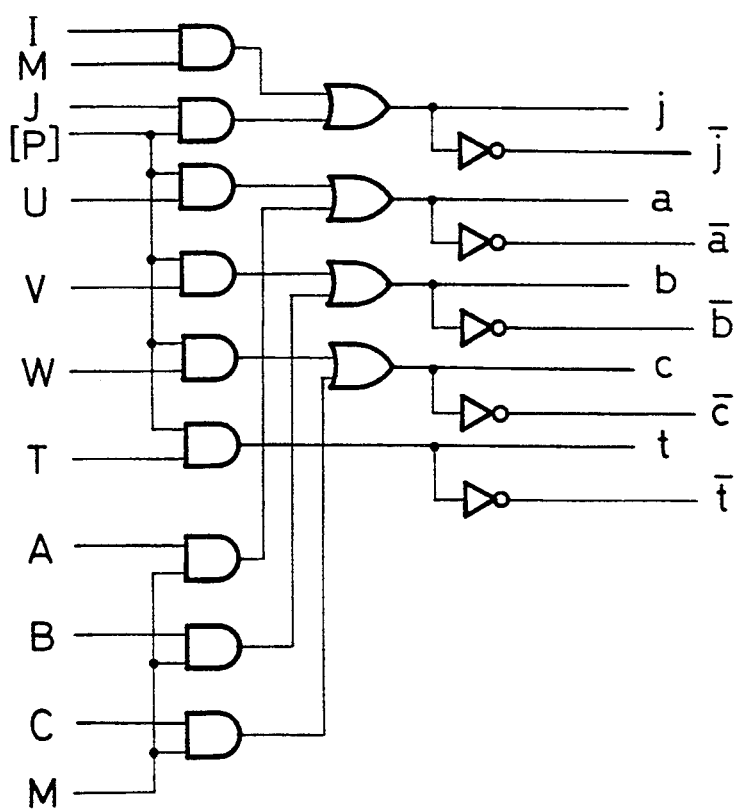

FIGS. 31 and 32 respectively show circuit diagrams of the input buffer 17 In AE. FIG. 31 comprises adding an enable circuit for the simulation mode to the enable signal generating circuit shown in FIG. 15D. While, FIG. 32 comprises adding input data I on the simulation mode to the input buffer circuit shown in FIG. 15B.

In FIG. 31, AE is used as a memory system when the signal MEMORY is 1. Moreover, read and write to the memory cell 23 are carried out by Xp, Yp in the program mode or by X, Y in the simulation mode. In case of the simulation mode when MEMORY is 0, AE functions as LOGIC, DFF or DLATCH and the data H is read out from the memory cell 23 by X, Y.

Figure 33:
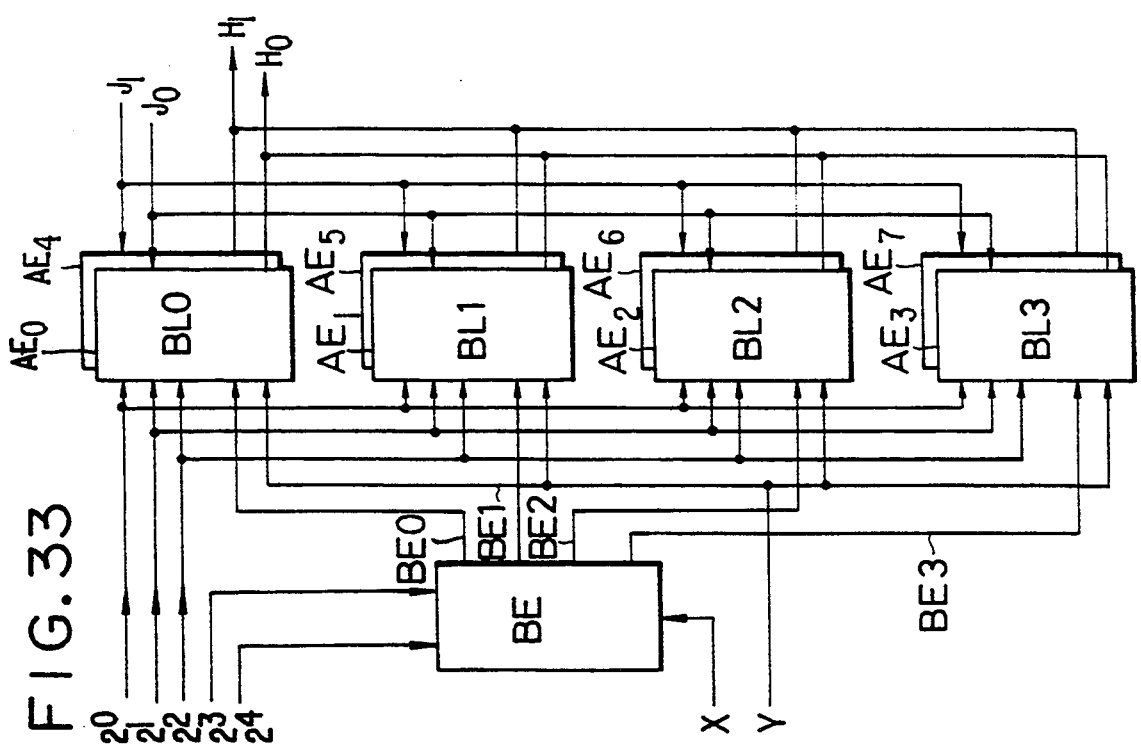

FIG. 33 shows a block diagram of a memory system constructed with a plurality of AE having the above-mentioned construction.

Each of AE0 to AE7 is a logic element of 8 words (each word corresponds to 1 bit), and each memory block from BL0 to BL3 is constructed with two AE's. Namely, this example shows a memory system of 32 words (each word corresponds to 2 bits). In the same drawing, a block selection circuit BE produces Enable signals (BE0 to 3) from X and supplies them to BL0 to BL3 respectively. The lower three bits ($2^0$, $2^1$, $2^2$) of the address signal and Y are given in common to all of the blocks. While, the input data J0, J1 and output data H0, H1 are inputted or outputted in common to one AE of each block. Moreover, it becomes easy to extend the word length by connecting these input and output data in parallel in the word direction.

Figure 34:
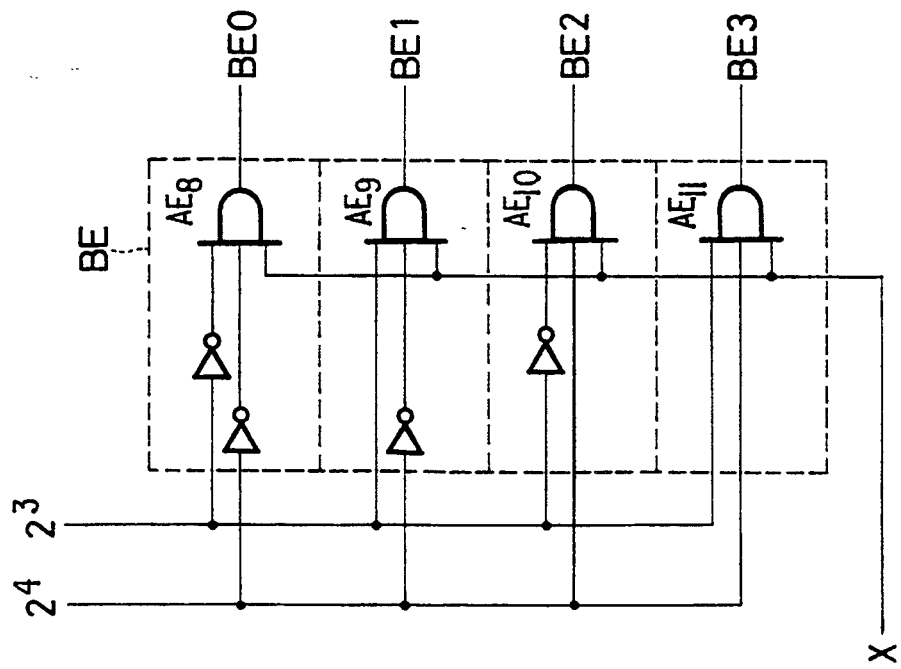

FIG. 34 shows a circuit example of BE.

In the same drawing, BE comprises four AE's (AE8 to 11). These AE8 to AE11 respectively decode the higher two bits ($2^3$, $2^4$) of the address signal, and select BL0 to BL3 in accordance with the resultant address (0, 0), (1, 0), (0, 1) or (1, 1). Moreover, in accordance with the logic product between X and the address corresponding to the selected block, one of the Enable signals BE0 to BE3 is given to the block.

Incidentally, since the outputs BE0 to BE3 of AE8 to AE11 constructing BE must not include the unit delay, the early-stage read signal Hs explained in Application 2 is outputted as BE0 to BE3. Therefore, it is necessary to write "1" in advance in the command register C7 shown in FIG. 25. However, if BE0 to BE3 include the unit delay, the unit delay also appears in the read and write operation. Therefore, it is necessary to give time delay corresponding to 2 clocks in the memory operation in BL0 to BL3. Accordingly, if the memory system is designed in consideration of this time delay, it is not always necessary to use the early-stage read signal Hs.

As stated above, it is possible to realize a large scale memory system using a memory cell array 11 for constructing AE.

Application 5

In the above embodiment, only binary simulation is described. However, in such a binary simulation method, incorrect data is likely to be outputted. For example when the designer forgets wiring for a reset signal of a flipflop and the like, 0 or 1 is determined by accident on the operation. Thus it is very difficult to find out design mistakes, for example, when the designer forgets wiring for a reset signal of a flip-flop and the like.

By the way, there are other logic simulation methods for handling signals each comprising three values or more. For example, in case of the ternary logic simulation, another signal "u" (undefined) is used with "0" and "1". The signal u is used for expressing a state not yet initialized in a memory element such as flip-flops, therefore it is sufficiently useful also on the system design stage. Accordingly, even in case of forgetting the reset signal wiring, the design mistake can be immediately detected by appearance of the signal u. Hereinafter, one application for handling such ternary signals will be explained.

In this case, these three signal values are respectively defined as follows with two bits.

01:0
10:1
11: u (undefined)
00: e (error)

00 is not given by the designer nor in the software, and is thus not originally existent in the system. Therefore, when 00 appears, it can be thought that there is something wrong in the simulator. On the other hand, since only these three values are defined with four 2-bit values, it can be thought that the system has redundancy corresponding to the one bit. A method of positively utilizing the redundancy will be described later.

A 3-input-1-output combinational circuit can be expressed as follows:

$$H=f(A, B, C).$$

In case of realizing this circuit with a memory, the memory capacity should be $3^3=27$ words because A, B, C are ternary signals respectively. In this case, as described above, 1 word comprises 2 bits.

For example, a 3-variable NAND circuit denoted by H=NAND(A,B,C) can be expressed with a truth table shown in FIG. 35. In case of the ternary system, the signal u is also transferred.

Figure 36:
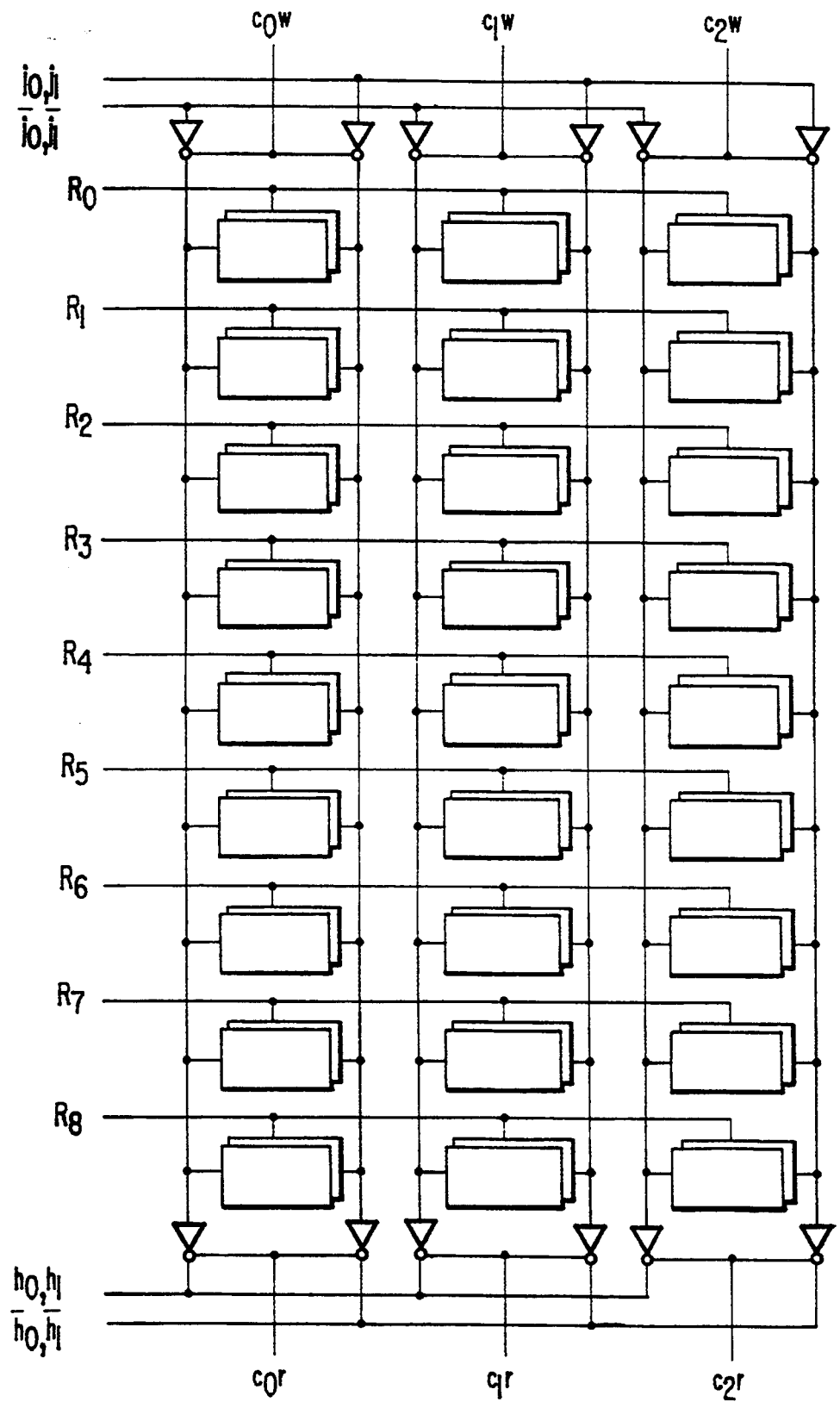

Since 27 can be changed into 3×9, a memory cell array of 27 words can be expressed as shown in FIG. 36 by adopting construction comprising 3 columns and 9 rows. However, because the system is ternary, the memory cell array has two planes, and the same address points the same place on these two planes.

Among column selection signals C0W, C1W, C2W and C0r, C1r, C2r, and row selection signals R0, R1, R2, R3, R4, RS, R6, R7, RS, one memory cell can be designated by giving C0r to C2r and R0 to R8 in the read operation (simulation mode) or by giving C0W to C2W and R0 to R8 in the write operation (program mode).

Hereinafter, the contents of the logic element AE is explained.

Figure 37:
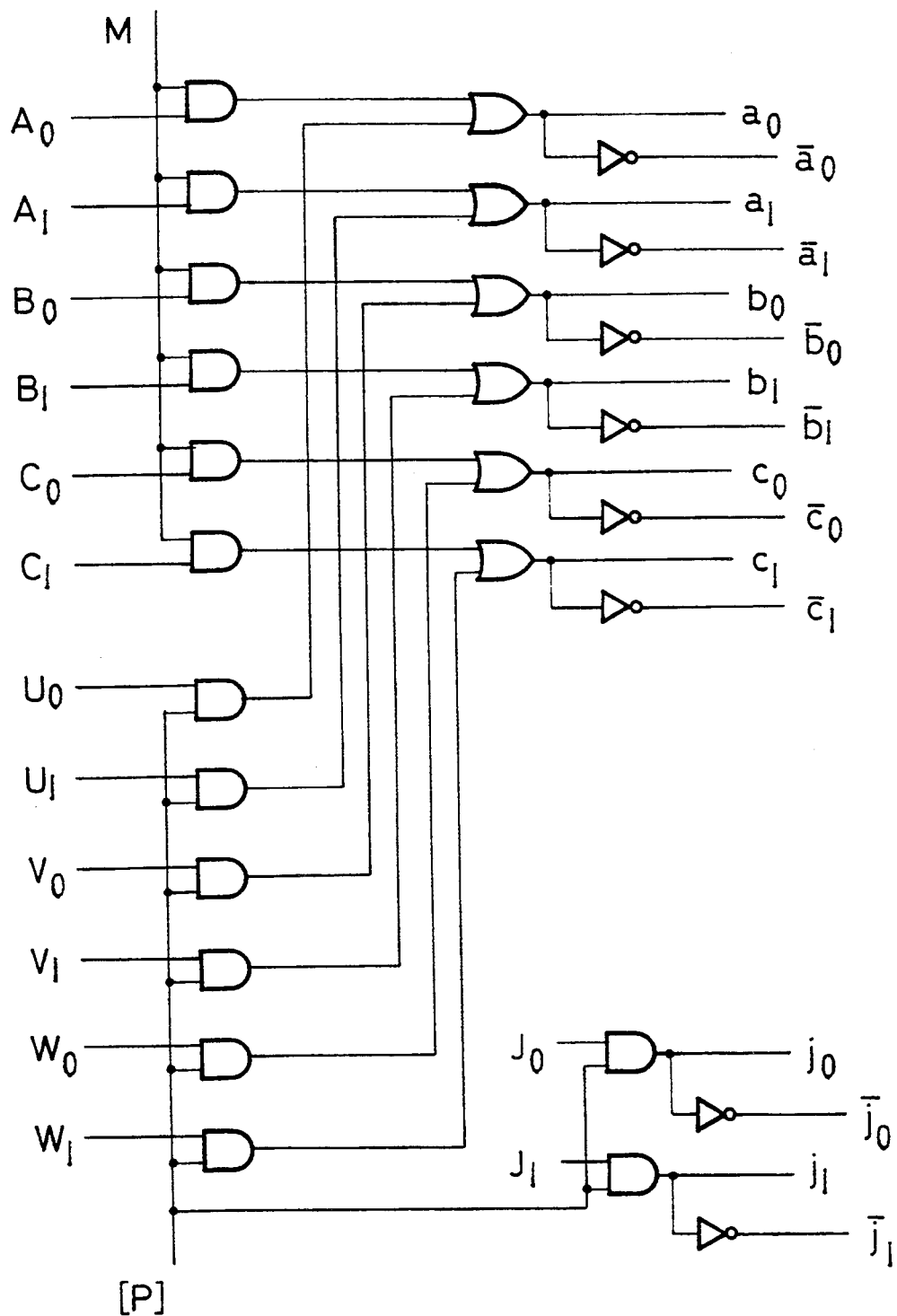

FIG. 37 shows an input buffer circuit.

Though the simulation mode is chiefly described here, the program mode can be also guessed by the description.

When the input signals are respectively expressed as follows:
A=(AO, A1)
S=(SO, S1)
C=(CO, C1),
A0, A1, B0, B1, C0, C1 are all binary signals. These signals are respectively supplied to AE by two signal lines from the outside. The same can be said with respect to U, V, W. Moreover, A, B, C and U, V, W are respectively selected into internal signals a, b, c in the mode M.

FIG. 38 shows a ternary-to-binary circuit for converting these selected binary signals a, b, c into corresponding ternary signals. As shown in the same drawing, each resultant ternary signal can be expressed by combination of three variables including additional characters (l, m, n).

Namely, when the ternary signal A is inputted in the form of a pair of binary signals (A0, A1), the form is converted into a ternary signal (al, am, an). In this case, ae shows a non-existent ternary signal (0, 0), and it can be positively utilized for specific purposes such as signal error interruption or address extension. Moreover, by preparing an error interruption signal based on the logic sum (OR) of error outputs from all ternary-to-binary conversion circuits, it becomes possible to investigate the simulator operation.

Figure 39A:
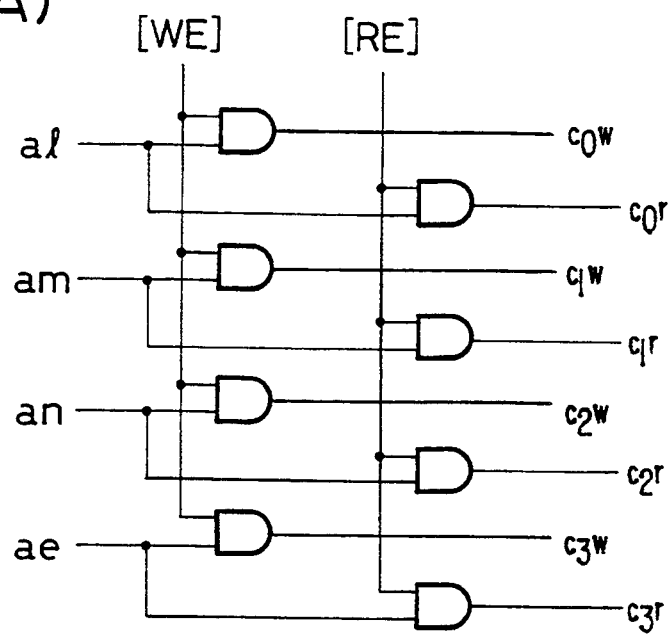
Figure 39B:
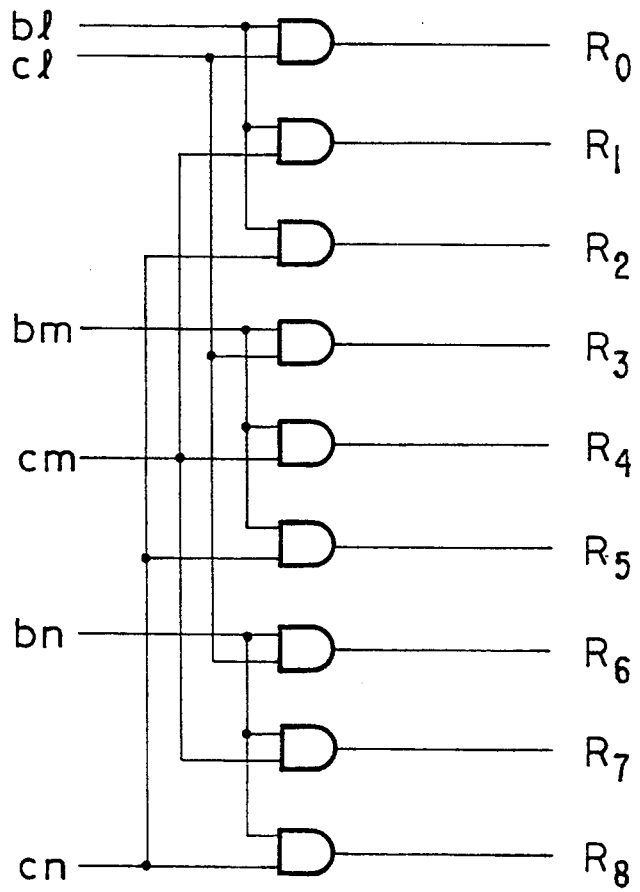

FIGS. 39A and 39B respectively show an address decode circuit constructed with the above-described ternary expression (l, m, n).

FIG. 39A shows a column decoder which writes data into a memory cell selected at a timing of [WE] in the program mode, and sends data of the selected memory cell directly to the output line in the simulation mode because [RE] is constant in this mode.

FIG. 39B shows a row decoder which selects a row address to be accessed based on addresses b, c regardless of the operation mode.

Next, operation of a combinational circuit as the basic function of AE is explained with reference to a signal waveform chart shown in FIG. 40. In this case, the case where A, B, C shown in FIG. 35 are respectively changed from (1, 0, 0) to (0, 0, 0) is explained.

Figure 40:
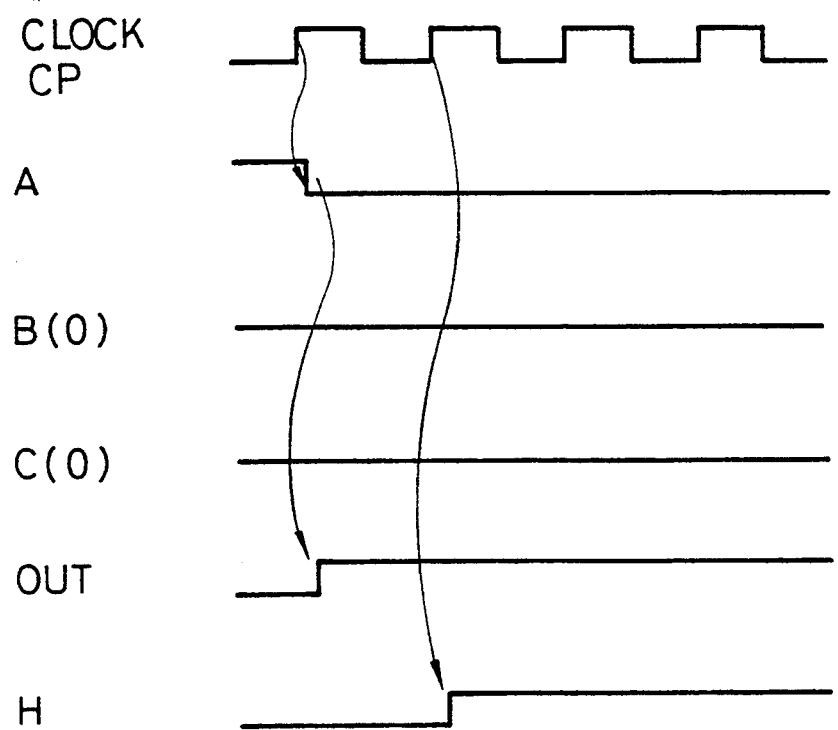
Figure 41:
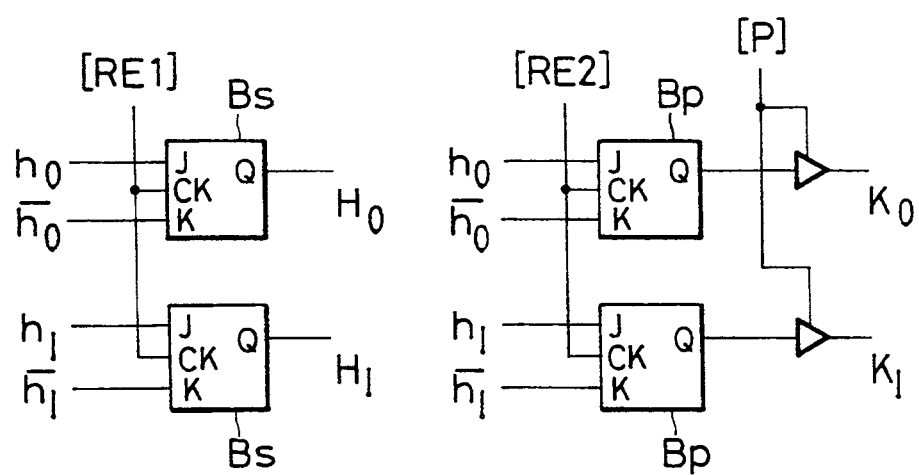

As shown in FIG. 40, when data is read out from the memory cell with respect to an address comprising A, B, C, the value stored in address "0" is processed. Namely, the logic "1" is outputted like OUT as the output data h0 or h1 shown in FIG. 36. By setting the output data h0 or h1 into the output buffer Bs shown in FIG. 41 at the timing of [RE1] shown in FIG. 15D, the output H0 or H1 can be obtained 1 clock late. Namely, the logic elements AE of this case realize a unit-delay logic circuit. Incidentally, the output K0 or K1 of the program mode is outputted onto a common bus.

Next, the DFF operation using a ternary signal is explained.

In the DFF operation, the rise of the clock input B does not only mean rise of bm but also include change from bl to bm or that from the logic "0" to "1". If bn or "u" would appear in this case, it becomes impossible to operate Flip-flops, and the system gets out of order.

Accordingly, It is not sufficient to observe only the change bm as in case of the binary signal, and it is necessary to observe the rise of bl as well as that of bm. As the result, the change from bn (undefined) to bm can be omitted.

Figure 42A:
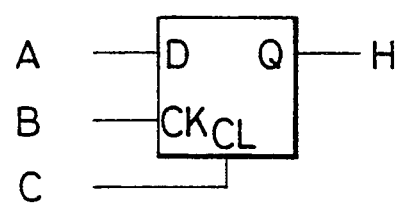
Figure 42B:
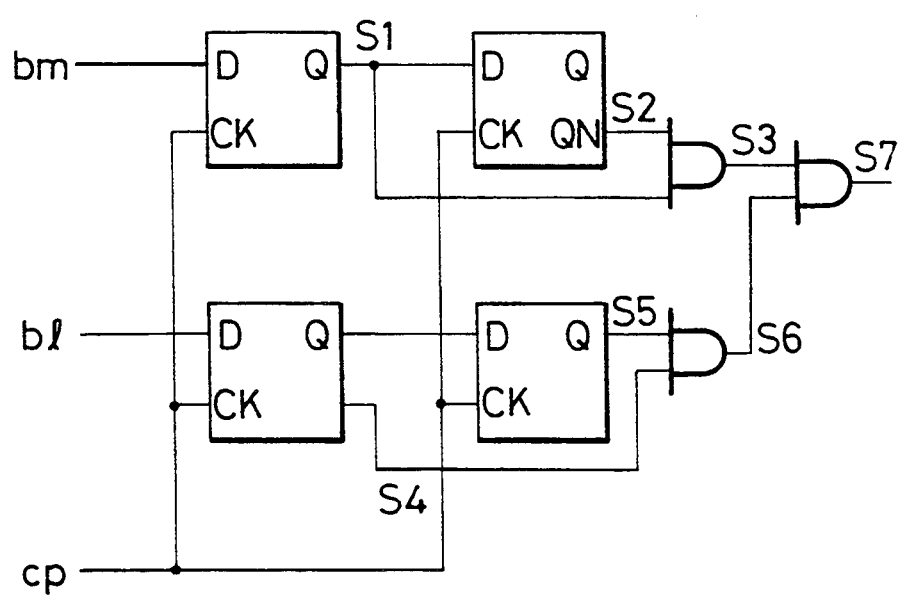
Figure 42C:
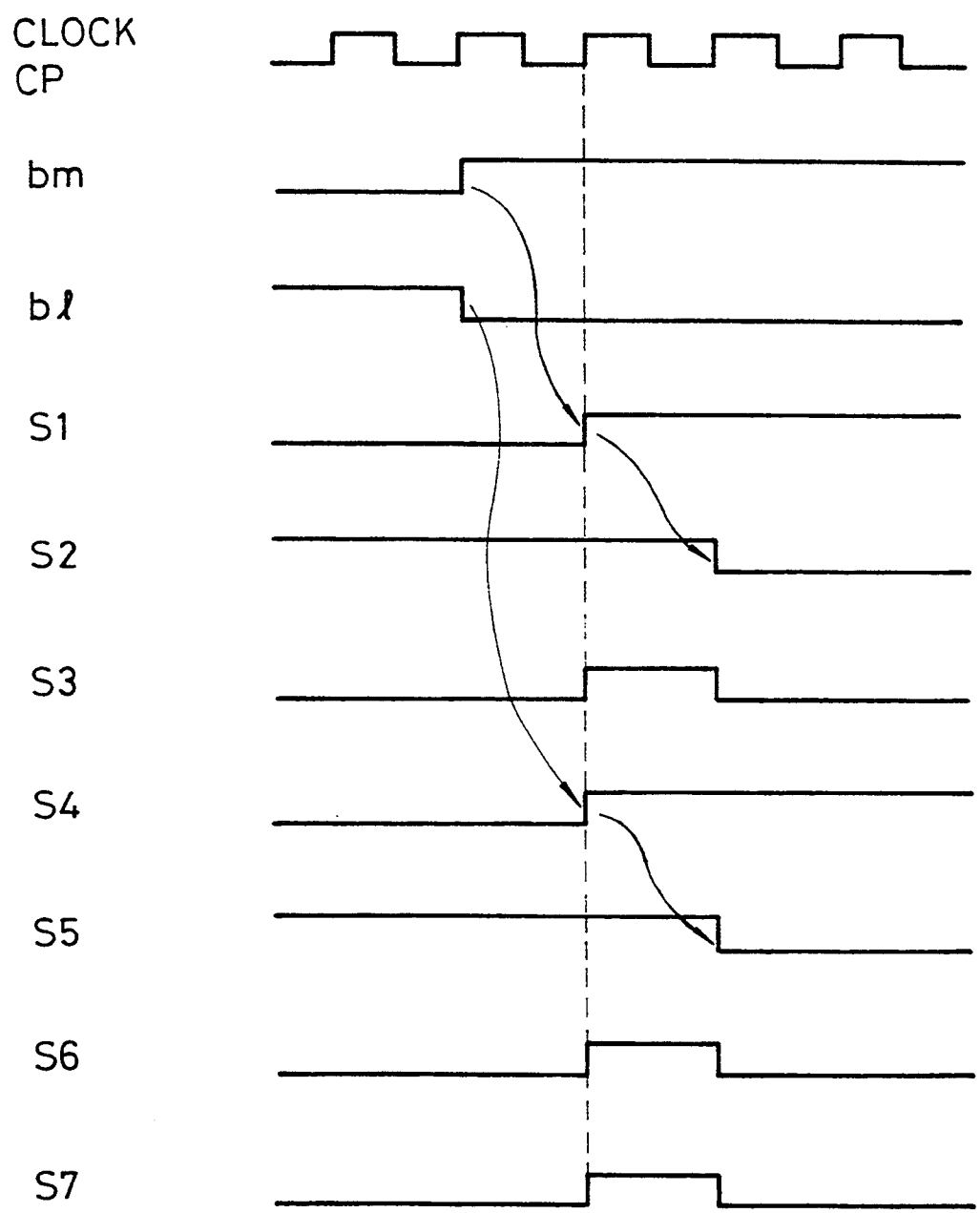
Figure 42D:
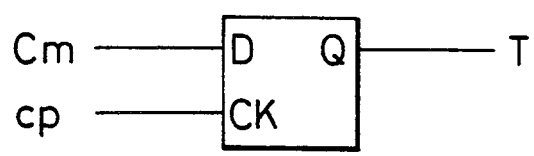
Figure 42E:
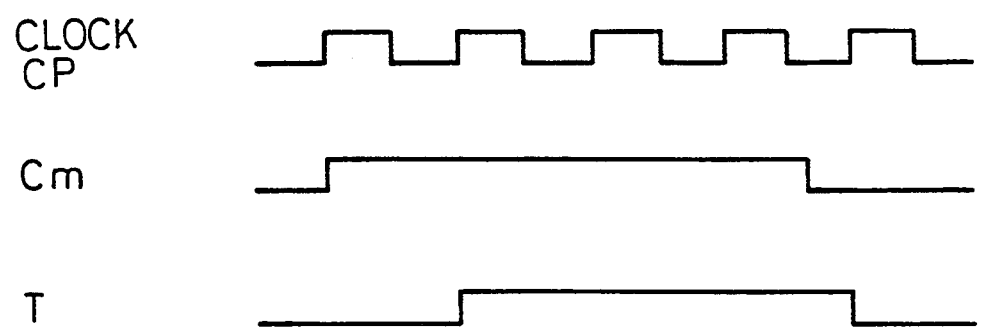

FIG. 42A shows a symbolic diagram of the DFF, FIG. 42B is a rise detection circuit for detecting rise of the signal B, FIG. 42C is an operation waveform chart of the detection circuit, FIG. 42D is a shaping circuit for shaping the reset signal C, and FIG. 42E is an operation waveform chart of the reset signal.

Based on the rise detection circuit and the operation waveform thereof, the rise signal of bm is shaped into a signal S1 by the clock CP. S2 is an inversion signal of a signal which delays one clock to the signal S1. Then, S3 is obtained as the logic product (AND) of S1 and S2. Likewise, also in case of the fall signal of b1, S4 is obtained by shaping and Inverting bl on the first stage. Then, S5 is produced by delaying S4 by one clock then inverting the resultant signal. Thereafter, S6 can be obtained by calculating AND of S4 and S5. Moreover, by calculating AND between S3 and S6, a signal S7 showing the rise from "0" to "1" of the signal B can be obtained. Incidentally, it is also possible to prepare a fall detection circuit in the same manner as in case of the rise detection circuit of FIG.42B. Moreover, these detection circuits are also applicable to the interruption generating circuit shown in FIG. 14.

The reset input signal C of DFF is effective when the value of C is "1" or in case of Cm=high regardless of the past state. Moreover, it is possible to always reset the signal C by the reset signal shaping circuit of FIG. 42D while the signal waveform of T shown in FIG. 42E is high.

In case of the DLATCH operation, the signals B, C are not restricted by the past record as in case of the reset signal in DFF. Therefore, with respect to the signal B, the value of A is outputted while bm is high. While, with respect to the signal C, the reset operation is carried out while Cm is high.

Figure 43:
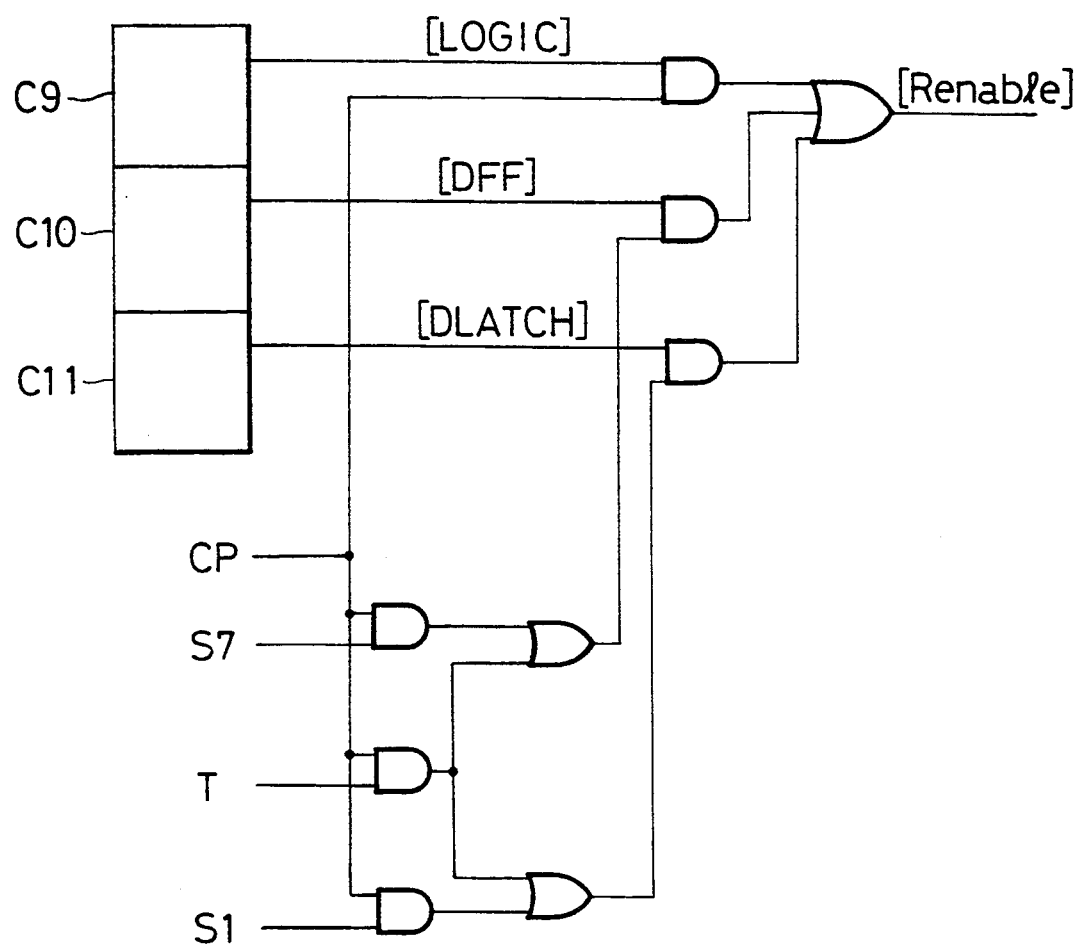

From the above result, by synchronizing the enable signal with the clock signal, the Renable circuit shown in FIG. 43 can be obtained. In the same drawing, S7, T, S1 are respectively the same as those shown in FIGS. 42C, 42E. Incidentally, in command registers C9 to C11 command signals [LOGIC], [DFF], [DLATCH] are stored respectively. Moreover, this Renable circuit corresponds to the circuit shown in FIG. 13A.

Incidentally, the control signals used in simulation, CP, M, SR, SC, [LOGIC], [DFF], [DLATCH] are all binary signals, while the input-output signals A, B, C, H are ternary signals. Among these ternary signals, the output signal H is outputted in parallel from the memory cell as the ternary signal h0 or h1.

In case of the program mode, ternary signals are respectively given from the outside of AE to the terminals U, V, W so as to supply the Enable signal X and read/write signal Y. As the result, data are read from the signal K in the read operation, and are written from the signal J in the write operation. Namely, H0, H1 are set in the output buffer Bs at the timing of [RE1] shown in FIG. 15D, while K0, K1 are set in the output buffer Bp at the timing of [RE2].

Moreover, in the program mode, by assigning an illegal address to command registers or status registers to be necessary in the simulation mode, it becomes possible to positively use the Illegal processing. As the result, the memory capacity can be Increased without increasing the address wiring. Moreover, in the simulation mode, the signal lines from the command registers or status registers are used independently of the simulation data, therefore they have no influence on the simulation operation. Namely, since the simulation cheek method with the illegal address is not damaged by the above reason, this method is practically very useful.

Figure 44:
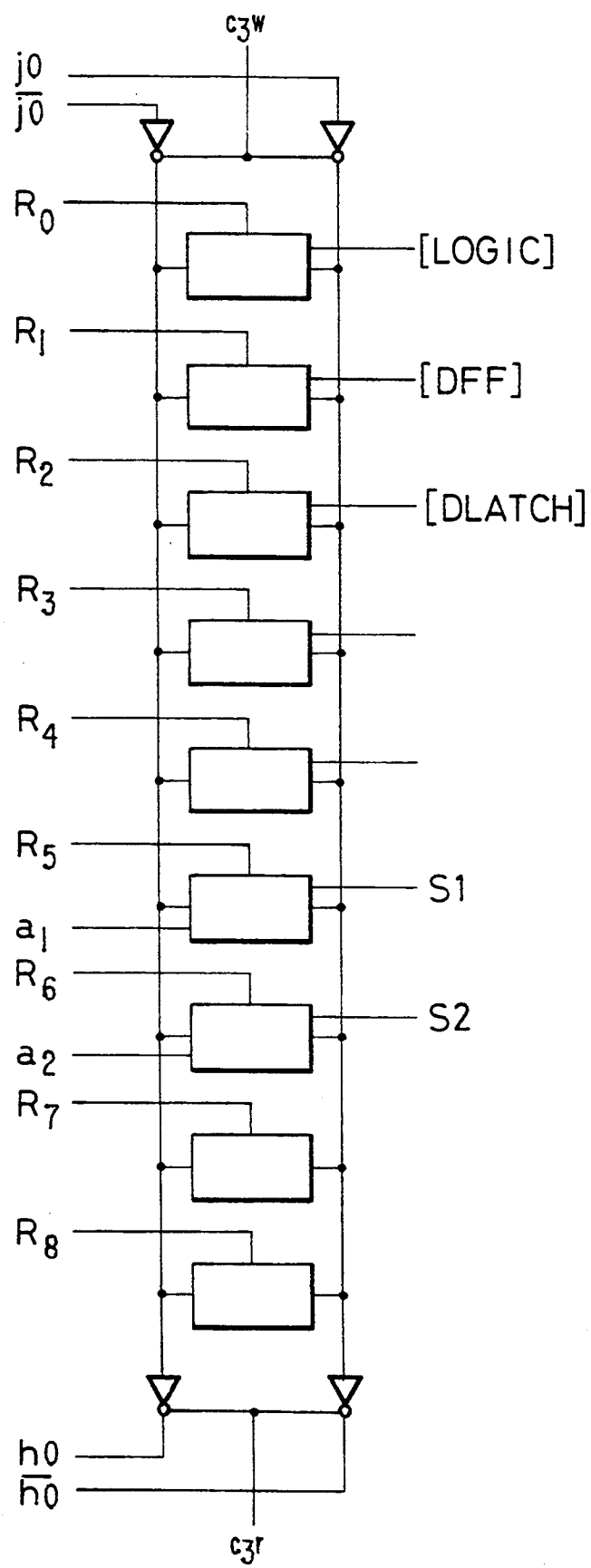

FIG. 44 shows command registers and status registers respectively provided in a memory cell array with an illegal address ae. Commands and status values to be stored are [LOGIC], [DFF], [DLATCH], [RISE], [FALL], and S1 (status corresponding to the [RISE] Interruption) and S2 (status corresponding to the [FALL] interruption).

In such a manner It becomes possible to realize a logic simulator using ternary signals only by adding a memory cell or control circuit into AE without increasing address signal lines at the outside of AE.

Application 6

The effect of the ternary simulation described in Application 5 is to use the signal "u" as an initial value of the memory system. For example, since no data are fixed until the write operation to the memory is executed, the signal "u" can be given to the memory as an initial value. Likewise, the signal "u" should be given to the command registers or status registers until a signal for setting the write operation appears.

However, there is no possibility of such a case that the signal "u" is supplied as the address signal, RW, Enable or Input data J. Therefore, in this application, interruption is generated as a design error if a ternary signal is detected In the part where only binary signals such as address signals, RW, Enable and data signal J, should be handled.

Incidentally, as a free running counter, there is a method in which the value of "u" is automatically eliminated with the lapse of some time without any initial clearing process after the system operation is started . Therefore, it is not preferred to make such a design that all of "u" should be detected as an error on the input side of memory elements because such a method is likely to restrict the design allowance. Accordingly, it is preferred to make It possible that the designer can freely select a suitable error detection function.

Figure 45:
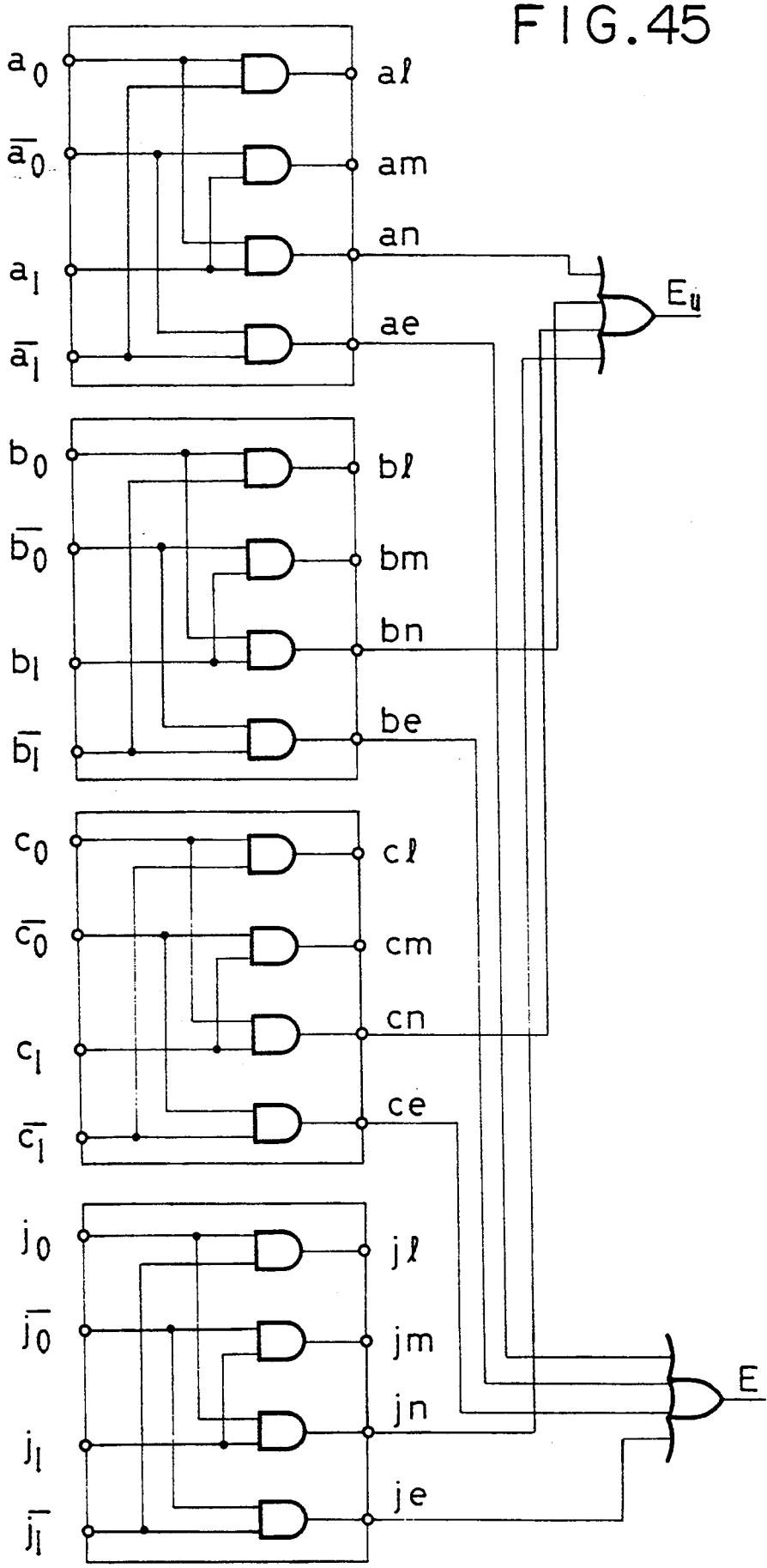
FIGS. 45 to 46 are circuit diagrams to show an application for error detection in case of the ternary simulator.

FIG. 45 shows a ternary-to-binary conversion circuit with an error detection function. As shown in the same drawing, this circuit comprises adding a ternary-to-binary conversion circuit for the input data J to the ternary-to-binary conversion circuit shown in FIG. 38, and further connecting an error detection circuit thereto.

In this case, the signal u is outputted from each n terminal of the ternary-to-binary conversion circuit, and the logic sum of these signals u is an error signal designated by Eu. Moreover, since each e output should not be existent in case of the ternary process, the logic sum of these e outputs is detected as an error signal E.

Figure 46:
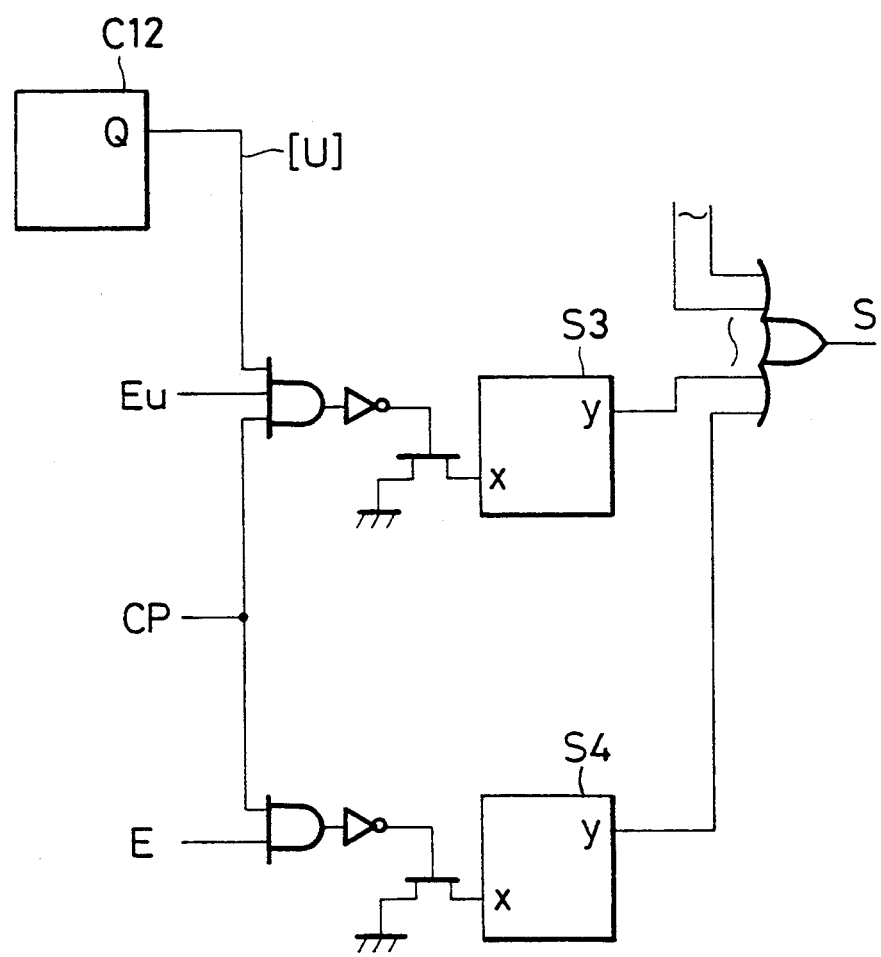

FIG. 46 shows an interruption signal generating circuit for generating an Interruption signal when an error is detected. In a command register 12, a selection signal [U] for selecting whether or not the interruption should be generated is stored. Outputs from status register S3, S4 are used for producing the logic sum with the outputs from the status registers S1, S2 shown in FIG. 14. If the error Eu or E is detected when [U] is designated in the command register 12, the status registers S3, S4 are set to generate an interruption signal S. Incidentally, the process continuing the error detection is completely left to the host computer 1, thus it includes the case where the error is not handled as an error.

This error detection function can be applied not only to the case where AE express a memory function but also to the case of the combinational circuit and the flip-flop.

As stated above, it is possible to generate interruption by detecting an error when a ternary signal appears in a part where only binary signals should be handled.

Application 7

As explained in Application 6, in case of regarding the signal u as an error, only 8 ($2^3$) words can be used in each AE because there are only 3 address signals A, B, C. However, in case of AE handling ternary signals, the memory capacity is 27 ($3^3$) words. Therefore, the scale of a circuit to be realized as a logic system can be increased in accordance with the increase of memory capacity by the ternary AE. Considering that each memory address is a binary number, this application proposes a method of utilizing a memory in which 16 ($2^4$) words (the largest value of those less than 27 words) can be used so as to realize a large capacity memory block.

Figure 47:
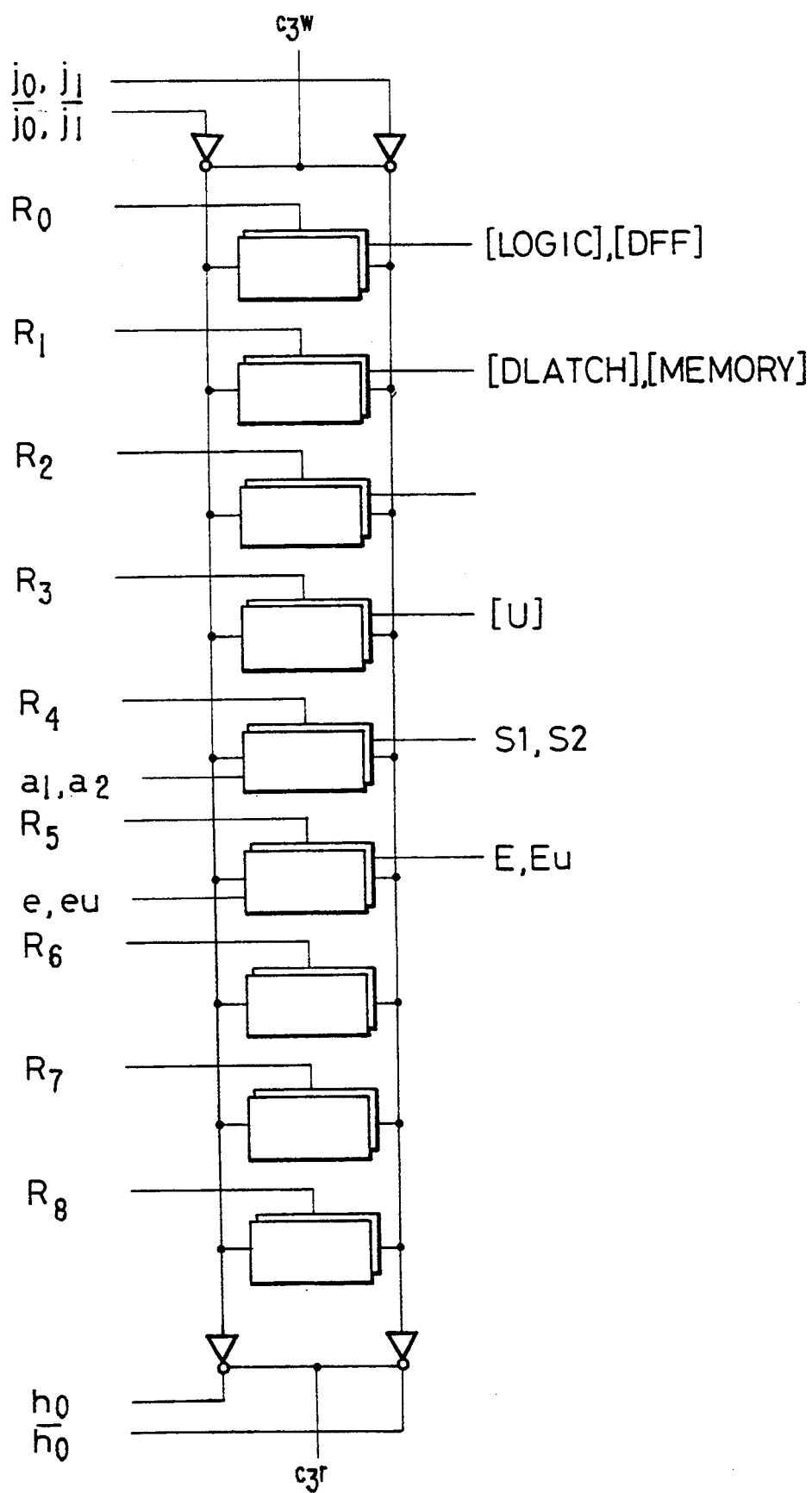

FIG. 47 shows command registers and status registers of AE. As shown in the same drawing, a command [MEMORY] for deciding the function of AE is newly added to [LOGIC], [DFF], [DLATCH], and a ternary error detection command [U] is added to the [RISE] and [FALL] interruption commands. Moreover, the ternary status Eu and error status E corresponding to (0, 0) error of hardware are added to the rise and fall status values S1, S2 respectively corresponding to [RISE], [FALL]. These command registers and status registers are respectively realized based on one word to 2 bits at the outside of the memory of 27 words (one word to 2 bits) shown In FIG. 36. Namely, in this case, 7 commands and 4 status values are assigned to one memory.

Figure 48:
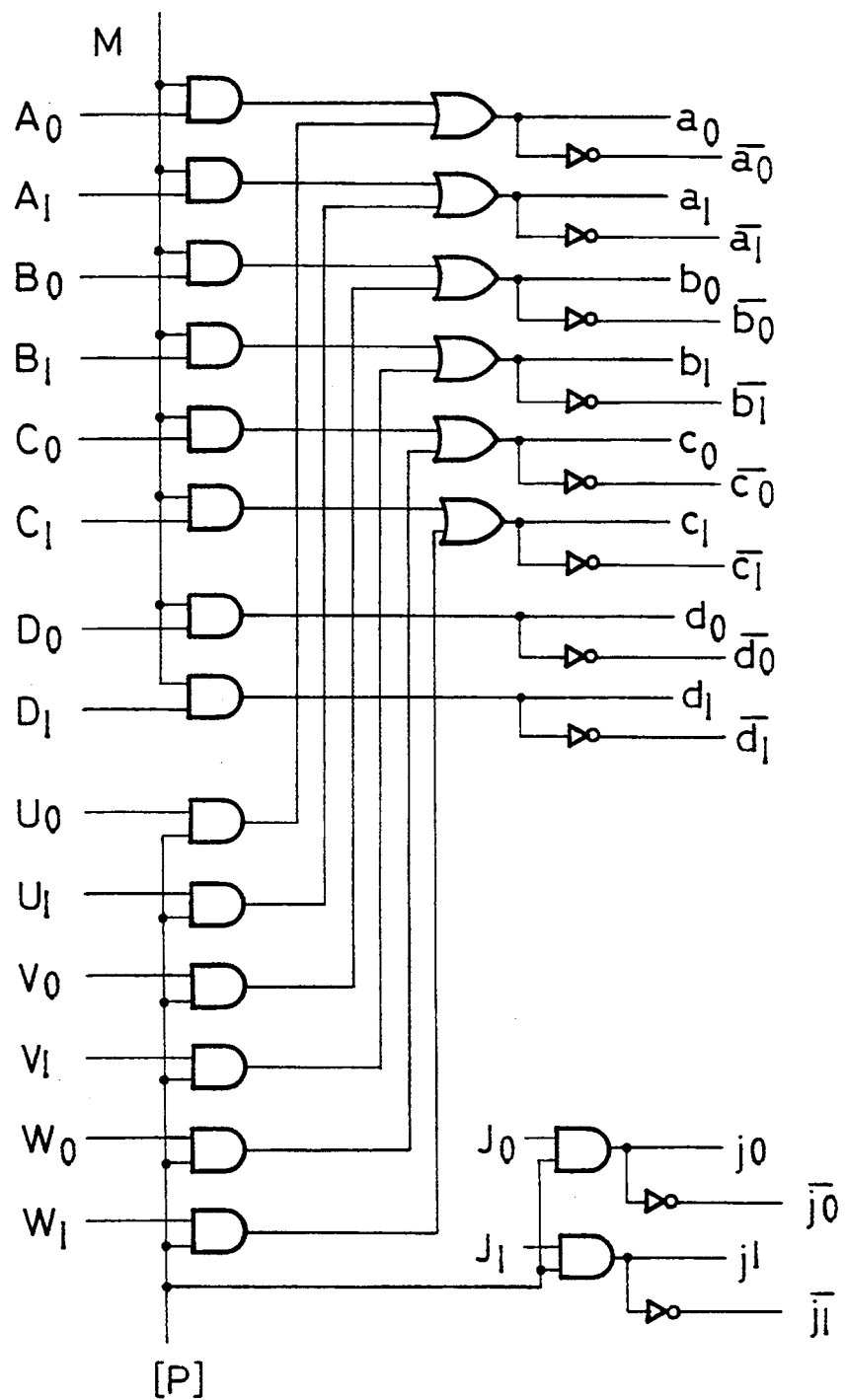

FIG. 48 shows an input buffer circuit and FIG. 49 shows a ternary-to-binary conversion circuit. In this case, the memory operation is executed by 4-input address signals in the simulation mode. Therefore, a new ternary-to-binary conversion circuits is added with respect to a new address signal D (D0, D1) and the signal D.

Figure 50A:
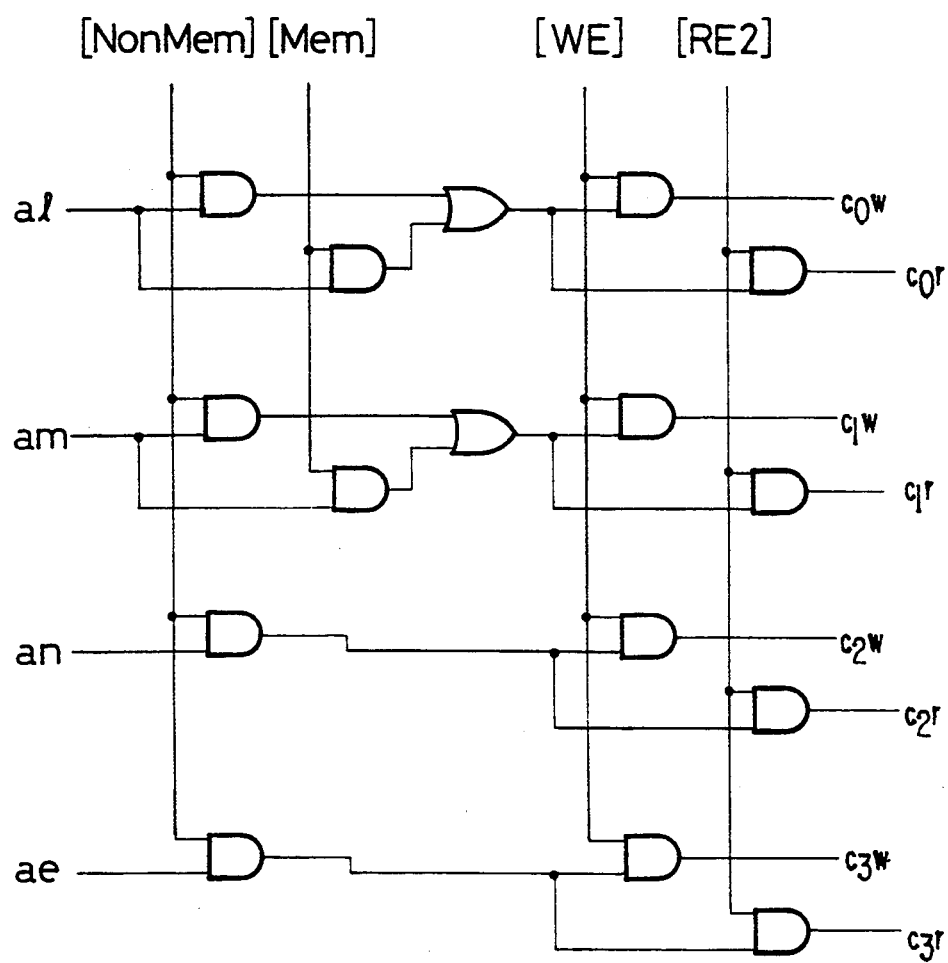
Figure 50B:
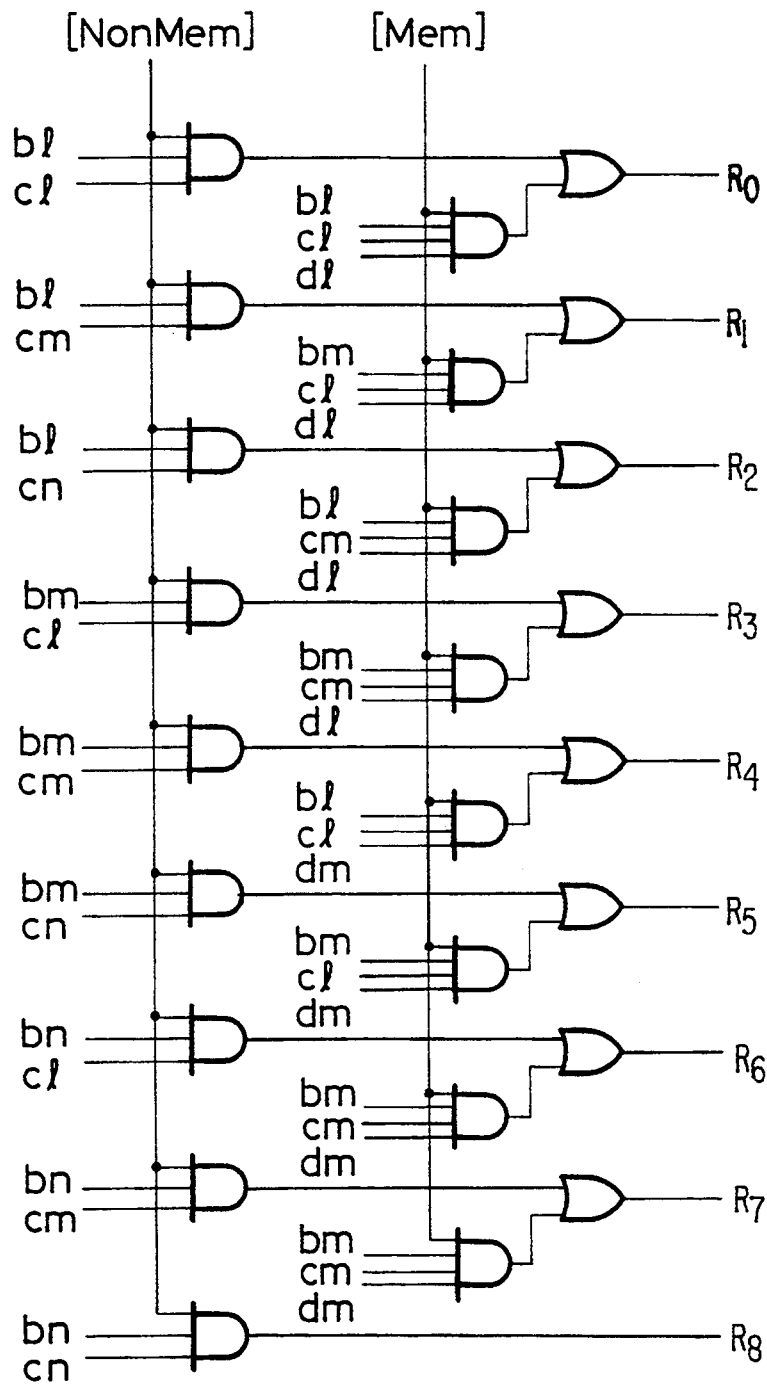

FIGS. 50A and 50B show a column address decode circuit and a row address decode circuit for these signals.

Figure 51:
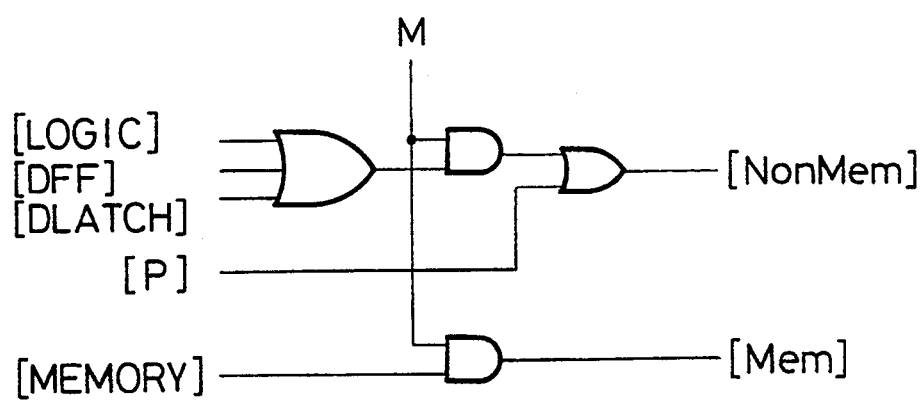

In these address decode circuits, signals [Mem] and [NonMem] are newly used in accordance with addition of the [MEMORY] command. As shown in FIG. 51, these signals [Mem] and [NonMem] are respectively produced from the output signals [LOGIC], [DFF], [DLATCH], [MEMORY] from the respective command registers and [P] for designating the program mode.

The signal [Mem] is high when each AE is used as a memory, while [NonMem] is high in case of [LOGIC], [DFF], DLATCH] in the simulation mode or in case of the program mode. Moreover, the memory cell array is handled as a binary signal system in the mode of [Mem], while as a ternary system in the mode of [NonMem]. As seen from FIGS. 50A, 50B, only 16 words of the above-mentioned 27 words are accessed in the mode of [Mem], while all of the 27 words are accessed in [NonMem].

Figure 52:
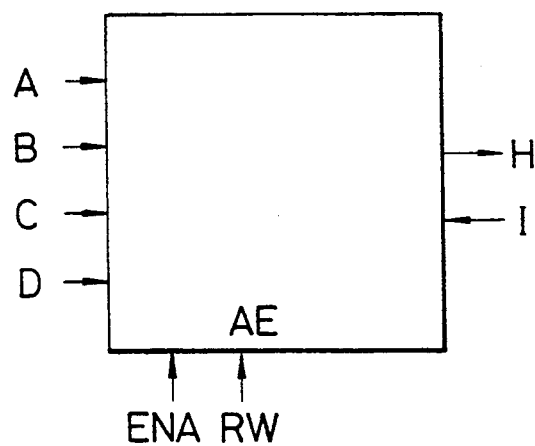

FIG. 52 shows signals to be inputted or outputted in the simulation mode.

Figure 53:
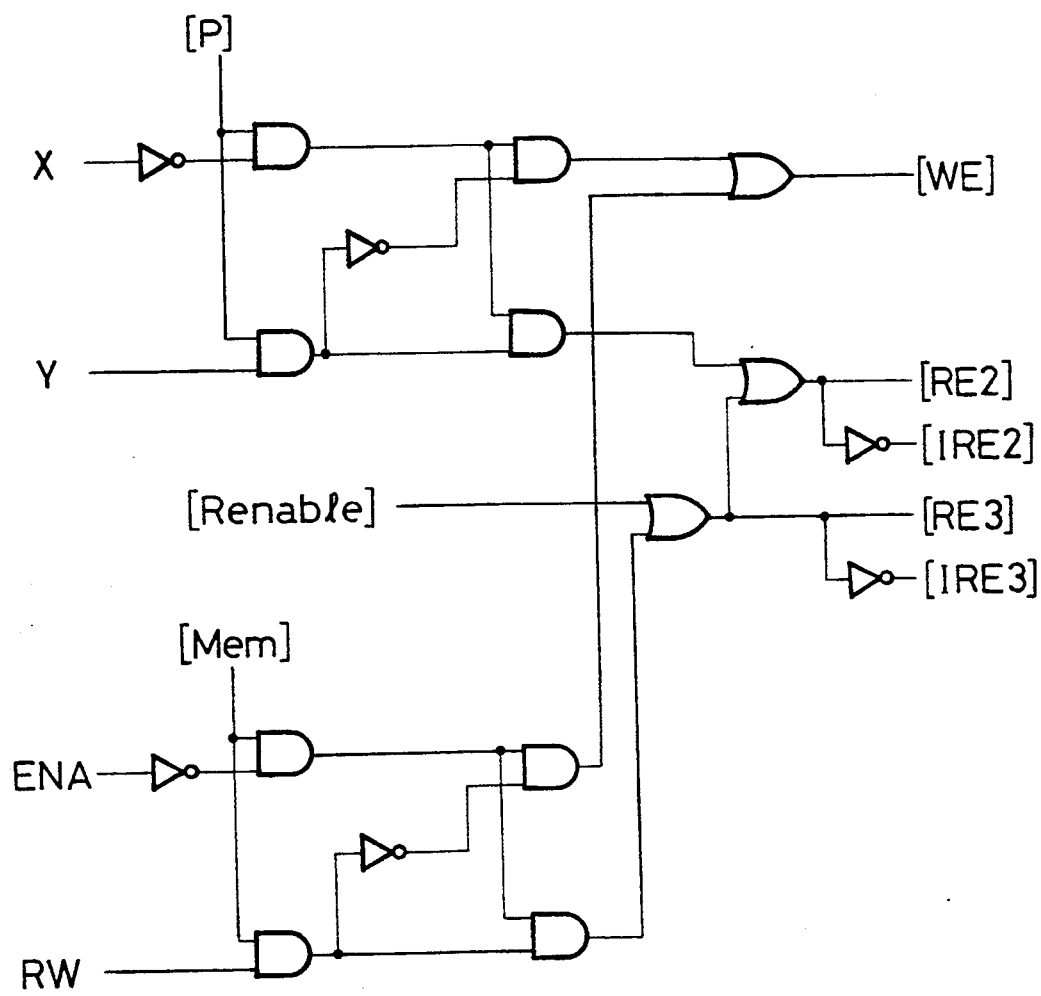

As shown in the same drawing, when AE is used as a memory, the read or write operation is carried out in accordance with ENA, RE signals. Therefore, enable signals are respectively prepared for both of the program mode and simulation mode by an Enable signal generating circuit shown in FIG. 53. In FIG. 53, a signal [Renable] is produced by the circuit shown in FIG. 43.

Namely, it becomes possible to increase the memory capacity of AE by increasing a simple circuit.

As stated above, according to the logic simulator as the first embodiment of the present invention, it is possible to realize a logic function by a logic element constructed with memory cells. Moreover, the logic elements respectively having independent logic functions can be optionally connected or disconnected by the connection elements each having an ON/OFF switch formed on each signal line provided between the logic elements. Namely, a simulation circuit can be constructed with imaginary hardware. As the result, the logic elements can be operated in parallel. Moreover, this simulator can avoid the restriction on processing speed which has been necessarily generated in the simulation process depending on the conventional software technology. For the above reasons, the simulation speed can be markedly increased by the logic simulator of this invention.

Besides, it is possible to generate interruption from an optional logic element. Further, when interruption occurs from a logic element in the simulation mode, it is possible to process the interruption with holding output obtained in the simulation by the time. Therefore, it is not necessary to repeat the simulation again from the first stage after processing the interruption, but it is possible to restart it from the stage when the interruption occurred. As the result, it becomes possible to carry out logic simulation more easily at higher speed than before.

Next, another logic simulator as the second embodiment according to the present invention is described.

The difference in the second embodiment from the above-described first embodiment is that the logic element of the logic function section for expressing each part of a logic circuit is realized with a PLA instead of memory cell array.

Namely, the logic element comprises a programmable logic array (PLA) which is so constructed that each logic corresponding to input signals is developed into an AND plane, then the output of the AND plane is selectively transferred through an OR plane in accordance with information stored in advance in memory means in response to truth values of a logic circuit to be realized. As the result, a combinational circuit or flip-flop can be expressed as a unit-delay circuit by temporarily memorizing the output of the PLA in accordance with control information.

Incidentally, since the other construction in the second embodiment is the same as in the first embodiment, the explanation is not given here. Therefore, the construction relating to the PLA that is the most important point of the second embodiment is mainly explained hereinafter.

Figure 54A:
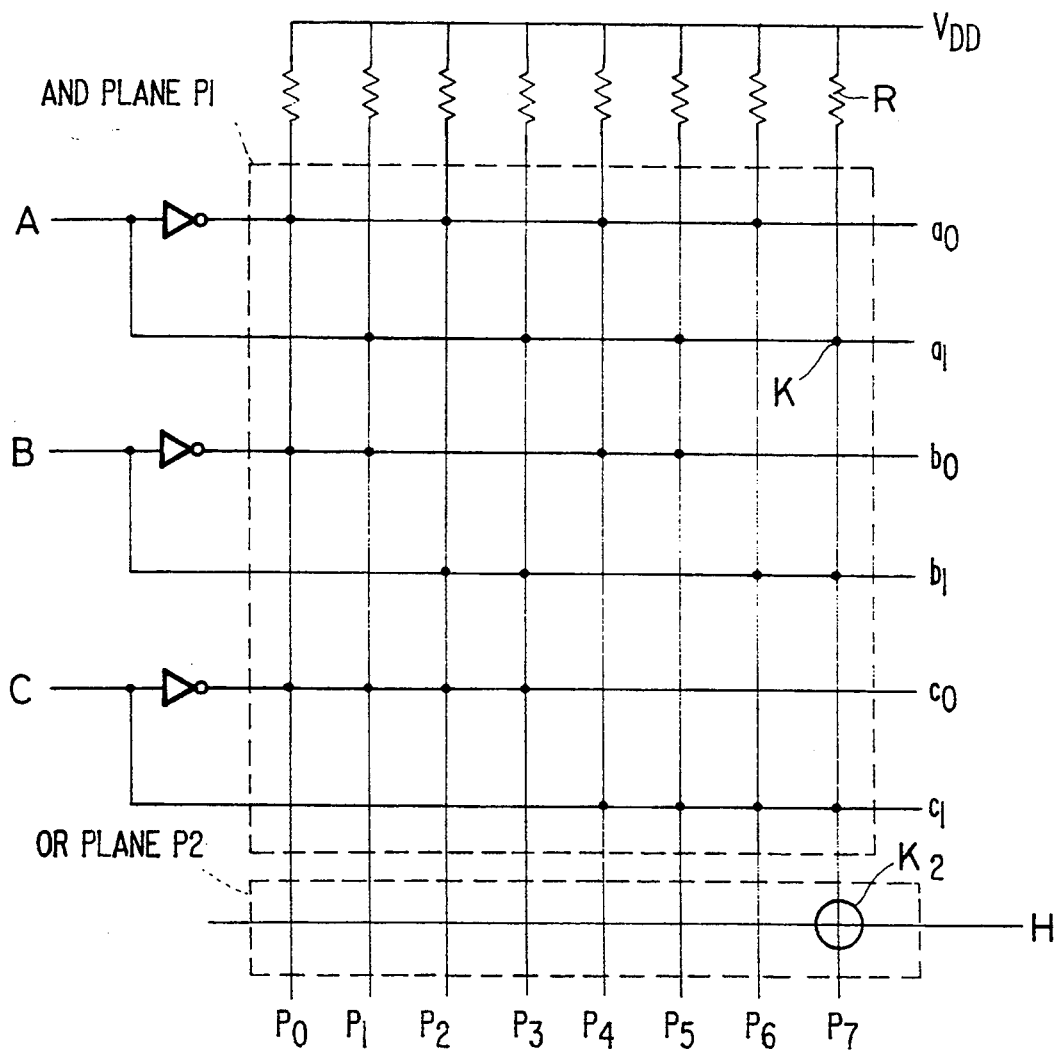
Figure 54B:
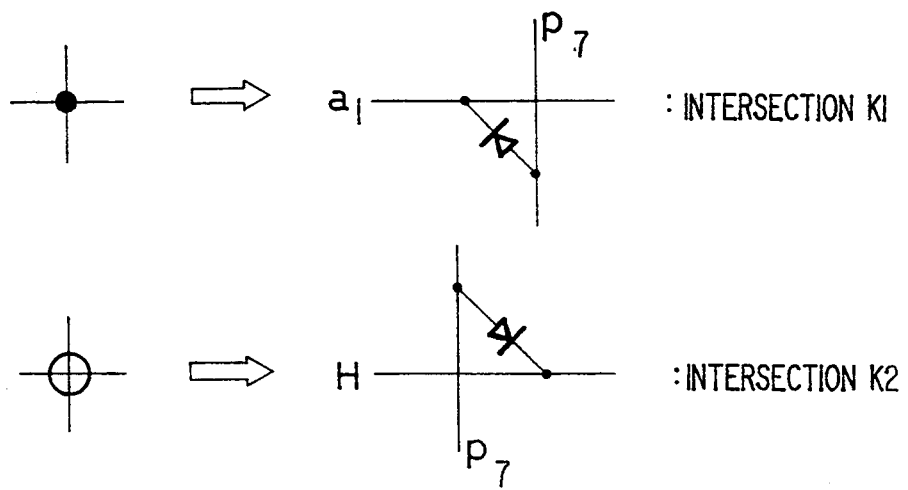

FIGS. 54A and 54B respectively show construction of a logic element AE in which a combinational circuit AND based on 3 inputs (A, B, C) and 1 output (H) is constructed with a programmable logic array (PLA). While, FIGS. 54C shows the truth table to explain the logic circuit shown in FIG. 54A.

As shown in FIGS. 54, the input signals A, B, C and the respective inversion signals thereof are given to an AND plane P1. For example, when A is 0 (low), a0 is 1 (high) and a1 is 0 (low). While, when A is 1 (high), a0 is 0 (low) and a1 is 1 (high).

With respect to relation between signal lines a0, a1, ..., c1 and internal signal lines p0, p1 ..., p7 in the AND plane P1, these are connected at each point designated by , for example, at a point K1, a1 is connected to p7 with a diode in the reverse direction. While, at each point not designated by (for example the intersection of a0 and p7), the respective signal lines are not connected to each other.

On the other hand, in an OR plane P2, the signal lines are connected to each other at each point (for example K2) designated by , with a diode in the forward direction, while these are not connected at each point not designated by .

Next, when A, B, C are all 1 (high) for the logic function H=AND (A, B, C), operation in which the output signal H is explained.

In case of this logic circuit, since only the connection point K2 of the OR plane relates to the output line, p0, p1, ... p6 of the internal signal lines in the PLA seem to be all unnecessary for the AND circuit construction. However, it is necessary to explain them later for another purpose.

When A is 1 (high), a1 also becomes high at the point K1 shown in FIG. 54a. Therefore, the current supplied from a power source VDD through a resistor R does not flow from p7 to a1. On the contrary, a1 is low when A is 0 (low). Therefore, the current is supplied from p7 to a1, so that the internal signal line p7 becomes low. Then, the currents to be supplied from p7 to a1, b1, c1 are all cut off only when A, B, C are all 1 (high). As the result, p7 becomes high. Moreover, since the diode provided at the point K2 is placed in the forward direction, the output H is always high when p7 is high.

Namely, since p7 becomes high only when A, B, C are all 1 (high), the logic circuit shown in FIG. 54A can realize:

H=AND (A, B, C).

Accordingly, in the logic circuit shown in FIGS. 54:
p0 becomes high only when A=0, B=0, C=0,
p1 becomes high only when A=1, B=0, C=0,
p2 becomes high only when A=0, B=1, C=0,
p3 becomes high only when A=1, B=1, C=0,
p4 becomes high only when A=0, B=0, C=1,
p5 becomes high only when A=1, B=0, C=1,
p6 becomes high only when A=0, B=1, C=1,
p7 becomes high only when A=1, B=1, C=1.

Figure 56:
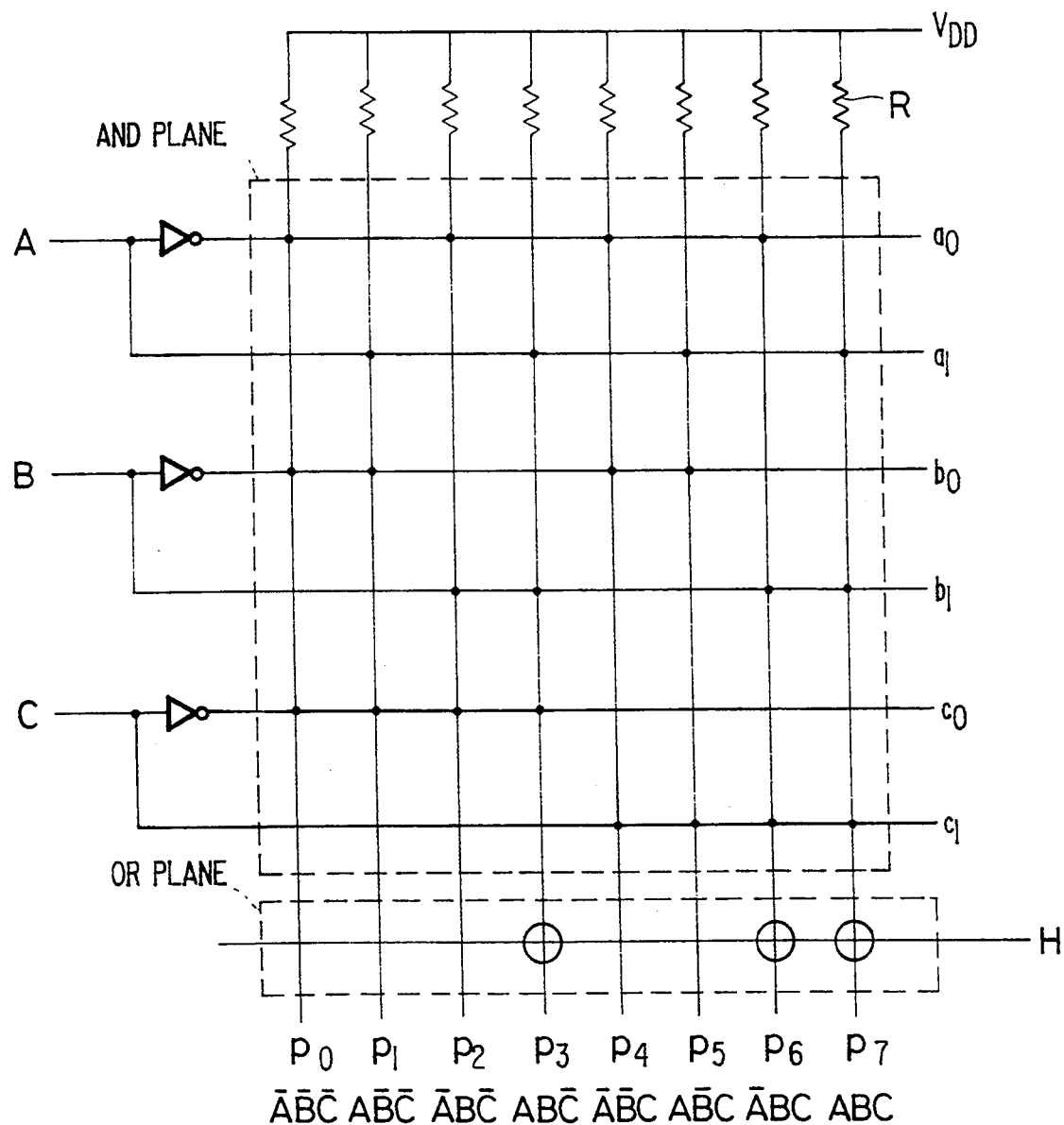
FIG. 56 is a diagram to show construction of a logic circuit based on the PLA.

As the result, each logic function of the binary 3-input-1-output combinational circuit can be optionally realized by suitably selecting a combination of these internal signal lines p0, p1, ..., p7. For example, a logic function designated by H=AB+BC can be realized by connecting H to p0, p1, , p7 as shown in FIG. 56 based on a truth-value table shown in FIG. 55. Incidentally, in FIG. 56, each logic term corresponding to these internal signal lines is shown below each of the reference characters p0, p1, , p7.

As stated above, an optional 3-input-1-output combination logic circuit can be realized by a circuit as shown in FIG. 57. Namely, as shown in FIG. 57, the AND plane is constructed with fixed connections. While, in the OR plane, memory elements M0, M1 ..., M7 and switches S0, S1, ..., S7 are prepared on the respective intersections between the output line H and internal signal lines p0, p1, , p7. In this case, each switch S is closed when the corresponding memory element M is 1 so as to realize OR connection.

In such construction, when an optional logic circuit to be realized is given, the logic is expressed with a truth-table, then each memory Mi corresponding to each internal signal line p for setting the output line H high is set at "1", thereby to realize the OR connection.

In this case, these memories M0 to M7 are constructed with shift registers respectively. Moreover, each memory M1 gives data from the outside through one data line in accordance with a clock signal in the program mode, while functions only as a memory in the simulation mode as shown in FIG. 57. As the result, the construction can be simplified.

Moreover, if it is possible to realize a DFF (D-type flip-flop) or a DLATCH (D-type latch circuit) with this new-type logic element, the logic element can be completely equivalent to that used in the first embodiment. Next, the method of realizing DFF or DLATCH with this new-type logic element is explained.

Figure 58A:
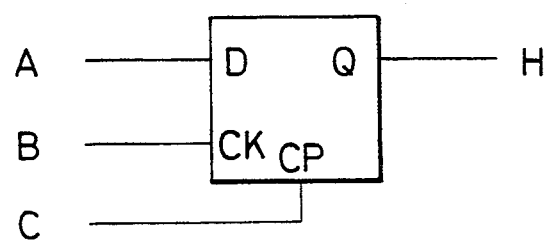
Figure 58B:
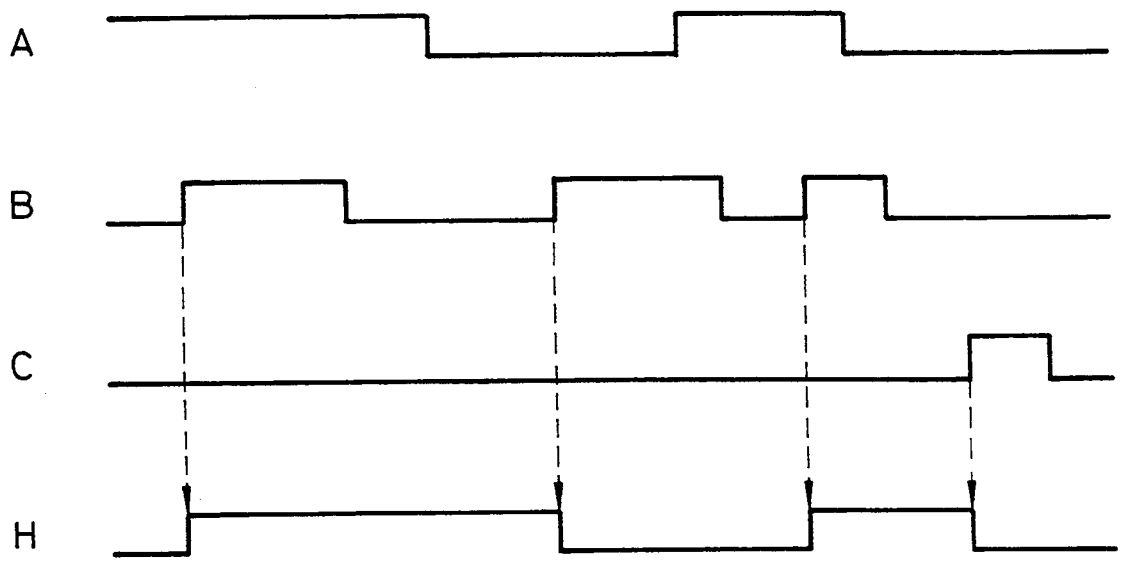

FIGS. 58 show a DFF circuit and its operation waveform respectively. In the same drawings, when the signal C is low (or not reset), the value of input signal A is shifted to the output H of DFF on the rise of signal B. On the other hand, when C is high (reset), the output H is compulsorily set low regardless of the signal values of A and B.

FIG. 59 shows a truth table concerning DFF shown in FIG. 58. In FIG. 59, a mark ** corresponding to the state where the signal B is 1 (high) shows the rise point of B.

On the other hand, in the state designated by a mark * where the signal B is 0 (low), the DFF operation is not carried out in the actual circuit. Therefore, the output H can be expressed with any values, however, it is denoted with "0" here. Moreover, the state designated by a mark *** where the signal C is 1 (high) corresponds to the reset operation state of DFF.

Figure 60A:
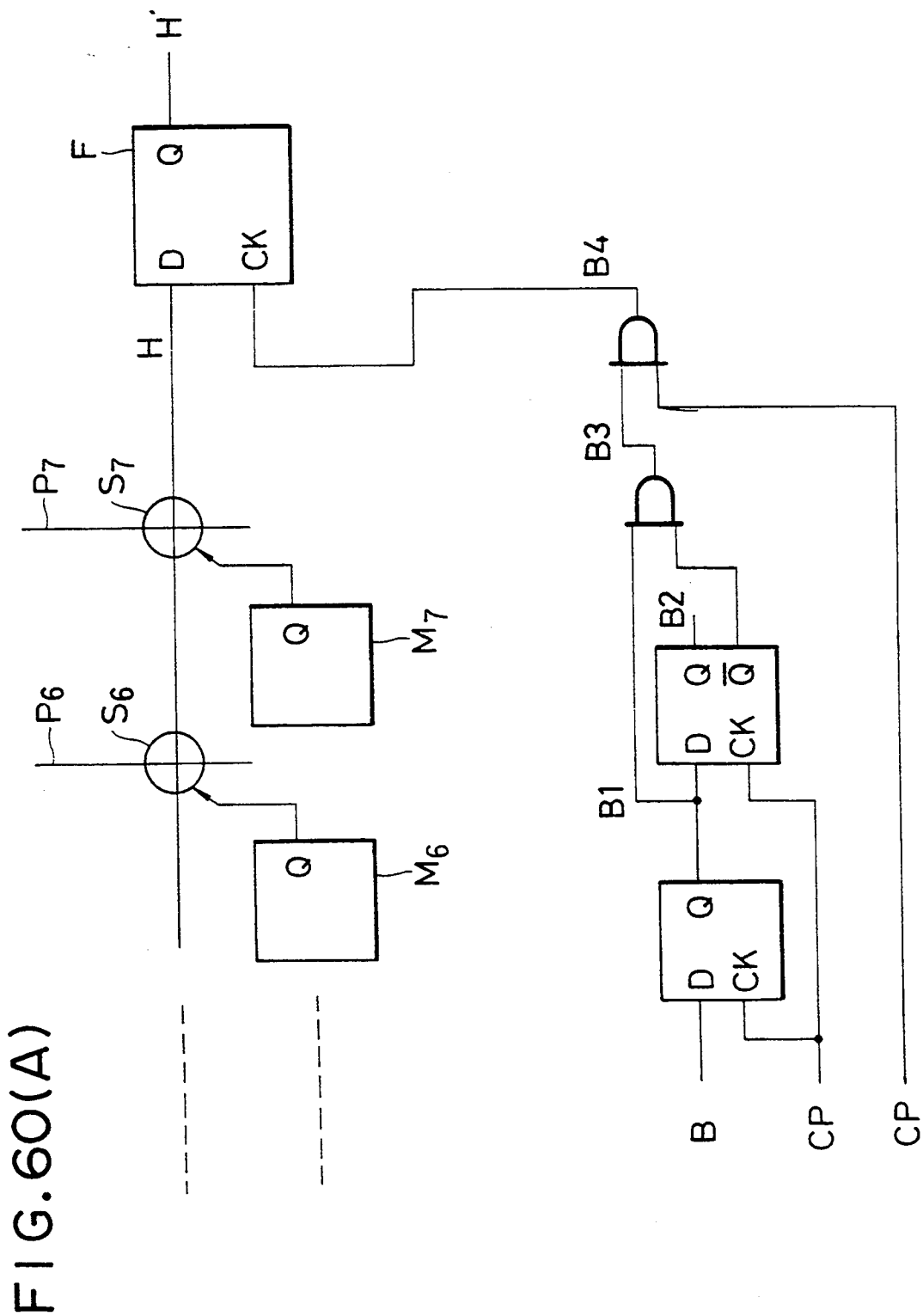
FIGS. 60A and 60B respectively show a constructional diagram and an operation waveform chart of a combination of a detection circuit and a holding circuit.

In order to give such a function to the logic element, it is necessary to provide therein a rise detection circuit for detecting the rise of signal B, and a hold circuit for holding the output H until the next change of signal B after the signal A is shifted to the output of DFF on the rise of signal B. FIG. 60A show a partial circuit diagram comprising the detection circuit and the hold circuit, and FIG. 60B shows a waveform chart of the circuit.

Figure 60B:
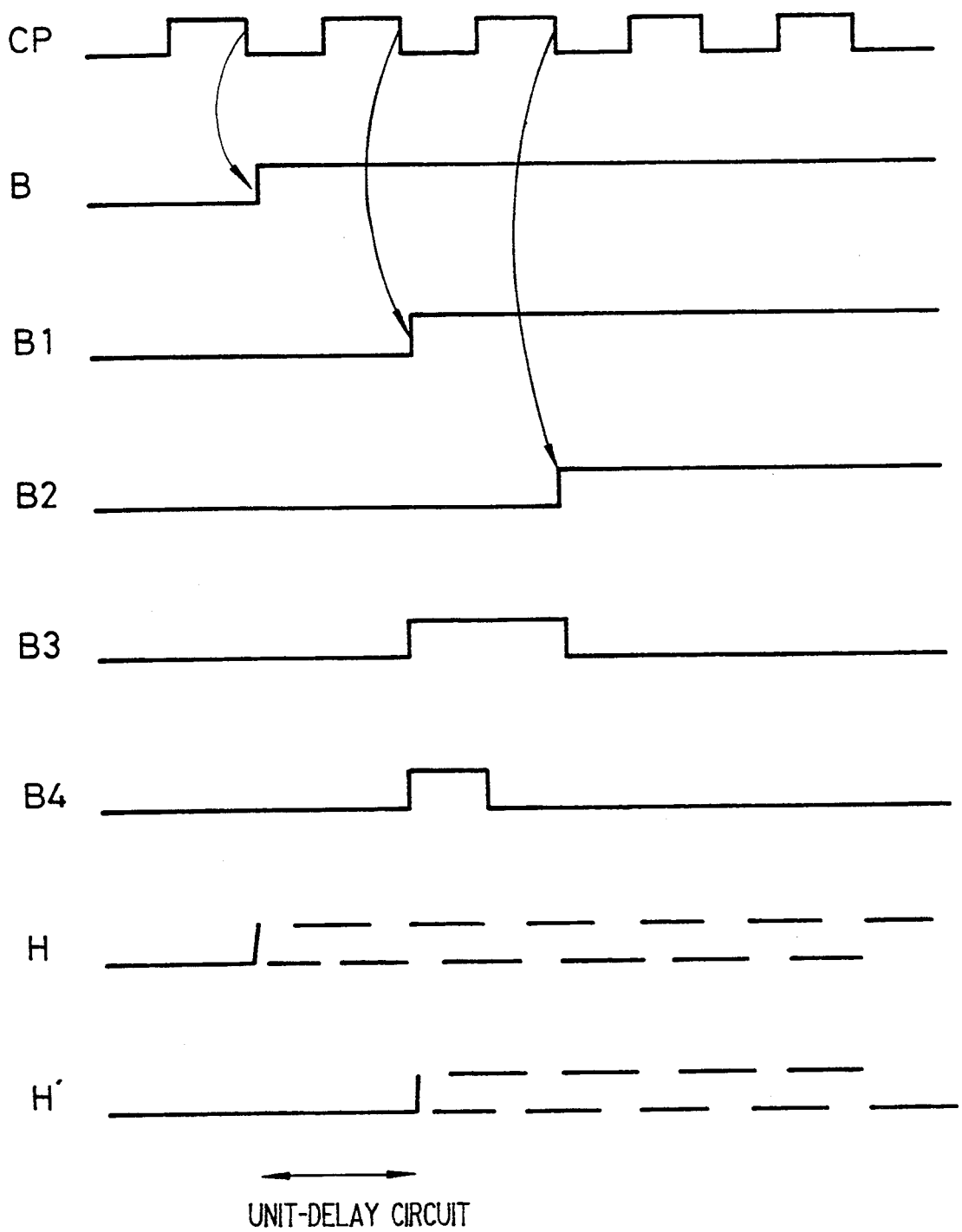

In FIGS. 60A and 60B, B1 designates a signal to be produced when the input signal B is supplied to the DFF in accordance with the system clock CP. Since the input signal B is synchronized with the clock as output from the logic element on the previous stage, the signal B1 delays 1 clock as compared with the signal B. A signal B2 is produced by delaying the signal B1 by one clock. Moreover, B4 shows a signal produced with the signals B1, B2 and clock CP. In such a case, if a hold circuit F holds the output H until the signal B4, the unit delay can be realized between the input signal B and the corresponding output signal H'.

On the other hand, in the reset operation, a reset signal being always outputted while C1 shaped from the signal C is 1 is given to the hold circuit F.

In case of DLATCH, 1 is set as the output H in a memory Mi corresponding to the program mode based on a truth shown in FIG. 61, thereafter, the output is held while both signals B, C shaped in the simulation mode are high.

Figure 62:
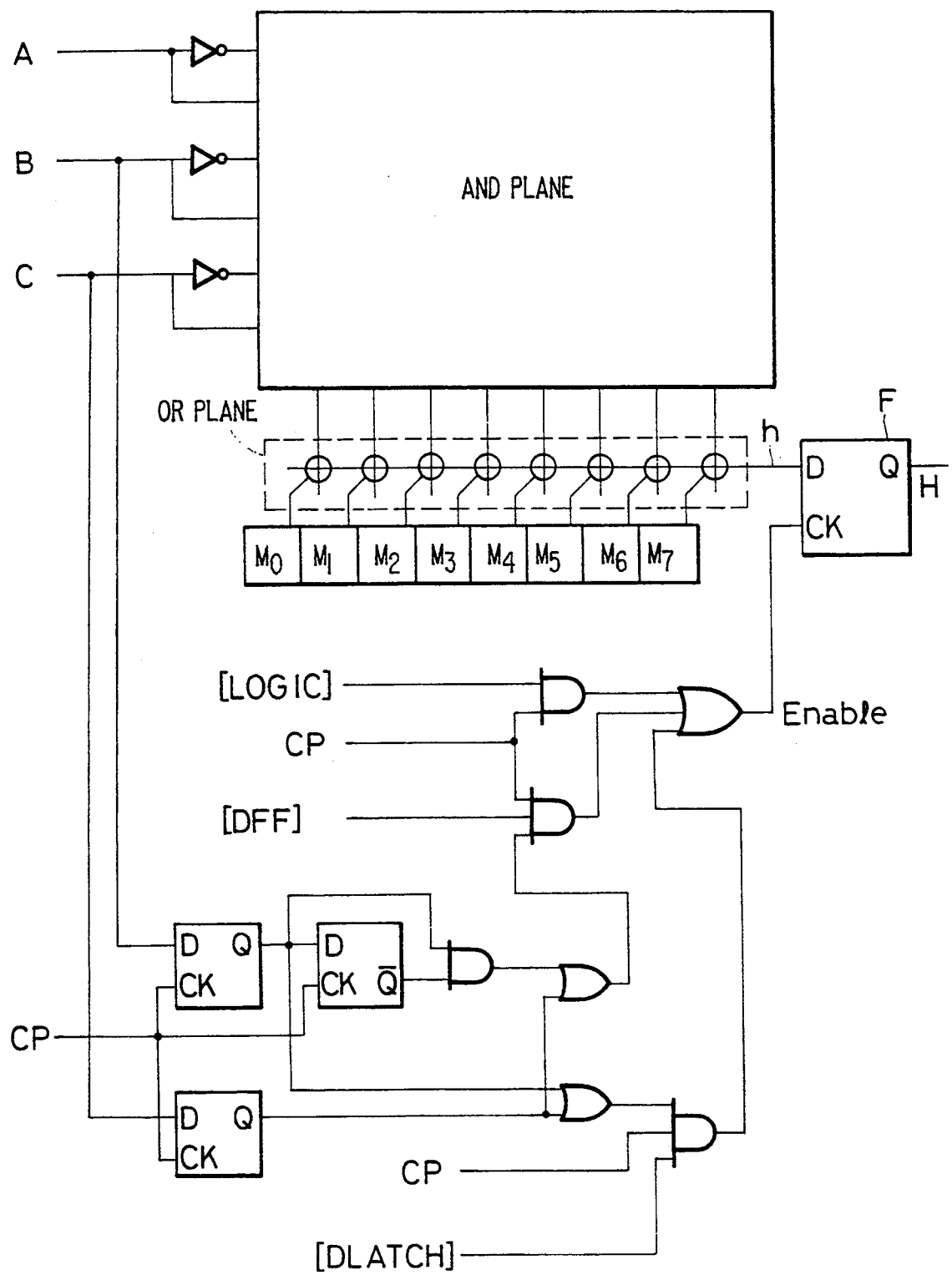

FIG. 62 shows construction of the hold circuit F and a circuit for generating a signal Enable for indicating the hold timing to which [LOGIC], [DFF], [DLATCH] are given as command signals.

Incidentally, in case of [LOGIC], the output of the hold circuit can be used as the output of the logic element if it is always held and unit-delay is given thereto. Therefore, the output of the hold circuit is used as the output H of the logic element.

Accordingly, this logic element can realize any one of [LOGIC], [DFF], [DLATCH] designated in advance in the simulation mode.

Next, the program mode is explained.

Figure 63:
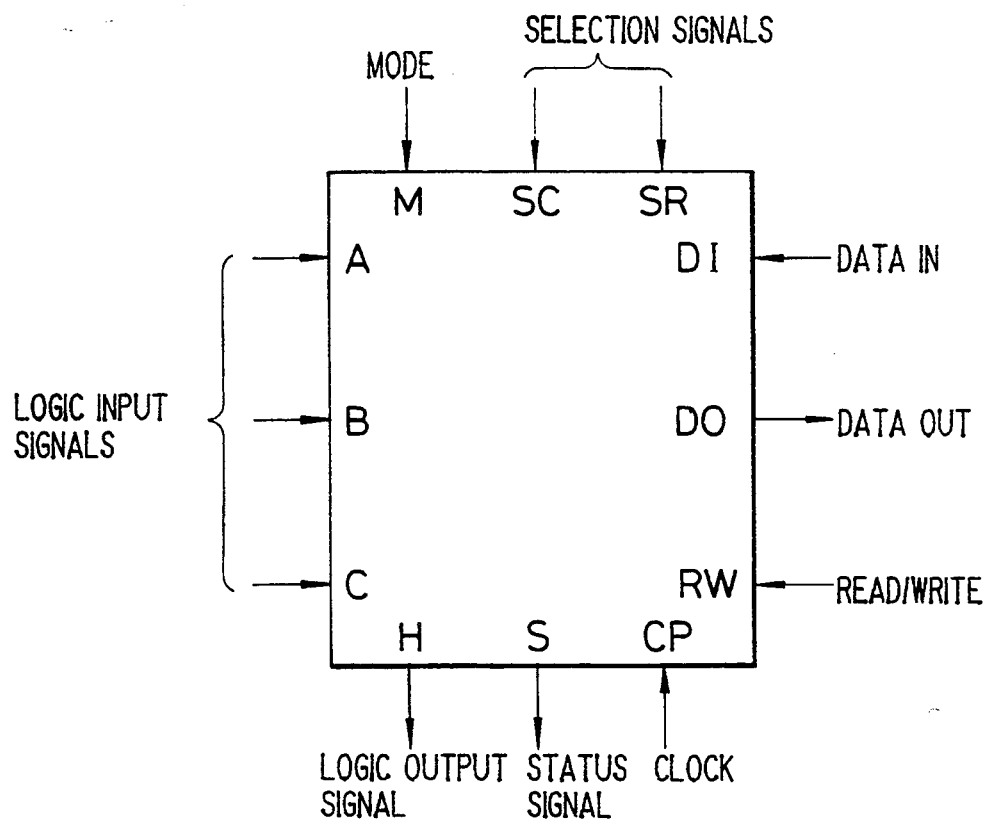

FIG. 63 shows respective external terminals of the logic element.

In the same drawing, the terminals used in the simulation mode are:
A, B, C for the logic signal input, and
H for the logic signal output.
While, the terminals used in the program mode are:
SC, SR for logic element selection signals (for designating each row and column),
RW for read (high)/write (low), and
D1, D0 for data in and data out.
Moreover, the terminals used for common signals are:
CP for designating the clock,
M for designating the mode (simulation mode: high, program mode: low), and
S for the status signal.

Since the signal terminals A, B, C used in the simulation mode are variably connected to the system based on the netlist construction, while the other terminals are connected fixedly.

Figure 64:
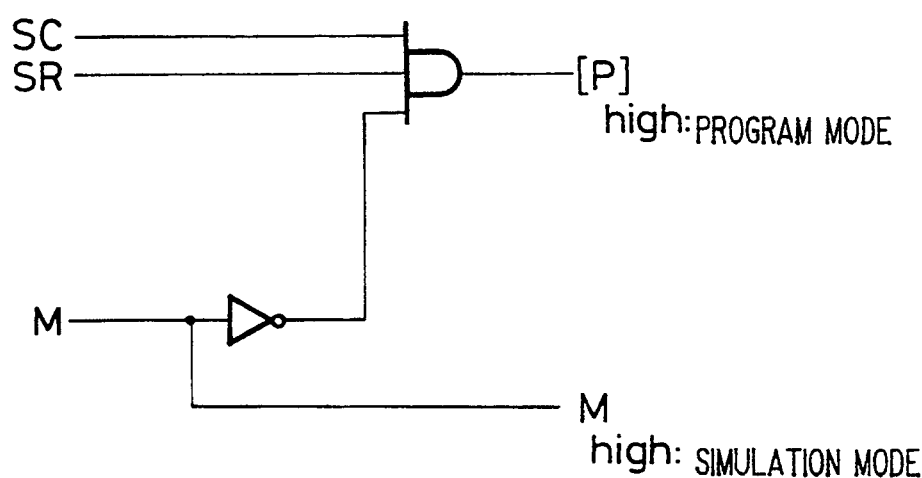

FIG. 64 shows construction of a circuit for generating a control signal used in the logic element.

In the same drawing, since only one logic element selected by the logic element selection signals gives and receives data to the host computer 1 in the program mode, a signal comprising the logic product (AND) of the program mode M (low) and the row and column selection signals is used as an internal program mode signal [P] of the logic element. Accordingly, only the logic element in which the signal P is high is operated. While in the simulation mode, all logic elements are operated at the same time. Thus, the mode M (high) must be effective to all of the logic elements. Therefore, to execute simulation in accordance with the control signal, it is necessary to store in advance the above-described command signals and logic truth-values in each memory Mi in the program mode.

Figure 65:
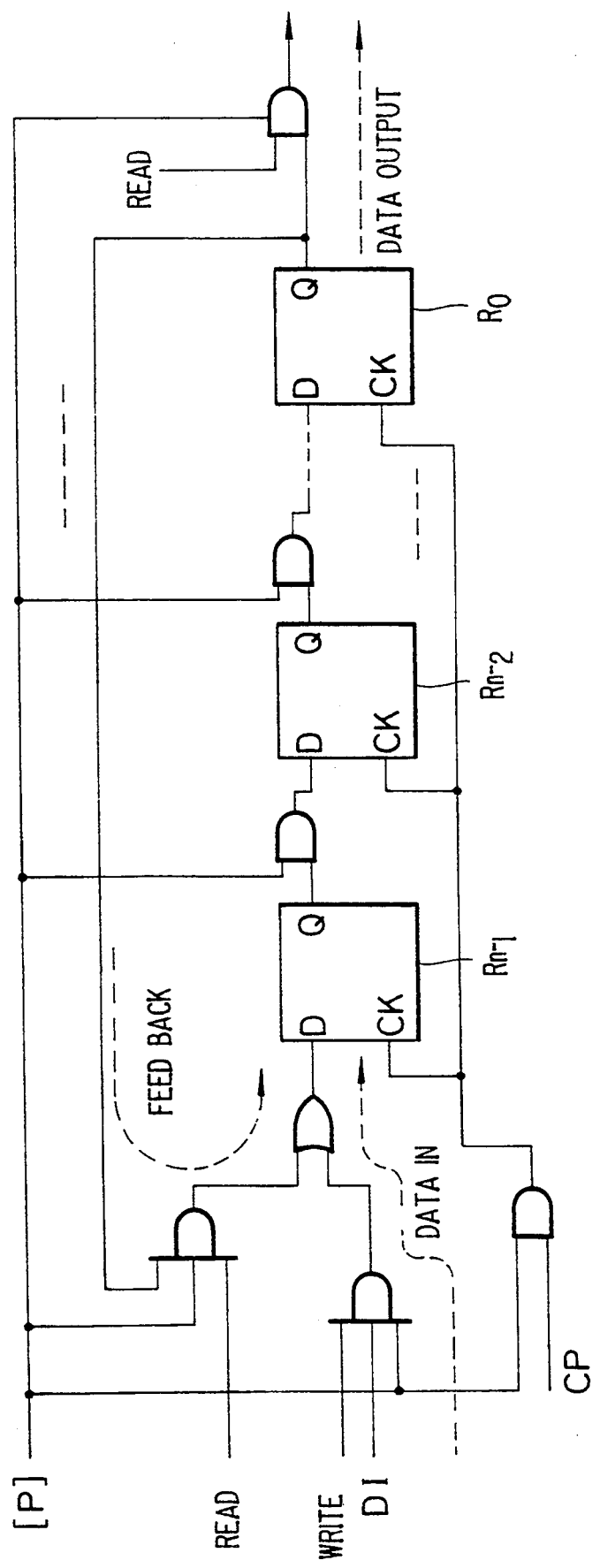

FIG. 65 shows construction of a circuit for inputting the command signals and truth-values of a logic circuit to each memory Mi.

In the same drawing, each memory is constructed with DFF (R0 to Rn-1), and all of the memories (DFF)

are connected in series in the program mode to construct a shift register. According to such construction, when WRITE is high, data corresponding to the memory capacity (bit number) are sent from the host computer 1 to the terminal D1 in synchronism with the clock CP. Then, the data are inputted to the shift register from the first stage thereof along a dotted data-in course. By repeating such operation to all logic elements, the data input is completed.

Thereafter, when the mode M is changed into high (simulation mode) by the host computer 1, the shift register becomes free from the circuit system. Therefore, the command signals and truth values are given as initial data in the memories as registers and a truth table as in FIG. 66. In such a state, when the host computer 1 sends the clock signal to the system, the logic simulation is started.

While in the program mode, when the signal READ (high) and clock CP are given from the host computer 1, the contents of the respective registers are sent to the host computer 1 from the shift register along a dotted data-out line. Moreover, the shift register forms a loop along a dotted feed-back line shown in FIG. 65 in the read operation, so as to regain the data and return the state of each logic element to the original state when the data transmission to the host computer 1 is finished. As the result, when simulation is started again after data are sent from a logic element where interruption is generated to the host computer 1, the operation to write the data from the host computer 1 can be omitted, therefore the simulation time can be greatly reduced.

Figure 67:
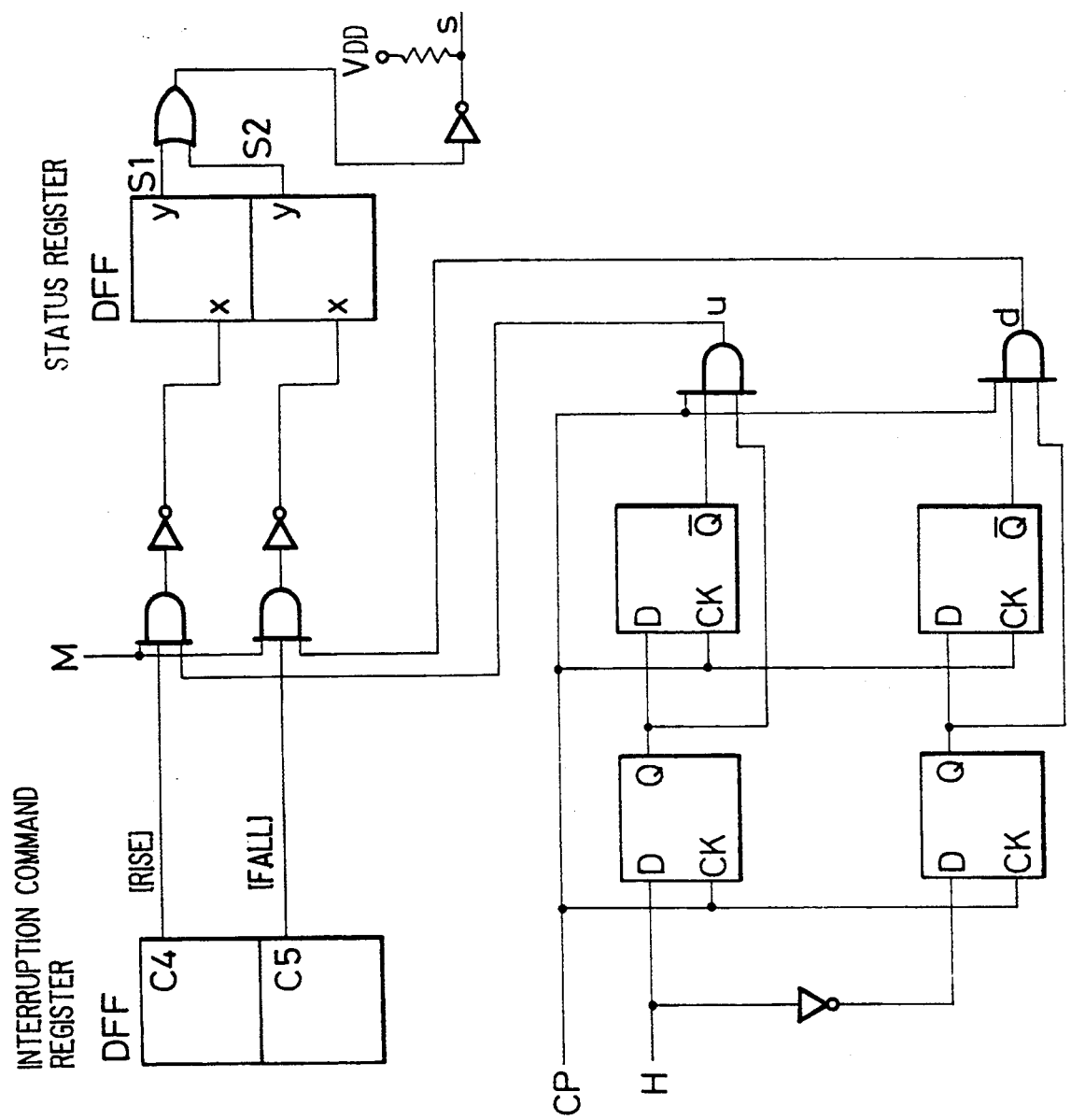

FIG. 67 shows construction of an interruption signal generating circuit comprising interruption registers and status registers as command registers.

Generally, a function for starting simulation data collection is often required during simulation when data stored in a specific element are changed. Therefore, in FIG. 67, a function for designating rise, fall or both rise and fall of a signal is given to each command register. Namely, when both rise and fall are detected, both of the two registers are used together.

In this case, when a designated signal is changed (into rise or fall) during simulation, and the interruption is permitted, the corresponding status register is set high. Namely, when output u from a circuit for detecting rise of the output signal H and output d from a circuit for detecting the fall are permitted in FIG. 67, these outputs are respectively sent to the status registers as set signals. Then, the respective output of the status registers gives interruption to the host computer 1 through the terminal S.

Figure 68:
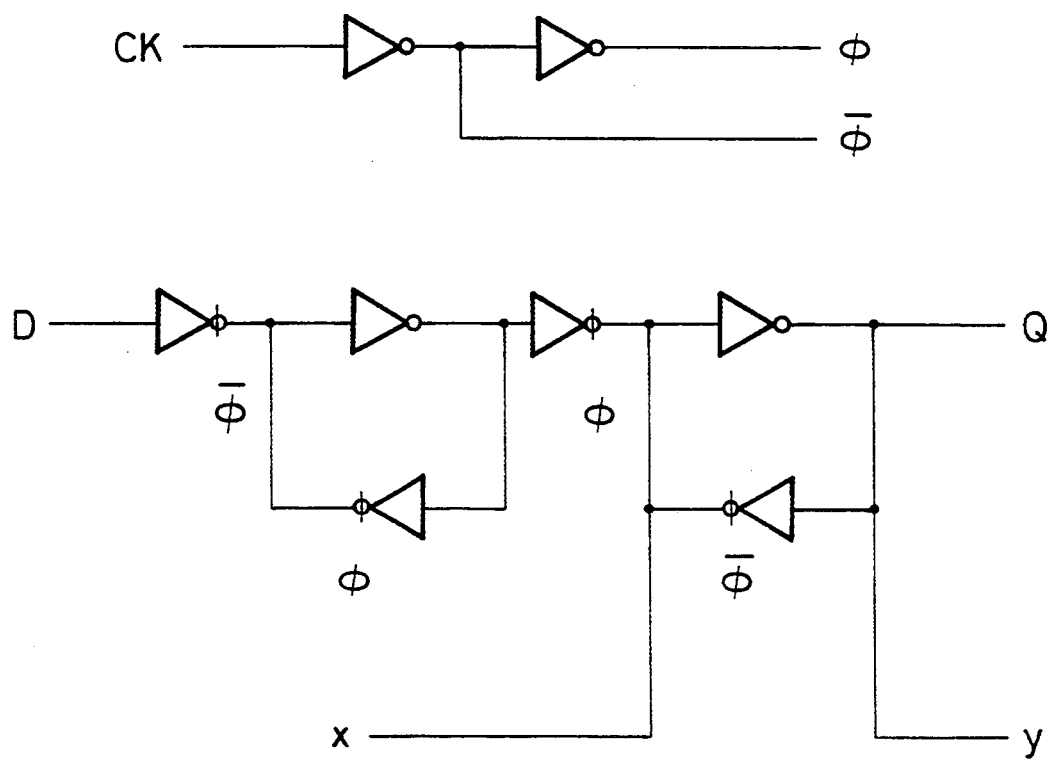
Figure 71A:
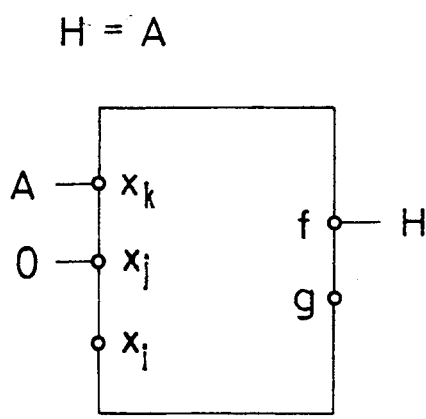
FIGS. 71A to 71E are diagrams to show logic functions to be respectively realized by the universal logic gate and connection relation necessary for them.
Figure 71B:
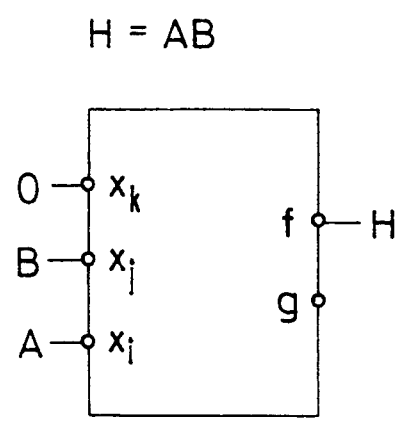
Figure 71C:
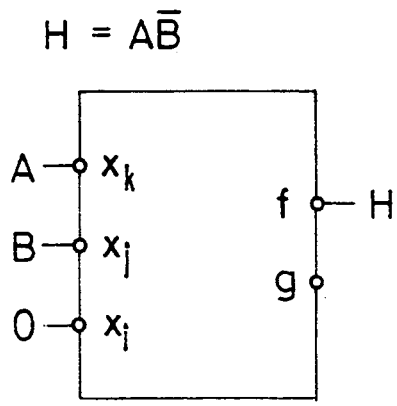
Figure 71D:
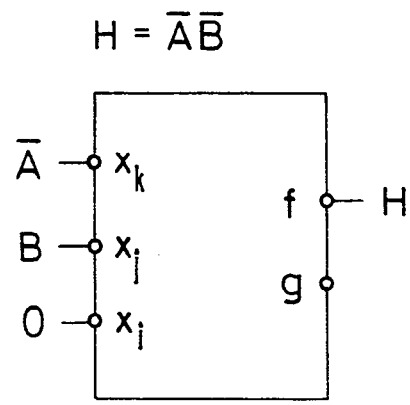
Figure 71E:
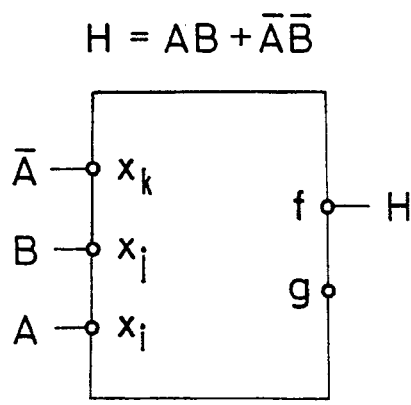

FIG. 68 shows construction of a circuit for compulsorily setting the DFF operation mode when interruption is generated In a register based on DFF. Since the rise or fall of an output signal is generated at random, an interruption signal generating circuit as shown in FIG. 67 is constructed by providing an independent terminal x to each status register which ls composed of a standard DFF. Moreover, an interruption signal to be sent from each status register to the host computer 1 is taken out from an Independent output terminal y.

In such a manner, an optional logic function can be realized with AE.

As stated above, in the logic simulator as the second embodiment according to the present invention, the logic function of each logic element is realized with a programmable logic array. Moreover, each signal line provided between the logic elements respectively having logic functions can be connected or disconnected by each connection element. Namely, a simulation circuit can be constructed with hardware. As the result, the logic elements can be operated in parallel. Besides, it becomes possible to solve the problem of restriction on the simulation speed which must be inevitably considered in case of the conventional simulation method based on software. Thus, according to the logic simulator of the second embodiment, it becomes possible to carry out logic simulation at high speed, and simplify and reduce the construction of the simulator.

Moreover, it is possible to generate interruption from an optional logic element. Besides, when interruption is generated during simulation, it is also possible to process the interruption with holding the output obtained by the time in a logic element which generates it. Therefore, it is not necessary to repeat logic simulation again from the first stage after the interruption process is finished. Namely, it is possible to restart the simulation from the logic element which generates the interruption. As the result, it becomes possible to carry out the logic simulation more easily at higher speed than before.

Next, another logic simulator as the third embodiment according to the present invention is described.

The difference in the third embodiment from the first embodiment is that the logic element in the logic function for realizing each part of a logic circuit to be simulated includes a universal logic gate for realizing a unit-delay logic circuit. Moreover, the input terminals of the universal logic gate are respectively connected to the input terminals of the logic element through a plurality of switches, so that it becomes possible to realize each logic function to be set in each logic element by changing connection relation between the input terminals of the universal logic gate and those of the logic element.

Since the other construction of the third embodiment is the same as that of the first embodiment, the detailed explanation is not given here. Hereinafter, the logic element AE including the universal logic gate which is the most important part of this embodiment will be described.

Generally, a 2-input combinational circuit based on the following logic:

$$H = F(A, B)$$

has four ($2^2 = 4$) input combinations. Therefore, the output H can be expressed by 16 ($2^4 = 16$) combinations of the inputs. This Is explained by a Karnaugh's diagram shown in FIG. 69.

In FIG. 69, 0, 1 respectively corresponding to the input values A, B are given in the well known manner, and logic outputs a1, a2, a3, a4 are set in accordance with each combination of these input values. Therefore, one logic function can be decided by a combination of a1, a2, a3, a4. For example, when a1=1 and a2=a3=a4=0, the diagram given in FIG. 69 shows the expression:

$$H = (-A) \cdot (-B)$$

where $-A$ is the inversion of A.

Namely, all of the output H obtained from the 2-input combinational circuit based on the Karnaugh's diagram can be expressed as follows:

(1) when the output of the logic circuit always gives 0 irrespectively of a1, a2, a3, a4, $H0 = 0$;

(2) when the output is positive if one of a1, a2, a3, a4 is 1, $H1 = (-A) \cdot (-B),$
$H2 = A \cdot (-B),$
$H3 = (-A) \cdot B,$ and
$H4 = A \cdot B;$ (3) when the output is positive if two of a1, a2, a3, a4 are 1, $H5 = (-A) \cdot (-B) + A \cdot (-B) = -B,$
$H6 = (-A) \cdot (-B) + (-A) \cdot B = -A,$
$H7 = (-A) + (-B) + A \cdot B,$
$H8 = A \cdot (-B) + (-A) \cdot B,$
$H9 = A \cdot (-B) + A \cdot B = A,$ and
$H10 = (-A) \cdot B + A \cdot B = B;$ (4) when the output is positive if three of a1, a2, a3, a4 are 1, $H11 = (-A) \cdot (-B) + A \cdot (-B) + (-A) \cdot B = -A + -B,$
$H12 = (-A) \cdot (-B) + A \cdot (-B) + A \cdot B = A + -B,$
$H13 = (-A) \cdot (-B) + (-A) \cdot B + A \cdot B = -A + B,$ and
$H14 = A \cdot (-B) + (-A) \cdot B + A \cdot B = A + B;$ (5) when the output is positive if all of a1, a2, a3, a4 are 1, $H15 = A \cdot B + (-A) \cdot B + A \cdot (-B) + (-A) \cdot (-B) = 1.$ Moreover, there are the following relations between the outputs from H0 to H15:

$H0 = -H15,$
$H1 = -H14,$
$H2 = -H13,$
$H3 = -H12,$
$H4 = -H11,$
$H5 = -H10,$
$H6 = -H9,$ and
$H7 = -H8.$ Among these outputs, H5, H6 can be expressed by one input value respectively. Thus, the netlist has no problem if these two values are regarded as the same value. Likewise, H2, H3 express an equivalent logic circuit if the input connections are crossed each other. Therefore, both logic functions based on H2, H3 can be expressed by only one of them. Accordingly, if 6 kinds of logic functions h0, ..., h5 are given as follows, the netlist constructed by the outputs from the 2-input logic element can be easily expressed with h0, ... h5 and the respective inversions $-h0, \ldots, -h5$.

$h0 = 0$
$h1 = A$
$h2 = A \cdot B$
$h3 = A \cdot (-B)$
$h4 = (-A) \cdot (-B)$
$h5 = A \cdot B + (-A) \cdot (-B)$ These 6 kinds of logic functions are respectively realized with a universal logic gate (ULG) as shown in FIGS. 70A and 70B. FIG. 70A is a circuit realized by a CMOS, and FIG. 70B is a symbolic diagram of the circuit shown in FIG. 70A. Moreover, the input-output relations in the ULG based on these 6 kinds of logic functions are respectively shown in FIGS. 71A to 71E. From these drawings, it can be apparently seen that the input values A, B should have relation as shown in FIG. 72 to the input terminals xi, xj, xk of the ULG.

Incidentally, the values $K = 0, \ldots, 5$ corresponds to h0, ..., h5 respectively to designate each logic function.

Moreover, since the output f and the inversion g of the ULG circuit are produced at the same time, the inversion output can be obtained only by changing the output terminals without making the circuit excessively complicated.

Figures 72, 73:
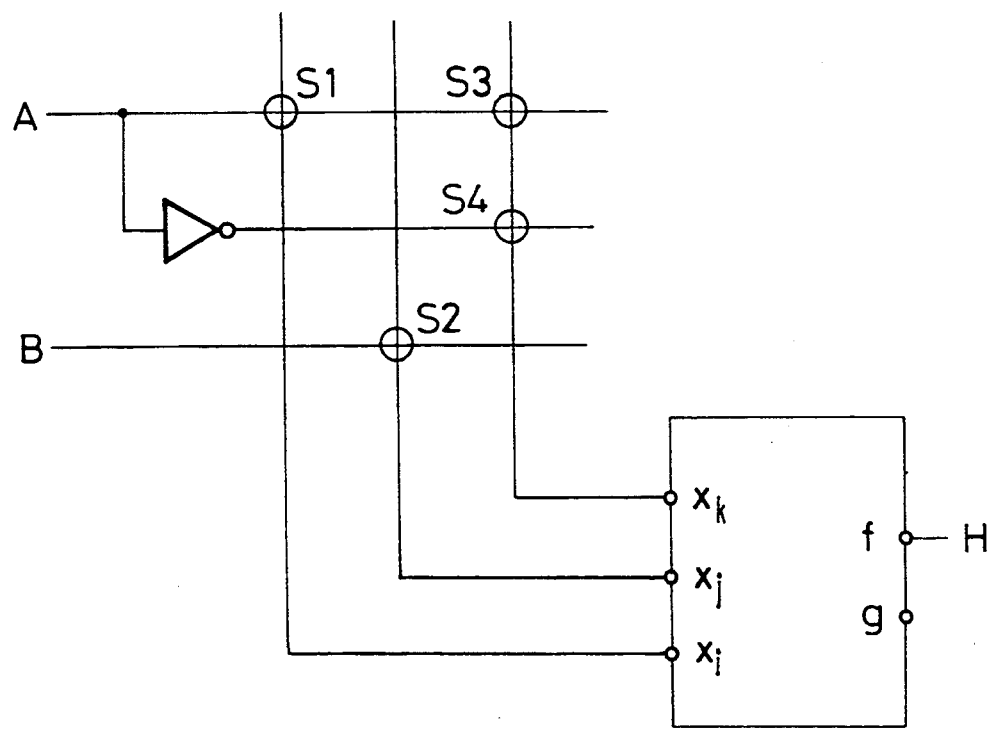
FIG. 72 is a diagram to show logic function modes and connection relation thereof.
FIG. 73 is a diagram to show a universal logic gate having an input switching circuit.
Figure 74:
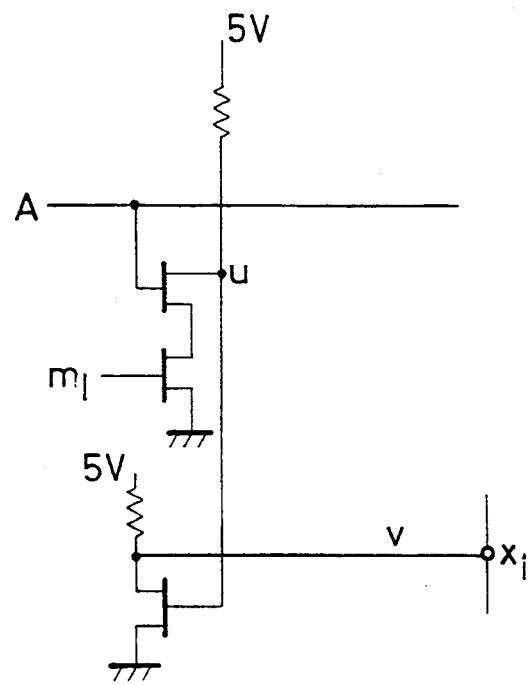
FIG. 74 is a circuit diagram to show a signal switching circuit.

FIG. 73 shows a circuit for realizing the relation shown in FIG. 72 with a PLA. In the same drawing, S1, S2, S3, S4 are switches whose gates are respectively connected to outputs m1, m2, m3, m4 of memories M1, M2, M3, M4 which are explained below. For example, the switch S1 is closed when m1 is 1 so that the input signal A is transmitted to xi. FIG. 74 shows a transistor circuit of the switch S1, which is used as a signal switching circuit to transmit the signal A to xi.

In FIG. 74, since u is always high when M1 is 0 (low), v is always 0 (low). While, v is A when M1 is 1 (high).

Accordingly, when $MI = M2 = M3 = M4 = 0$, all of xi, xj, xk are 0, so that the output H becomes 0. Likewise, the above h1, ..., h5 can be respectively realized in accordance with tile designation numbers K1 to K5.

Figure 75:
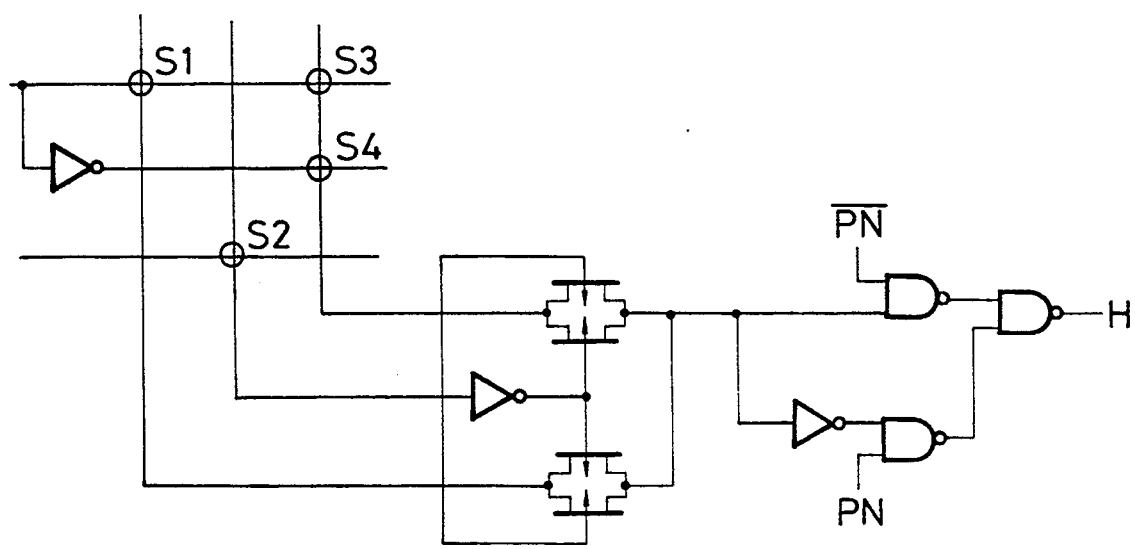
FIG. 75 is a circuit diagram to show an important pare of a logic element constructed with a universal logic gate.

FIG. 75 shows a 2-input circuit for supplying the outputs h0, ..., h5 and the inversions thereof using designation codes K and PN. Incidentally, the code PN is set at 0 when h0, ..., h5 are outputted or at 1 when the inversions are outputted. Now, the logic operation of the circuit shown in FIG. 75 is briefly explained with reference to FIGS. 76, 72, 77.

Figures 76, 77:
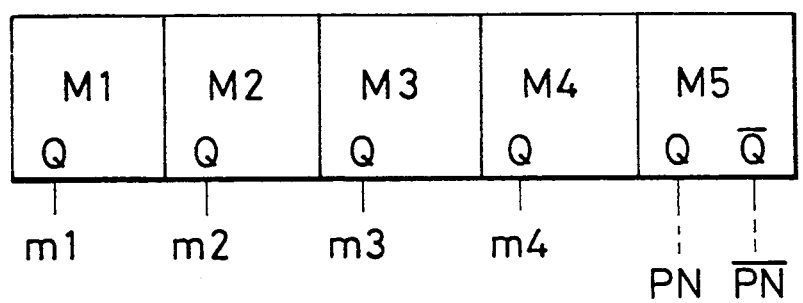
FIG. 76 shows a logic function selecting register.
FIG. 77 shows data to be written into the selecting register.

In case of $K = 1$, M3 becomes 1 in accordance with FIG. 77. Thus, it is clearly understood that the output f can be expressed as follows:

$f = A = h1.$

Likewise, from the relation between:
$K = 0, 2, \ldots, 5$ and
h0, h2, ... h5 based on FIGS. 77 and 72, the respective inversions corresponding to h1, ... h5 can be realized by designation of $PN = 1$.

Since the value of K assigned to each logic element is decided by a predetermined netlist, the values shown in FIG. 77 are respectively inputted to the memories M1 to M4 in the program mode based on each K value obtained when the netlist is analyzed in advance with software. Moreover, 0 or 1 is inputted to M5 in response to the positive output or inversion thereof.

Figure 78:
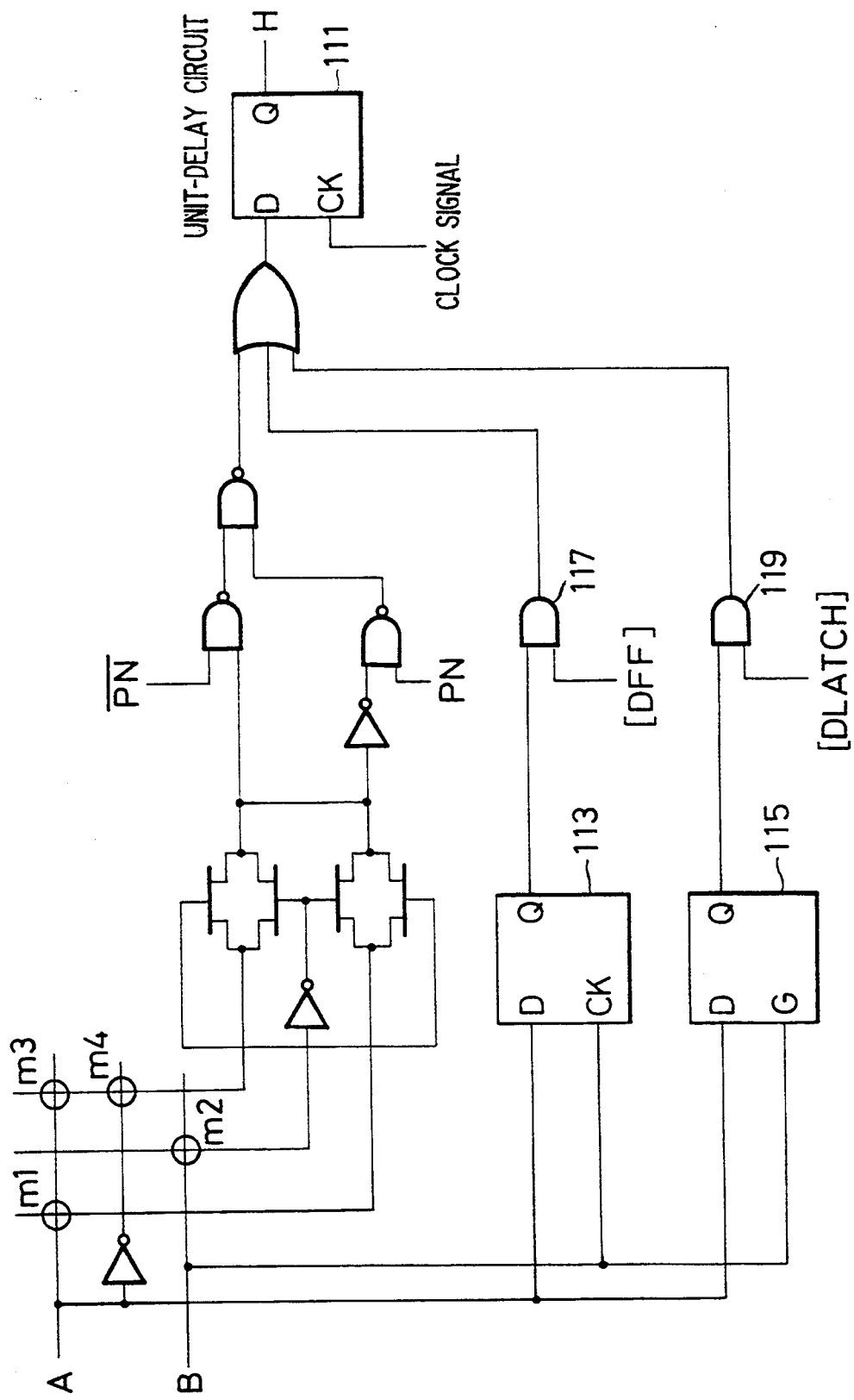
FIG. 78 is a circuit diagram to show an important part of a logic element having both DFF and DLATCH functions.
Figure 79:
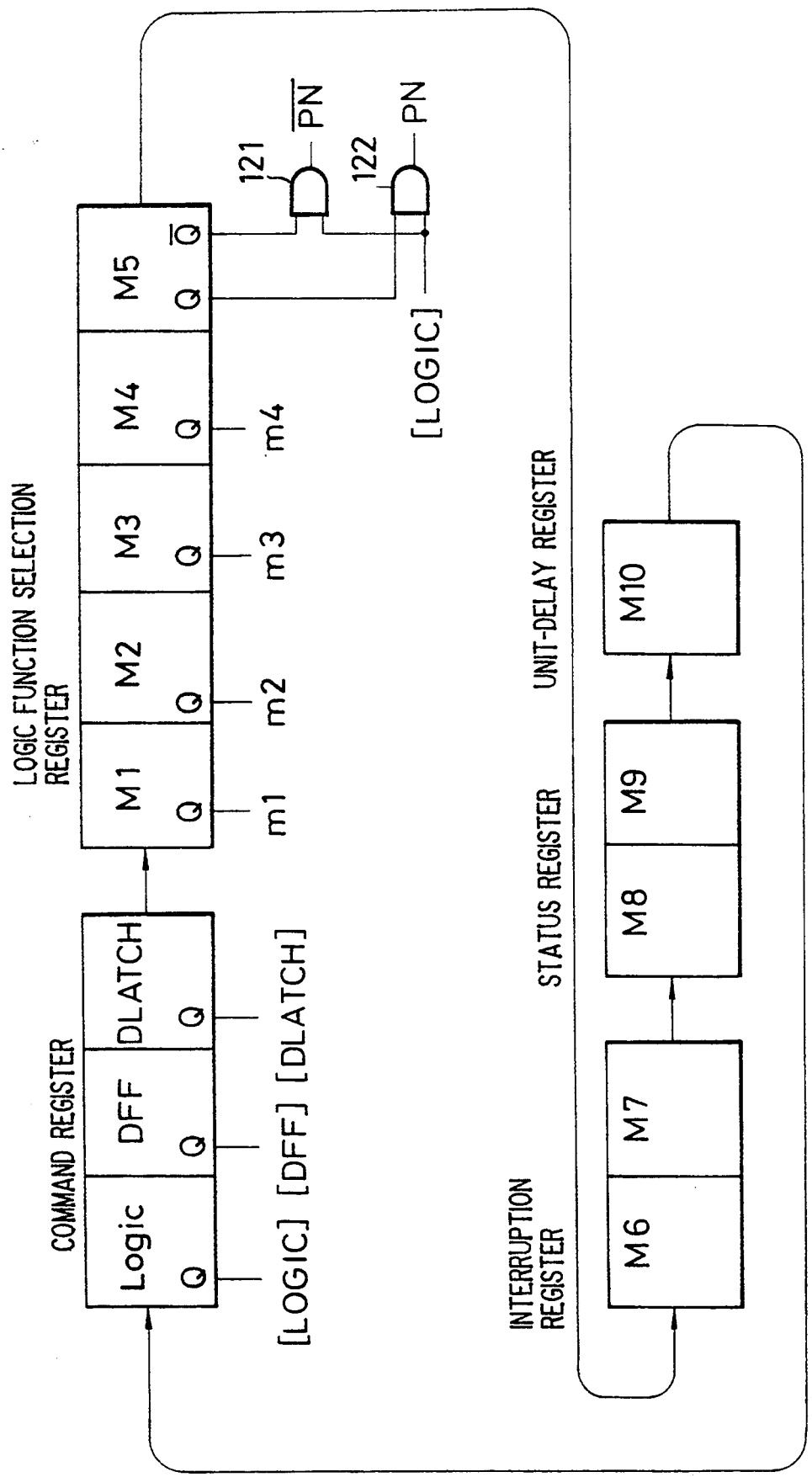
FIG. 79 shows construction of a shift register used in the logic element shown in FIG. 78.

FIG. 78 shows an important part of a logic element AE using the ULG. As shown in the same drawing, this circuit diagram comprises adding a unit-delay circuit 111, a DFF 113 and a LATCH 115 to the circuit shown in FIG. 75. The DFF 113 and DLATCH 115 have AND circuits 117 and 119 respectively, so that any one of the combinational logic, DFF and DLATCH can be selected. The DFF outputs the input A when the input B rises and also holds the output value by the time of the next rise of B. While, the DLATCH directly outputs the input A when B is 1, and holds the output value when B is 0. To decide the function of the logic element, it is necessary to use values of m1 to m4, [DFF], [DLATCH]and PN. Incidentally, these values are stored in a shift register as shown in FIG. 79. As shown in the same drawing, the shift register is a 13-bit memory comprising DFF's arranged in series, in which the outputs of bits designated by M1 to M4 are corresponding to logic functions and respectively connected to each gate of the switches included in the above-mentioned PLA circuit.

Figure 80:
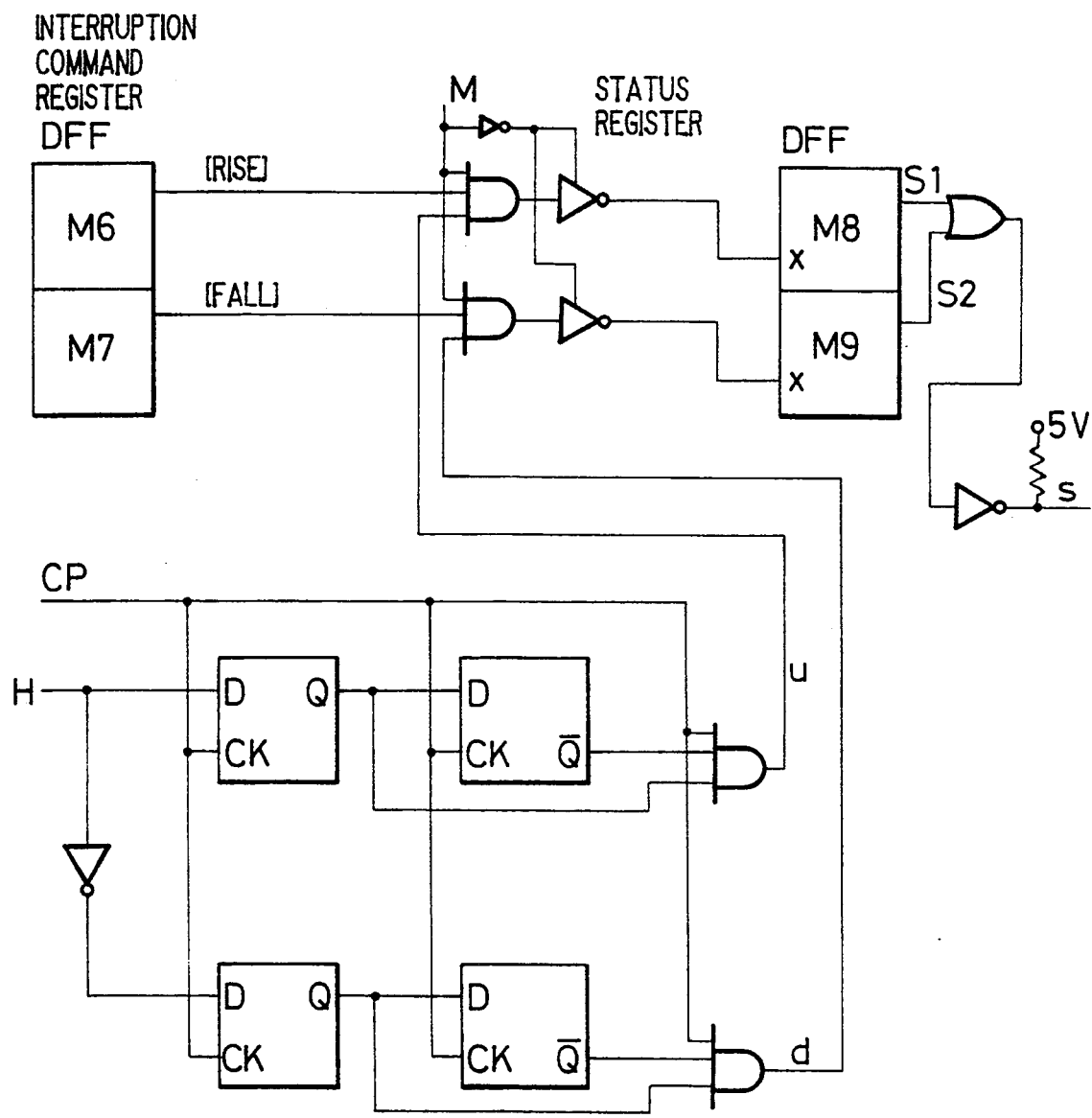
FIG. 80 shows an interruption signal generating circuit.

While, the bits denoted by DFF, DLATCH are respectively connected to the input terminals of AND circuits 117, 119 shown in FIG. 78. Moreover, the bit designated by M5 shows an inversion signal and is connected to AND circuits 121, 122, the one input of the respective AND circuits being connected to the bit designated by LOGIC, so as to produce the signal PN and the inversion thereof. Namely, when 1 is set in the LOGIC bit, the logic element expresses a logic circuit decided by the contents in M1 to M4. While, when 1 is stored in the DFF bit, the logic element serves as DFF, moreover, when 1 is stored in the DLATCH, it serves as DLATCH. With respect to M6, 1 is set in advance therein if it is necessary to generate interruption to the host computer when the output of the logic element rises. On the other hand, 1 is set in M7 advance if it is necessary to generate interruption to the host computer when the output of the logic element falls. By setting the contents of M6, M7 as mentioned above, M8 or M9 can be 1 when the rise or fall occurs. As the result, the signal "1" is outputted therefrom. This function can be controlled by a circuit comprising four DFF's as shown in FIG. 80. Namely, in case of the simulation mode (M=1), if the output H is changed, the interruption signal S is obtained in response to the contents of M6, M7.

Figure 81:
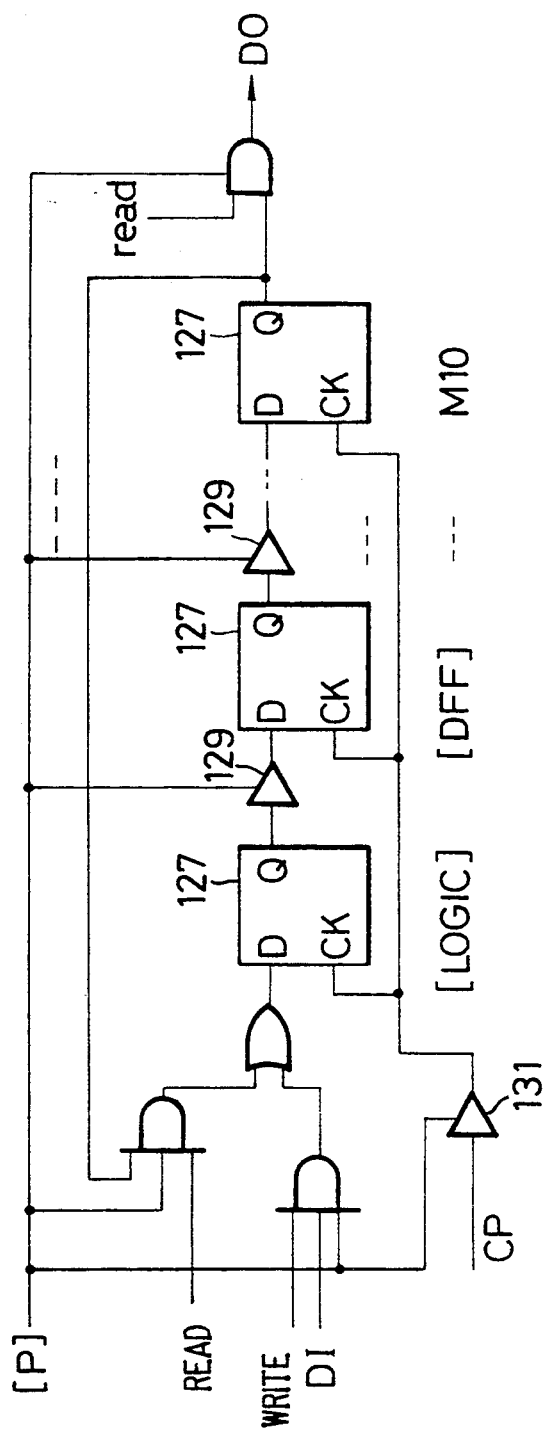
FIG. 81 is a circuit diagram to explain input and output of a signal to a shift register in the program mode.

Next, a method of storing the values of M1 to M9, LOGIC, DFF, DLATCH into the shift register to decide the function of the logic element Is explained with reference to FIG. 81.

Figure 82:
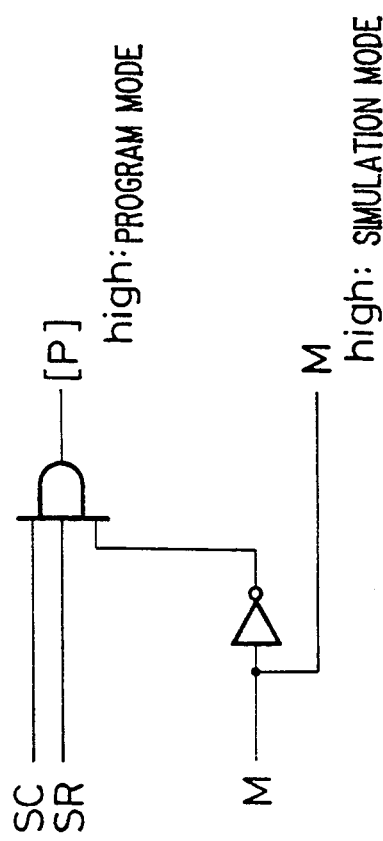
FIG. 82 shows a circuit diagram for generating a program mode control signal.

As shown in the same drawing, 13 pieces of DFF's 127 are connected in series through tristate gates 129 so as construct a shift register. To the clock terminal of each DFF a clock signal CP is supplied through a tristate gate 131. Moreover, a signal [P] for designating the program mode is given to the respective gates of these tristate gates 129,131. The signal [P] is produced by a circuit as shown in FIG. 82. To set the signal [P] at 1, it necessary to set the condition M at 0 and select the corresponding logic element by SC, SR. Moreover, when the signal [P] is 1 and also when WRITE is 1, data corresponding to a desired function is transmitted to the shift register synchronized with the clock signal CP by 1 bit. While, when both [P] and READ is 1, it is also possible to output the contents in synchronism with the clock CP by 1 bit.

In such a manner, an optional logic circuit can be realized with AE.

Next, a logic simulator as the fourth embodiment according to the present invention is explained.

The logic simulator of the fourth embodiment is so constructed as to greatly reduce the circuit area occupied by wiring and switches having memories.

Therefore, the logic simulator comprises a unit-delay multiplexed logic element provided with sampling hold means corresponding to each multiplex input signal, the sampling hold means comprising sampling signal generating means for generating a signal to sample only a specific pulse signal from a multiplex input signal, sampling means for sampling the specific pulse signal sampled by the sampling signal generating means in a predetermined simulation cycle, and hold means for holding the specific pulse signal sampled by the sampling means, and converting the signal at start of a new simulation cycle into a restoration signal having a constant level during the new simulation cycle; and further provided with an ordinary logic circuit for outputting a logic output signal produced by giving a predetermined logic operation to the restoration signal outputted from the sampling hold means, and pulse means for sampling the logic output signal at a predetermined timing and outputting an operated multiplexable pulse signal.

Figure 83:
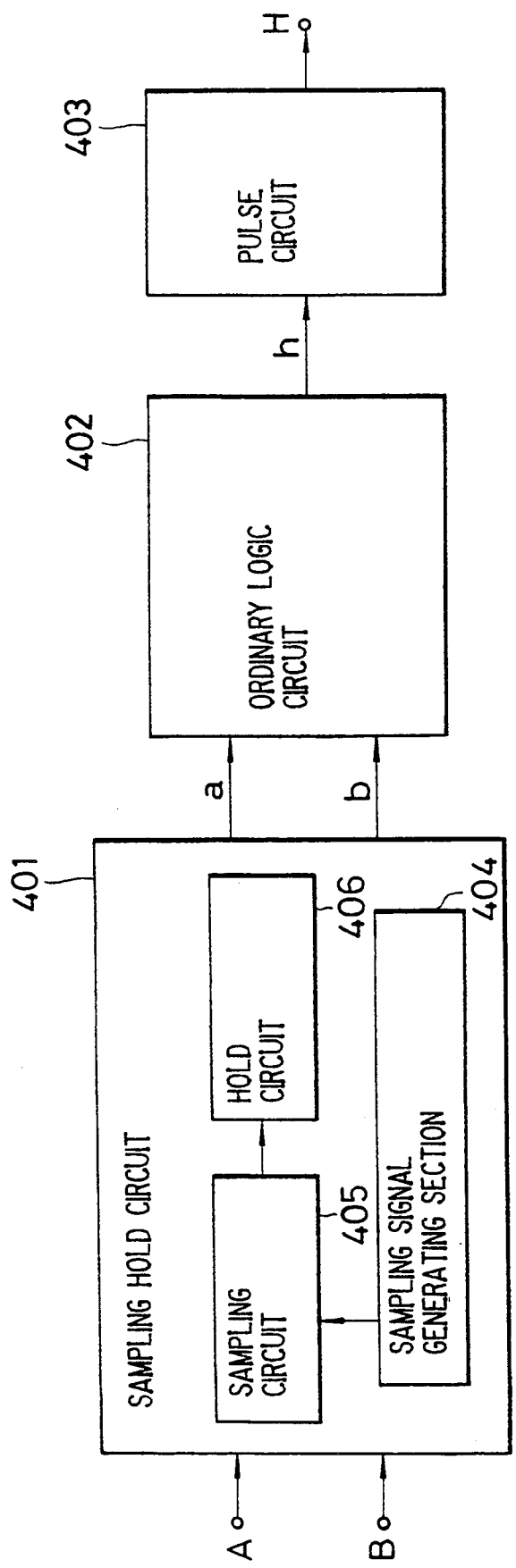
FIG. 83 is a block diagram of a unit-delay multiplexed logic element relating to the fourth embodiment of the present invention.

FIG. 83 is a block diagram to show a unit-delay multiplexed logic element related to the fourth embodiment of the present invention.

For use as a 2-input-1-output logic element, the unit-delay multiplexed logic element (LE) samples only predetermined pulse signals from multiplex signals A, B respectively having a plurality of pulse signals time-shared in the same simulation cycle, then gives a predetermined logic operation to each sampled pulse signal.

Namely, as shown in FIG. 83, the element LE includes a sampling hold circuit 401 which samples specific pulse signals from multiplex signal A·B and converts them at start of a new simulation cycle into restoration signals a, b respectively having constant levels during the cycle then outputs the resultant signals to the next stage, an ordinary logic circuit 402 for giving a predetermined logic operation to the restoration signal a, b, and a pulse circuit 403 for sampling a logic output signal h outputted from the logic circuit 402 at a predetermined timing and converting the signal h into a multiplexable pulse signal H.

Figure 84A:
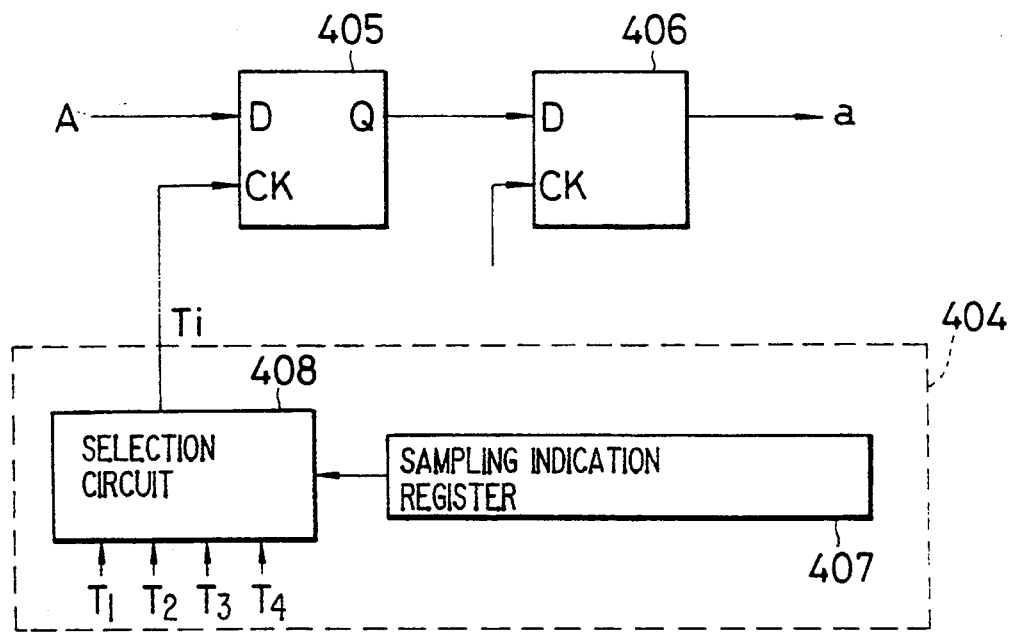
FIG. 84A is a block diagram of a sampling hold circuit of the unit-delay multiplexed logic element shown in FIG. 83.

The sampling hold circuit 401, as shown in FIG. 84A, has a sampling signal generating section 404 which outputs a predetermined timing pulse Ti among a plurality of timing pulses T (T1 to T4 in case of this embodiment) respectively synchronizing with a plurality of pulse signals included, for example, in an input multiplex signal A, a sampling circuit 405 for sampling only a specific pulse signal synchronizing with the timing pulse Ti, and a hold circuit 406 for holding the specific pulse signal sampled by the sampling circuit 405 and inverting it at start of the next simulation cycle into a restoration signal a having a constant level during tile cycle.

Moreover, the sampling signal generating circuit 404 has a sampling indication register 407 for indicating a timing to sample only the specific pulse signal, and a selection circuit 408 for outputting the timing pulse Ti synchronizing with tile specific pulse signal in accordance with the indication from the sampling indication register 407. Besides, in the sampling signal generating circuit 404 shown in FIG. 84B, the sampling indication register 407 is so programmed in advance as to output the following timing pulses in response to each value inputted to the register.

00 (input value)→Ti=T1
01→Ti=T2
10→T1=T3
11→Ti=T4

In this case, these timing pulses T1, T2, T3, T4 can be respectively obtained by time-sharing a standard simulation cycle T into four equal parts without overlapping and construct a cyclic pulse signal sequence as shown in FIG. 85.

Then, at the sampling circuit 405 in the sampling hold circuit 401, only a specific pulse signal included in the input signal A synchronizing with the timing pulse Ti transferred from the sampling signal generating section 404 is sampled. Consequently, the sampled pulse signal is held in the hold circuit 406 until a new simulation cycle is started, and converted into the restoration signal a, at start of the new simulation cycle, then outputted to the logic circuit 402. In this case, the restoration signal a has a constant level during the simulation cycle.

Incidentally, though only the process to the signal A is explained above, the sampling hold circuit 401 also has a sampling signal generating section 404', a sampling circuit 405' and a hold circuit 406' (which are not shown) similarly processing the input signal B.

Figure 86:
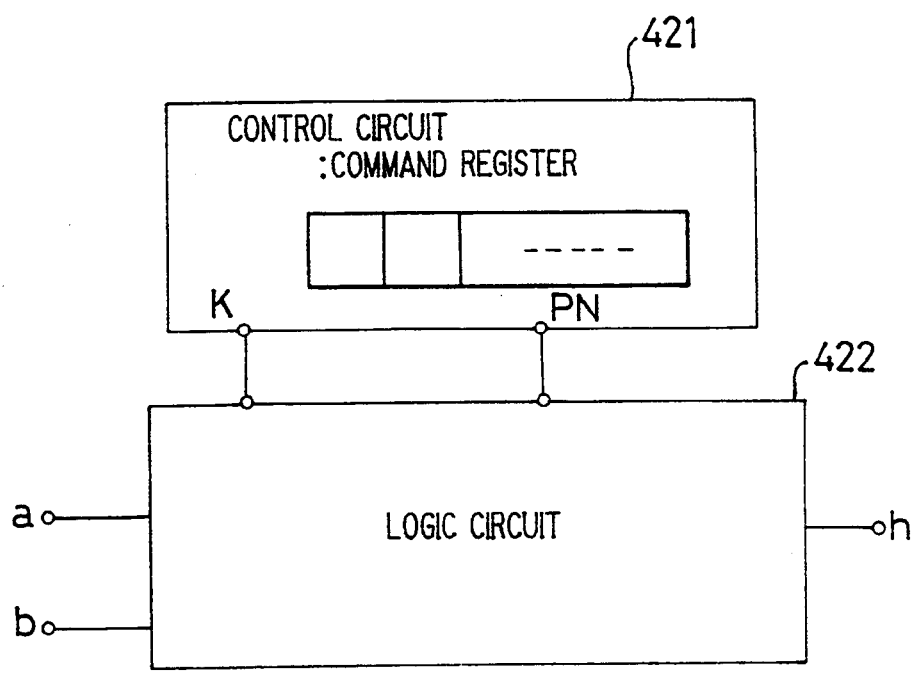
FIG. 86 is a block diagram to show a widely used logic circuit of the unit-delay multiplexed logic element shown in FIG. 83.

By the way, the logic circuit 402 is constructed with a logic element as shown in FIG. 86 based on the ULG method used for the conventional logic simulator. In the logic circuit 402, the following logic operation is executed with a function f.

$$h = f(a, b)$$

In FIG. 86,421 corresponds to FIG. 79, and 422 corresponds to FIG. 78 excluding the unit delay circuit. And the restoration signal a, b are inputted to 422 which generates output h. Accordingly, in the logic circuit 402, it is possible to execute all kinds of logic operations required for conventional logic circuits widely used.

Figure 87A:
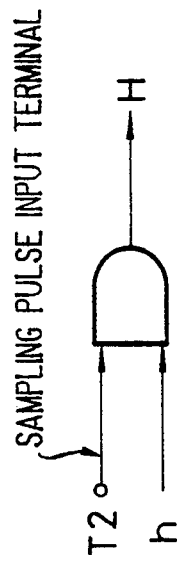
FIG. 87A is a circuit diagram to show a pulse circuit of the unit-delay multiplexed logic element shown in FIG. 83.

In the pulse circuit 403, a timing pulse Ti decided by a position of each unit-delay multiplexed logic element LE, i.e., the timing pulse T2 in case of the LE arranged on the second row, is supplied to a sampling pulse input terminal as one of the input terminals of the AND circuit as shown in FIG. 87A. Moreover, to the other input terminal is given the logic output signal h obtained from the logic circuit 402.

Figure 87B:
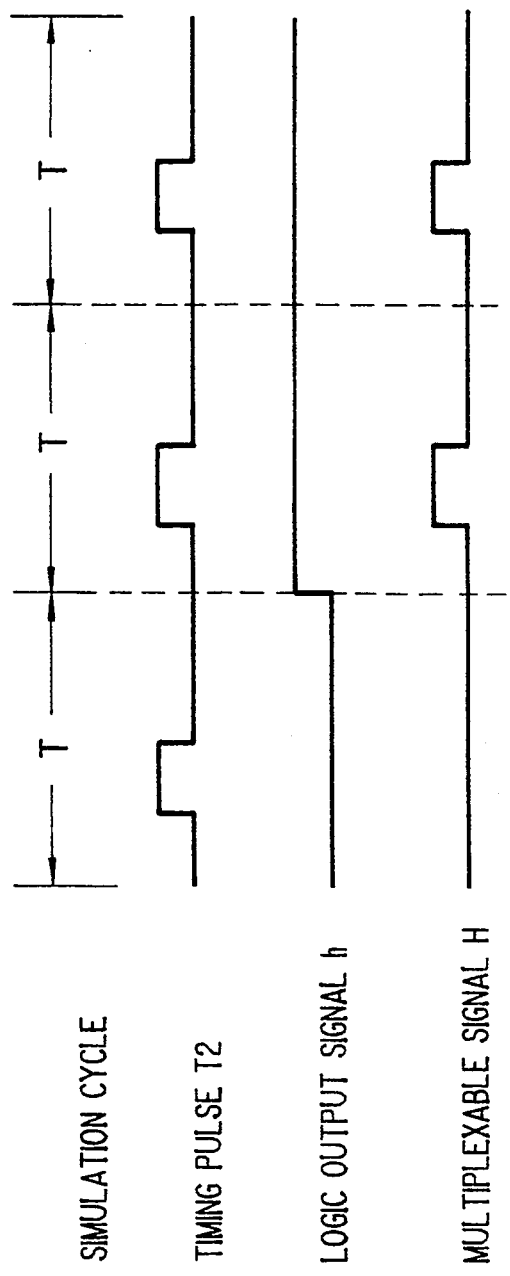
FIG. 87B is an operation signal waveform chart of the pulse circuit shown in FIG. 87A.

Thereafter, the logic product between the logic output signal h and timing pulse T2 is calculated in the AND circuit as the pulse circuit 403 as shown in a signal waveform chart of FIG.87B, then the result is outputted as a multiplexable pulse signal H to a signal synchronizing with the timing pulse T2.

Accordingly, by using the unit-delay multiplex logic element LE, it becomes possible to sample from each of tile multiplex input signals A, B only one pulse signal synchronizing with a predetermined timing which is programmed in advance.

Moreover, since the pulse signal obtained by such sampling is converted into the logic output signal h through predetermined logic operation, and the signal h is then converted into the multiplexable pulse signal H, it is possible to give logic operation again to the output signal in another LE.

Besides, in the unit-delay multiplexed logic element LE, unit-delay occurs between each multiplex input signal A or B and each corresponding restoration signal when the latter signal is held in the hold circuit 406 shown in FIG. 84A until the next simulation cycle as shown in FIG. 87B, it is very advantageous that it becomes unnecessary to specially prepare a unit-delay circuit which required in the conventional technology for setting the unit-delay in the logic output h.

Next, a multiplex logic module LM comprising a plurality of unit-delay multiplexed logic elements LE's arranged in the conventional two-dimensional matrix form and a wiring network for connecting these LE's to one another is explained with reference to FIG. 88.

In the same drawing, a timing pulse predeterminedly programmed is assigned to unit-delay multiplex logic elements LE's arranged on each row.

Namely, in this embodiment:
a timing pulse T1 is assigned to the first row,
a timing pulse T2 is assigned to the second row,
a timing pulse T3 is assigned to the third row, and
a timing pulse T4 is assigned to the fourth row.

Moreover, with respect to the (4n+i)th row (n=1, 2, ... ; i=1, 2, 3, 4), each timing pulse Ti is repeatedly assigned to the same i.

Figure 89A:
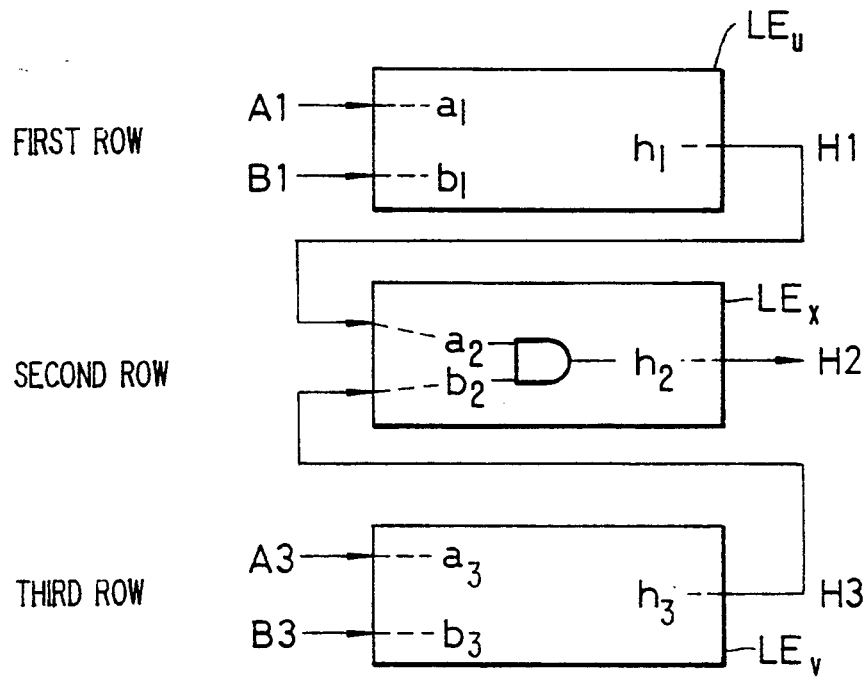
FIG. 89A is a schematic diagram to show construction of a logic circuit combined in the multiplexed logic module shown in FIG. 88.
Figure 89B:
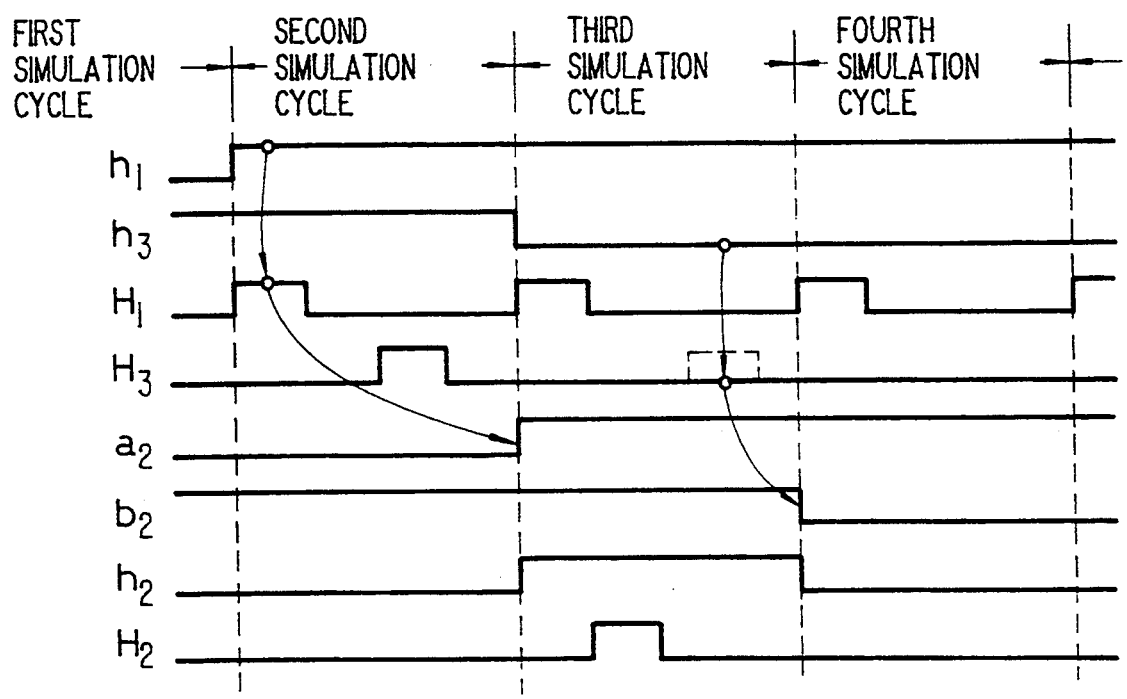
FIG. 89B is an operation signal waveform chart of the logic circuit shown in FIG. 89A.

FIGS. 89A and 89B show a partial logic circuit to explain an example of combination of the unit-delay multiplexed logic elements LE's and the wiring network in the multiplex logic module LM.

In the same drawings, a logic operation expressed as:

$$h1 = f1(a1, b1)$$

is given to respective multiplex Input signals A1, B1 in the first simulation cycle in a unit-delay multiplex logic element LEu on the first row, and a signal H1 is outputted in the second simulation cycle. In this case, a1, b1 are respectively restoration signals to the multiplex input signals A, B, and H1 is obtained by converting a logic output signal h1 into a multiplexable signal.

Likewise, another logic operation expressed as:

$$h3 = f3(a3, b3)$$

is given to respective multiplex input signals A3, B3 in the first simulation cycle in a unit-delay multiplex logic element LEv on the third row, and a signal H3 is outputted in the second simulation cycle in the same manner as said above.

Subsequently, these output signals H1 and H3 are sent to the input terminals of a unit-delay multiplex logic element LEx through the wiring network. Then, a logic operation of:

$$h2 = f2(a2, b2)$$

is given to the respective Input signals HI, H3 in the second simulation cycle at the element LEx, thereafter a signal H2 is outputted in the third simulation cycle. Incidentally, a2, b2 are restoration signals respectively corresponding to the multiplexable signals H1, H3.

Moreover, a detailed explanation for this logic circuit shown in FIG. 89A is given with reference to FIG. 89B.

If h1 is always high on and after the second simulation cycle in the result of the logic operation f1 at the unit-delay multiplexed logic element LEu on the first row, the multiplexable signal H1 synchronizing with the timing pulse Ti in the pulse circuit 403 is outputted to the unit-delay multiplexed logic element LEx of the second row on and after the second simulation cycle. Then, in the unit-delay multiplexed logic element LEx, the signal H1 is converted at the hold circuit 406 into the restoration signal a2 at each simulation cycle and becomes high on and after the third simulation cycle.

While, if h3 is high on and before the second simulation cycle (and low on and after the third simulation cycle) in the result of the logic operation f3 at the unit-delay multiplexed logic element LEv on the third row, the multiplexable signal H3 synchronizing with the timing pulse T3 in the pulse circuit 403 is outputted to the unit-delay multiplexed logic element LEx of the second row on and before the second simulation cycle. In other words, the signal H3 is low on and after tile third simulation cycle. Then in the unit-delay multiplexed logic element LEx, the signal H3 is converted at the hold circuit 406 into the restoration signal b2 at each simulation cycle before the third simulation cycle and transmitted to the logic circuit 402.

Thereafter, in the logic circuit 402 of the unit-delay multiplexed logic element LEx on the second row, a suitable logic operation, e.g., a logic product calculation, is executed with respect to these restoration signals a2, b2 so as to convert them into the logic output signal h2 which is high only in the third simulation cycle. Moreover, the multiplexable signal H2 is outputted in synchronism with the timing pulse T2 at the pulse circuit 403.

Accordingly, by connecting the plurality of unit-delay multiplexed logic elements LE's in the above-mentioned manner, it becomes possible to construct an optional combinational circuit.

In case of constructing logic circuits based on such a multiplex logic module, it can be decided in the advanced analysis of the netlist, to which unit-delay multiplex logic element LE each logic element in the netlist should be assigned. Therefore, it can be known in advance from which unit-delay multiplexed logic element LE should appear a signal given to each unit-delay multiplexed logic element LE. For example, it is possible to know in advance to which Ti the input signal H1 or H3 should be synchronized. Thus, it is possible to set In advance such a program in the sampling indication register of the unit-delay multiplex logic element LEx as to indicate a timing pulse Ti to be synchronized with each input signal H1 or H3.

Incidentally, since the output signal from each unit-delay multiplexed logic element LE on the i-th row is synchronized with the corresponding timing pulse Ti, if two signals of the first to the fourth row are transferred on the same line, the resultant output signal becomes one multiplex signal and overlap between these original output signals never occurs. However, such overlap occurs if the output signals of the first and the fifth row are transferred on the same line. This "problem" is solved by switching operation as will be explained below.

Next, the wiring network in the multiplex logic module LM is explained with reference to FIGS. 90 to 95.

Generally, in conventional logic elements, it is necessary to provide 16 signal lines to each vertical or horizontal direction to connect logic elements to one another. To the contrary, according to this embodiment, the number of signal lines can be reduced into four (16 lines necessary for the conventional technology/4 multiplex signals) by processing four multiplex signals each produced by multiplexing four signals.

Figure 88:
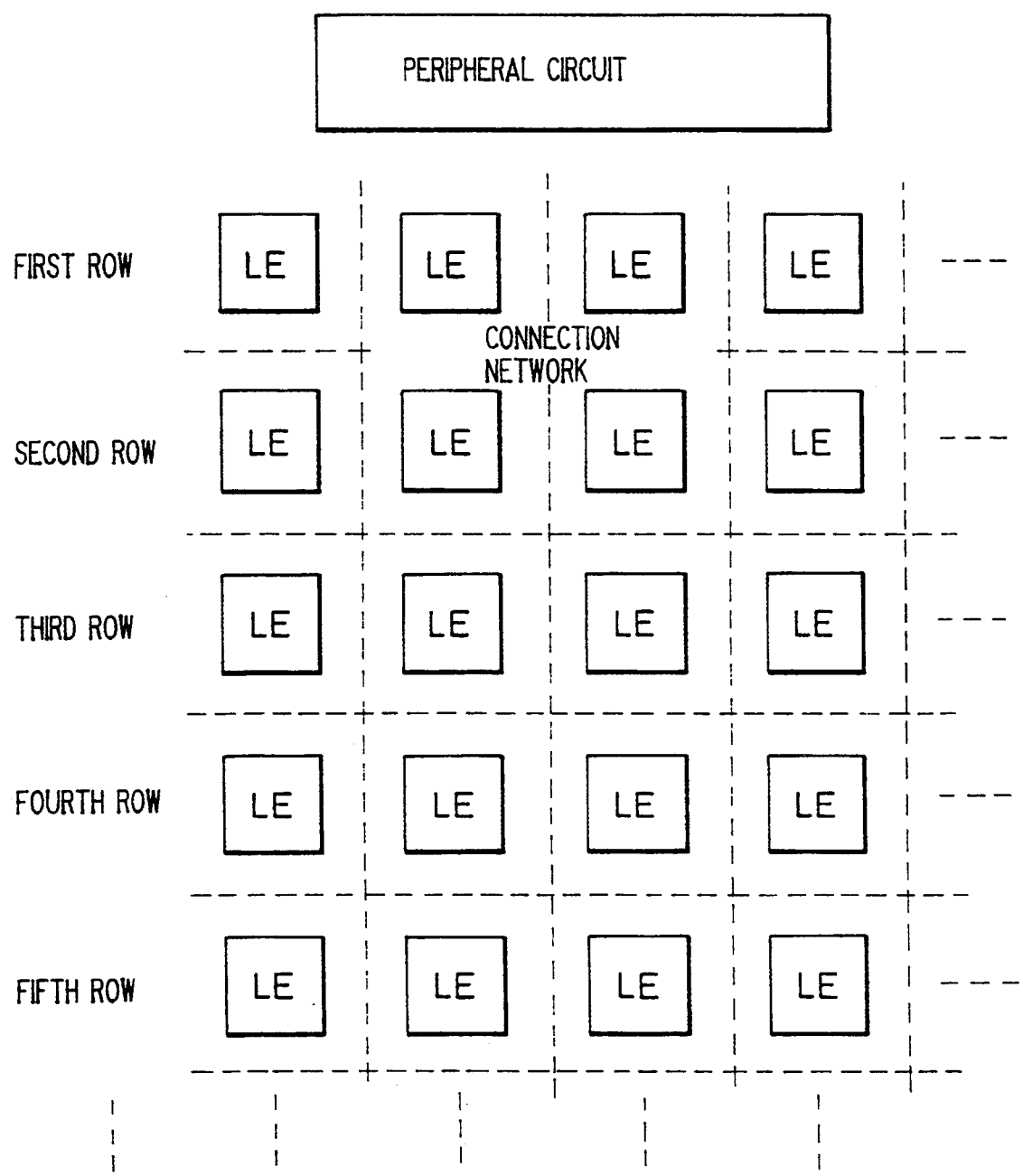
FIG. 88 is a schematic diagram of a multiplexed logic module constructed with the unit-delay multiplexed logic element shown in FIG. 83.
Figure 90:
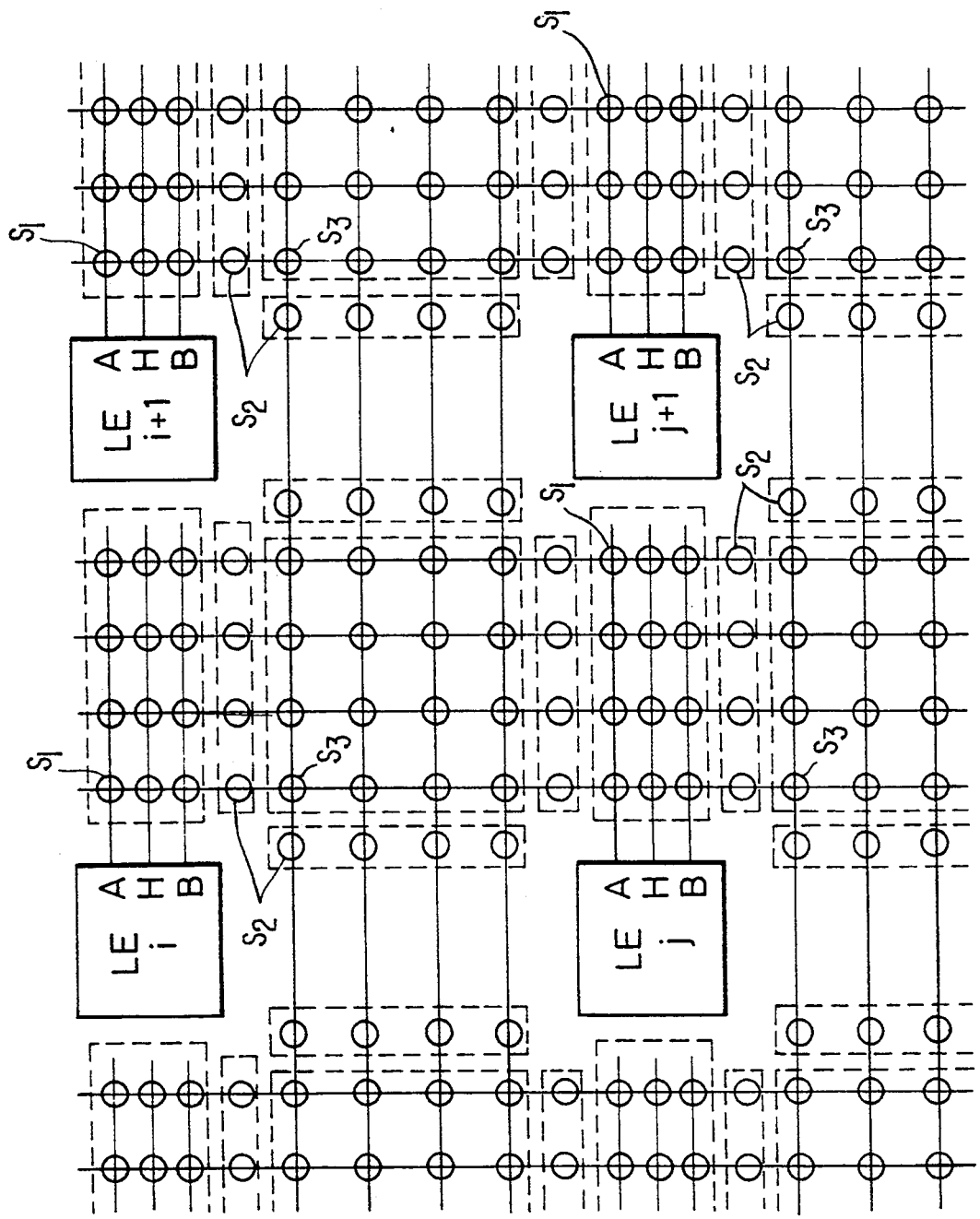
FIG. 90 is an enlarged partial view of the multiplexed logic module shown in FIG. 88.

FIG. 90 is an enlarged diagram of the circuit shown in FIG. 88. As shown in the same drawing, the wiring network adopted in the fourth embodiment includes switches s1 for connecting the input-output terminals A,B of each unit-delay multiplexed logic element LE, s2 for connecting or disconnecting specific wiring portions, and s3 for branching these wiring portions.

Figure 91A:
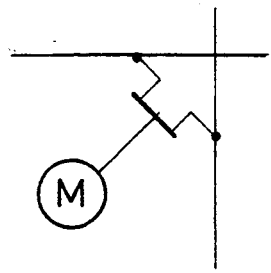
FIGS. 91A to 91C are diagrams to respectively explain functions of connection switches used in the multiplexed logic module shown in FIG. 90.

As shown in FIG. 91A, each switch s1 comprises a transistor controlled by a 1-bit memory M, and connects the terminal A, B or H of each unit-delay multiplexed logic element LE to the wiring network when M is 1.

Figure 91B:
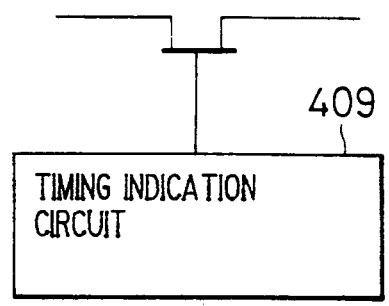

While as shown in FIG. 91B, each switch s2 comprises a transistor controlled by a timing indication circuit 409. Namely, as clearly seen from details of the timing indication circuit 409 shown in FIG. 92, each timing pulse:

T1 when p1 is 1,
T2 when p2 is 1,
T3 when p3 is 1, or
T4 when p4 is 1, passes through each AND circuit A1 to A4 in a timing register 410, and is then supplied to the gate of the transistor through an OR circuit A5 at a different timing.

Namely, by programming the values of p1 to p4 in advance, each timing indication circuit 409 can independently indicate which of the four signals should be connected or disconnected to the wiring network. For example, when all values of p1 to p4 are set at 1 at a predetermined simulation cycle, the four-multiplexed signal can pass through the switch S2.

Figure 84B:
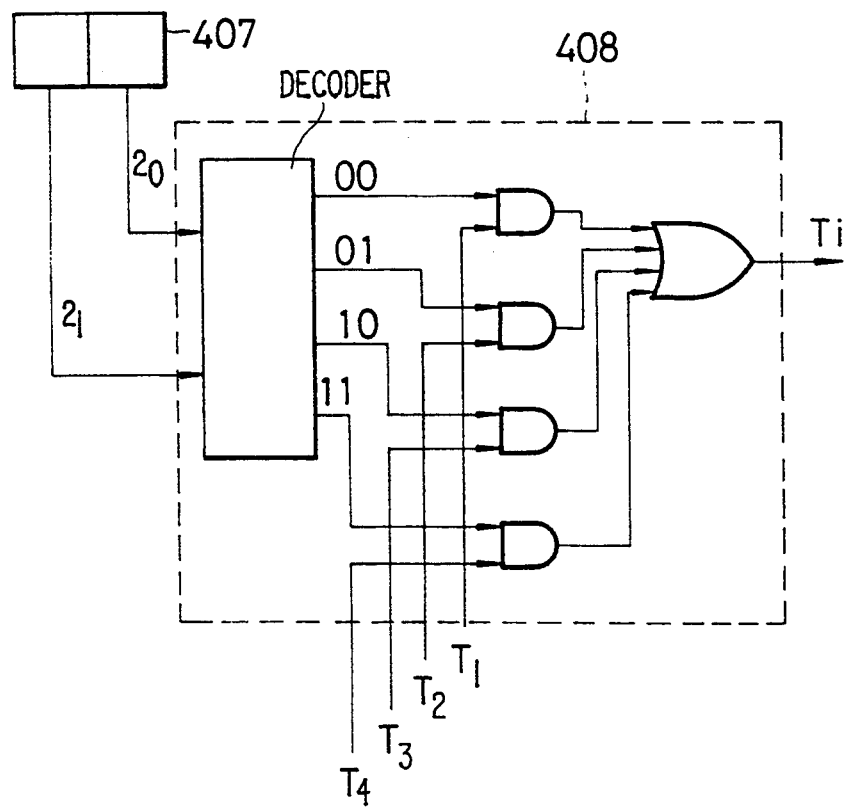
FIG. 84B is a circuit diagram of a sample signal generating section in the sampling hold circuit shown in FIG. 84A.

Incidentally, p1 to p4 are respectively set in advance on programming the wiring network, like programming the sampling signal generating section 404 of the unit-delay multiplexed logic element shown in FIG. 84B.

Figure 91C:
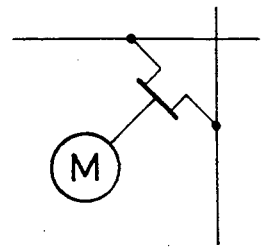
Figure 92:
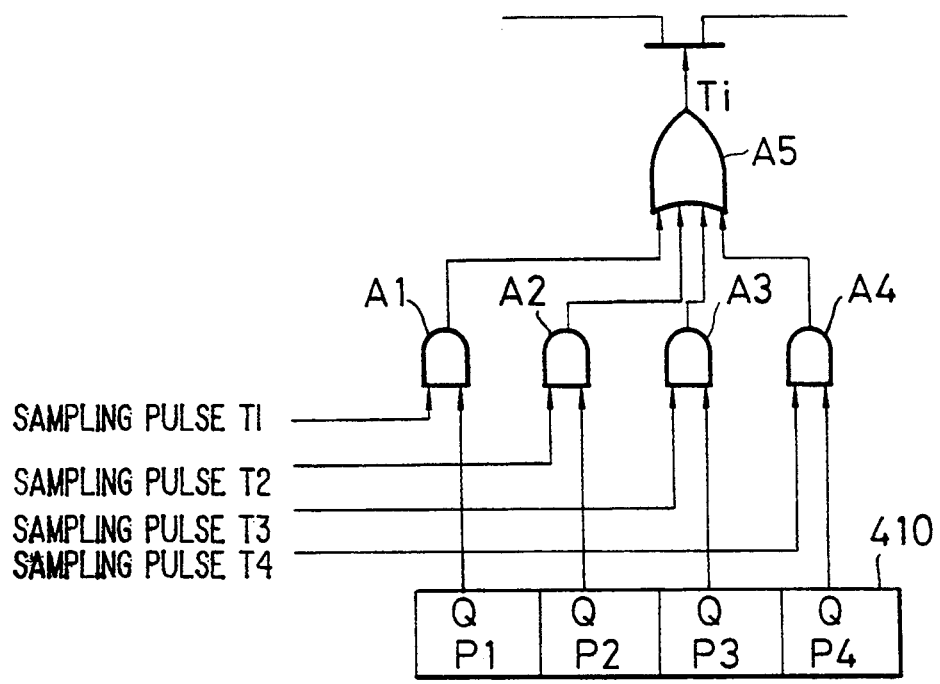
FIG. 92 is a circuit diagram to show a timing indicating circuit of the connection switches shown in FIGS. 91A to 91C.

The switch s3 comprises a transistor controlled by a one-bit memory like the switch s1 as shown in FIG. 91C, and branches a wiring portion when M is 1. Namely, a signal can be transferred both on one signal line directly and on the other crossing line by the switch s3 when M is 1. However, the signal is transferred only directly when M is 0.

Accordingly, when the multiplex signals as described above are adopted as input signals, it is possible to realize logic functions with a smaller number of signal lines than before.

Namely, when 4096 (64×64) pieces of logic elements are packaged in the multiplex logic module LM in the same manner as in the conventional system, 49,000 pieces (3 terminals×4 signal lines×4096 logic elements) of switches s1, 66,000 pieces (4 directions×4 signal lines ×4096 logic elements) of switches s2 and 66,000 pieces (4 signal lines×4 signal lines×4096 logic elements) of switches s3 are respectively required. Accordingly, only 180,000 pieces of switches are required to the multiplex logic module LM, while 1500,000 pieces are required in the conventional system.

Moreover, if a signal outputted from a group of unit-delay multiplexed logic elements from the first to the fourth row overlaps a signal outputted from a group of unit-delay multiplexed logic elements from the fifth to the eighth row on the same signal line on realizing a logic circuit, the switch s2 positioned between the fourth and the fifth row is so set in advance as to disconnect the corresponding wiring section. Accordingly, by the switching operation, the above-mentioned "problem" can be solved.

Figure 93:
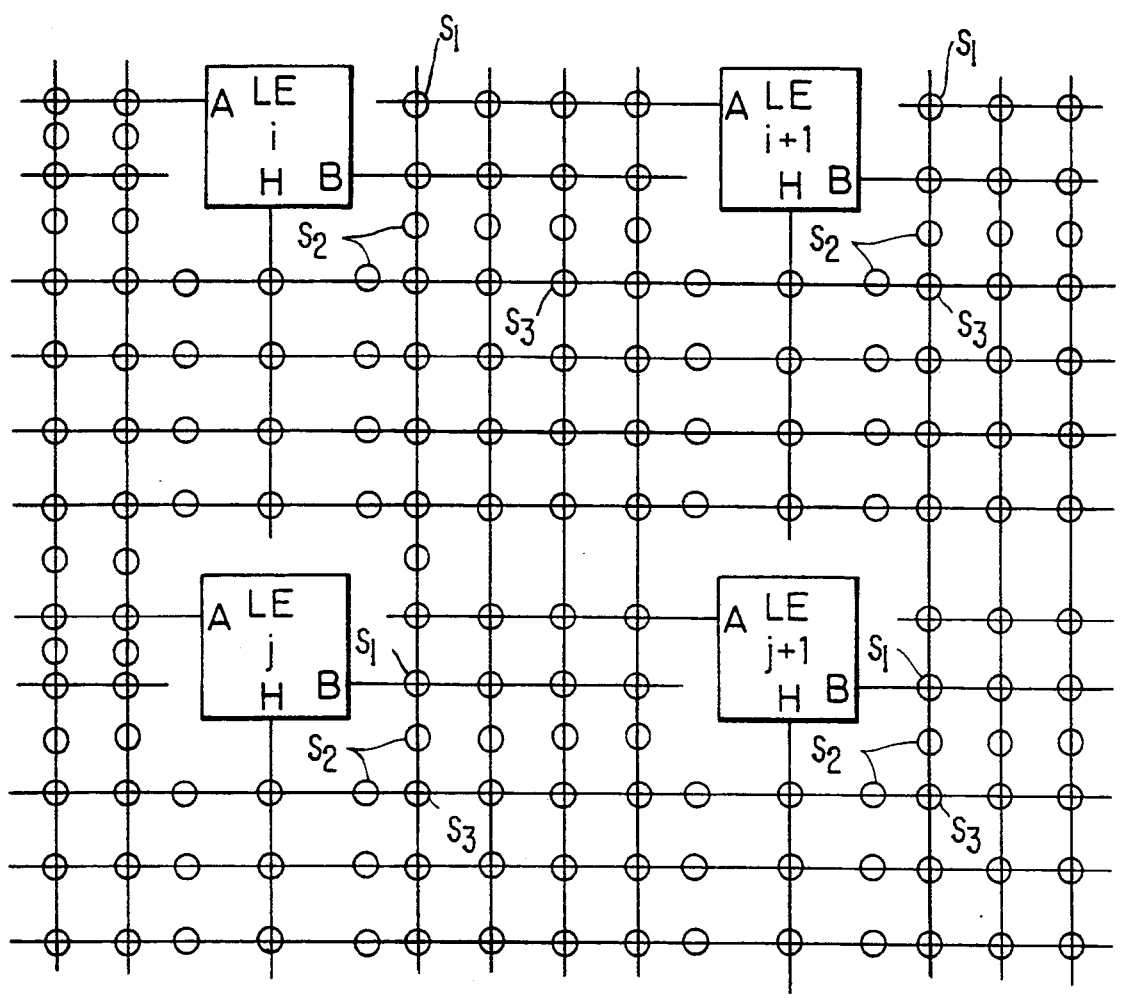
FIG. 93 is an enlarged partial view of a multiplexed logic module as a modification example of the multiplexed logic module shown in FIG. 90.

Incidentally, the group of unit-delay multiplex logic elements LE shown in FIG. 90 has all input-output terminals only on one side (here, the right side in the same drawing) thereof, and the wiring network is arranged to be connected to the input-output terminals. However, it is not necessary to limit the wiring relation to that shown in FIG. 90, and it is also possible to form such wiring construction as shown in FIG. 93, in which the input-output terminals of each LE are distributed on each side thereof and the wiring network is arranged to be connected to the distributed terminals respectively.

Next, a multiplex logic module LM-comprising a plurality of unit-delay multiplexed logic elements LE's which are arranged in the matrix form and connected to one another with a wiring network is explained.

Generally, conventional logic modules have 64 terminals at each side thereof (the total sum is 256 terminals) for giving and receiving information to the outside. However, according to this embodiment comprising a plurality of unit-delay multiplexed logic elements LE's for processing the above-mentioned multiplex signals, the number of terminals on each side of the multiplex logic module LM can be reduced into 16 (the total sum is 64). Incidentally, the circuit area occupied by terminals for giving clock signals and program data or of a terminal for the power source is negligible.

Figure 94:
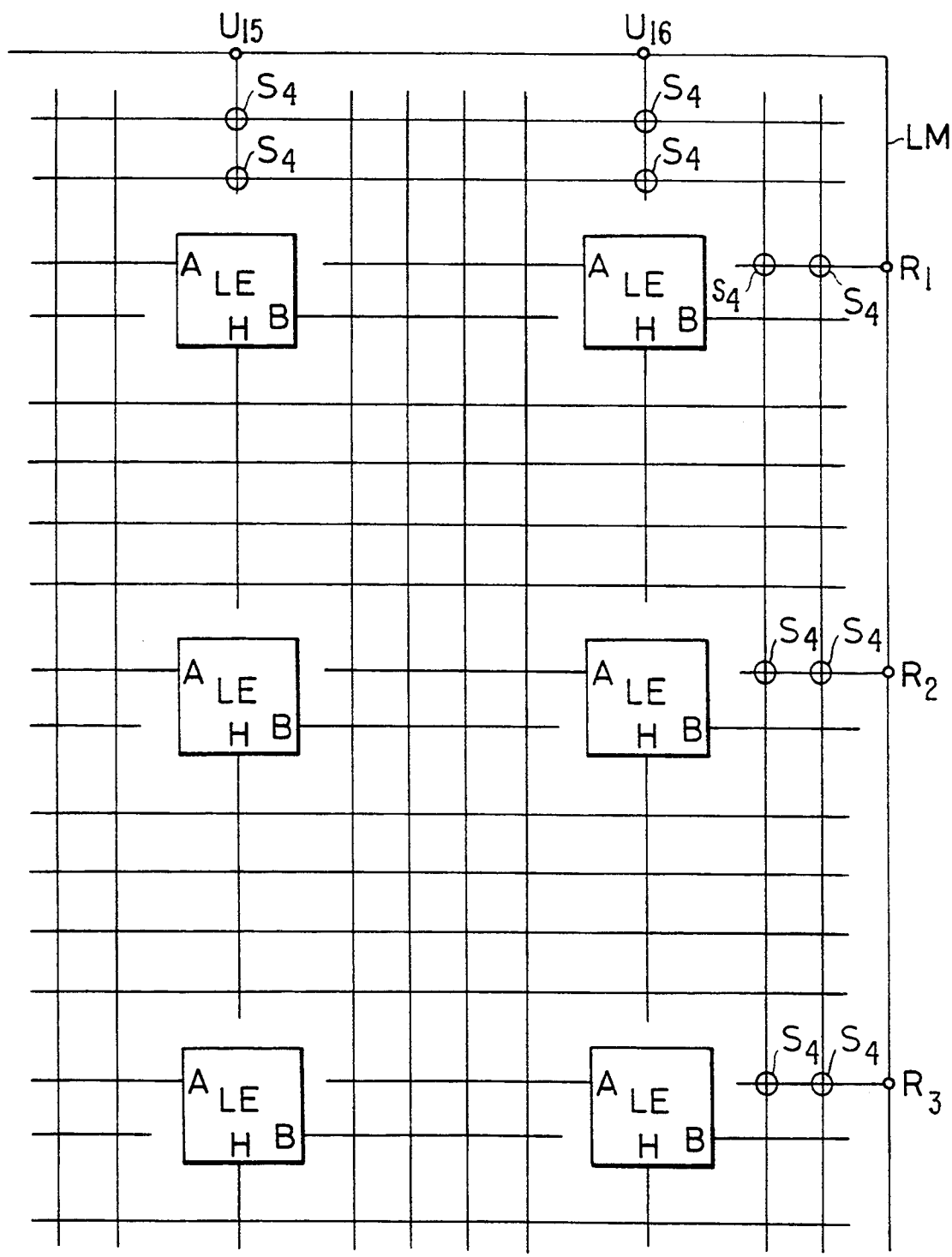
FIG. 94 is a diagram to explain signal terminals and connection switches in the multiplexed logic module shown in FIG. 93.

FIG. 94 shows relation between signal terminals of the multiplex logic module LM having 16 signal terminals on each side thereof and the internal signal lines. Moreover, in the same drawing, a part of signal terminals of U1 to U16 is enlargedly shown on the upper side of the module LM, and a part of signal terminals R1 to R16 is similarly shown on the right side.

Figure 95A:
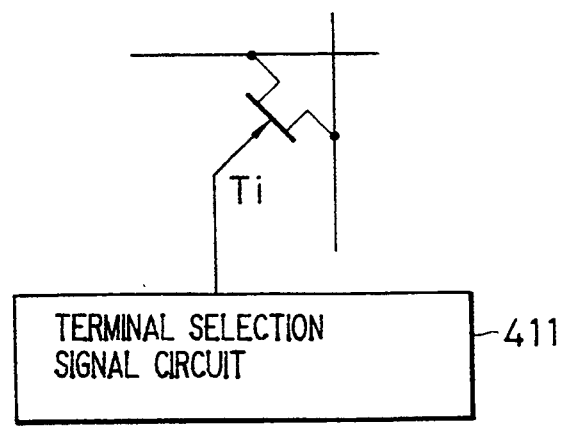
FIG. 95A is a diagram to explain a function of the connection switch shown in FIG. 94.
Figure 95B:
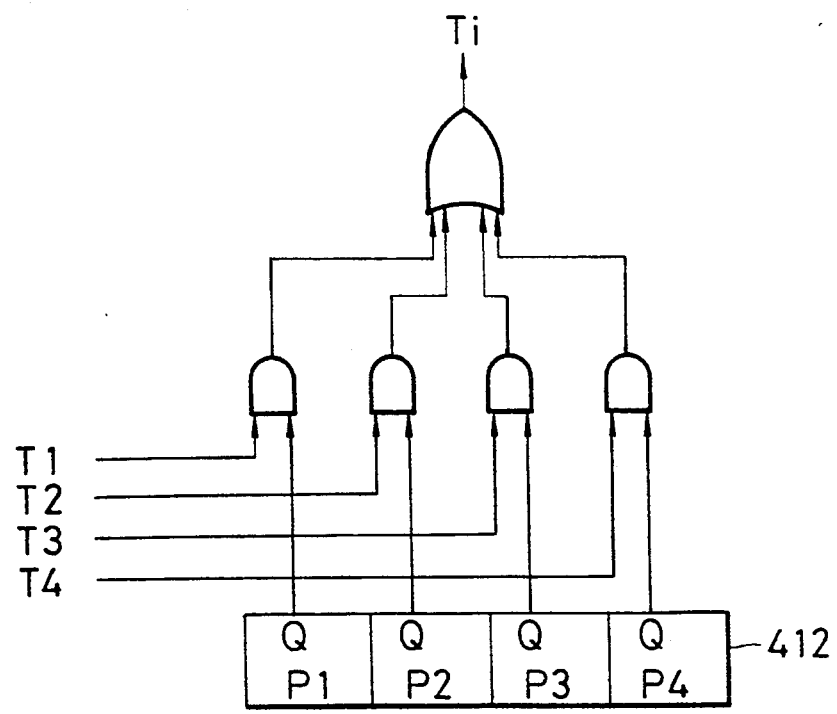
FIG. 95B is a circuit diagram of a terminal selecting signal circuit for the connection switch shown in FIG. 95A.

Namely, the terminals U1 to U16 and R1 to R16 of the module LM are selectively connected to the internal signal lines of the same module LM through switches s4. The switch s4 comprises a switch transistor as shown in FIG. 95A, and the gate of the transistor receives a signal outputted from a terminal selection signal circuit 411. Namely, as shown In FIG.95B, the terminal selection signal circuit 411 gives the switch transistor a timing pulse Ti which is decided by a timing register 412 in the same manner as in case of the timing indication circuit 409 shown in FIG. 92. Thus, each switch transistor can branch the signal line independently with respect to the four kinds of signals.

Incidentally, when signals in the multiplex logic module LM are given to or received from the outside, ordinarily a buffer circuit is used. However, this buffer circuit is not shown in FIG. 94.

Accordingly, in case of the multiplex logic module LM of this embodiment, if data for closing and opening each switch s4 are inputted in advance to the timing register 412 of the terminal, selection signal circuit 411, it is possible to freely transmit multiplex signals of the module LM to the outside, moreover, it is also possible to input multiplex signals therein.

Figure 96:
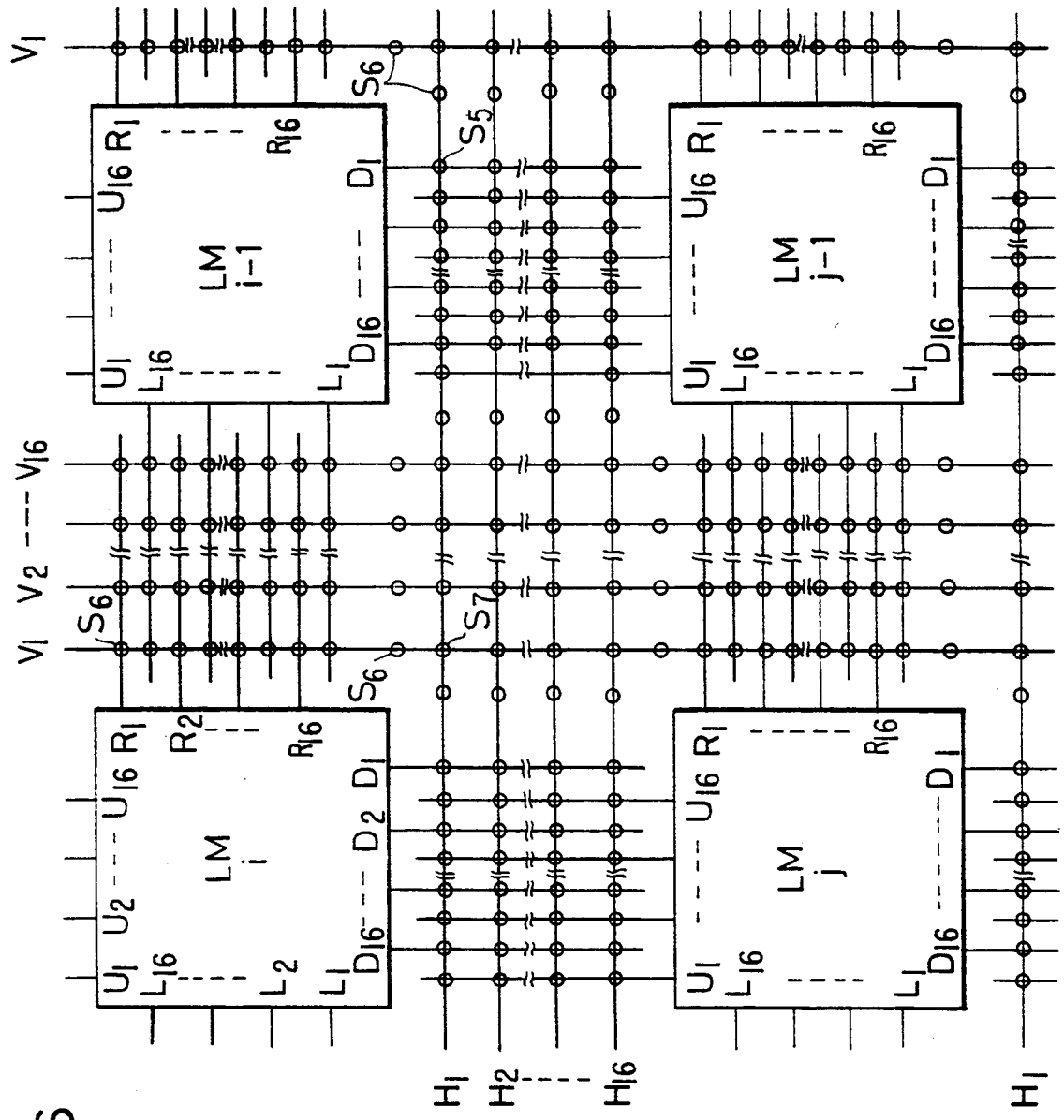
FIG. 96 is an enlarged partial view of a logic simulator constructed with the multiplexed logic module shown in FIG. 93.
Figure 97:
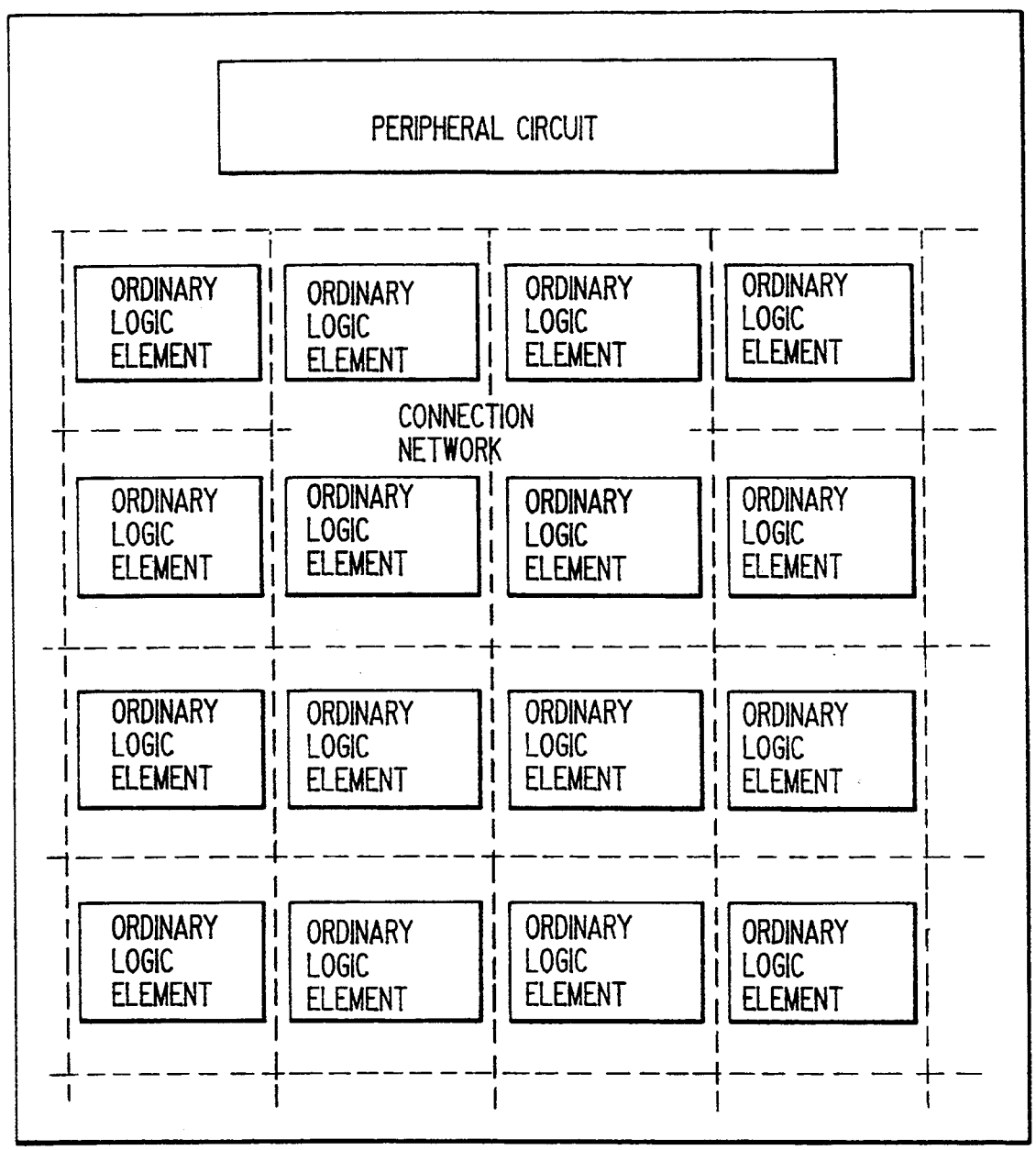
FIG. 97 shows the entire body of a conventional logic module.
Figure 98:
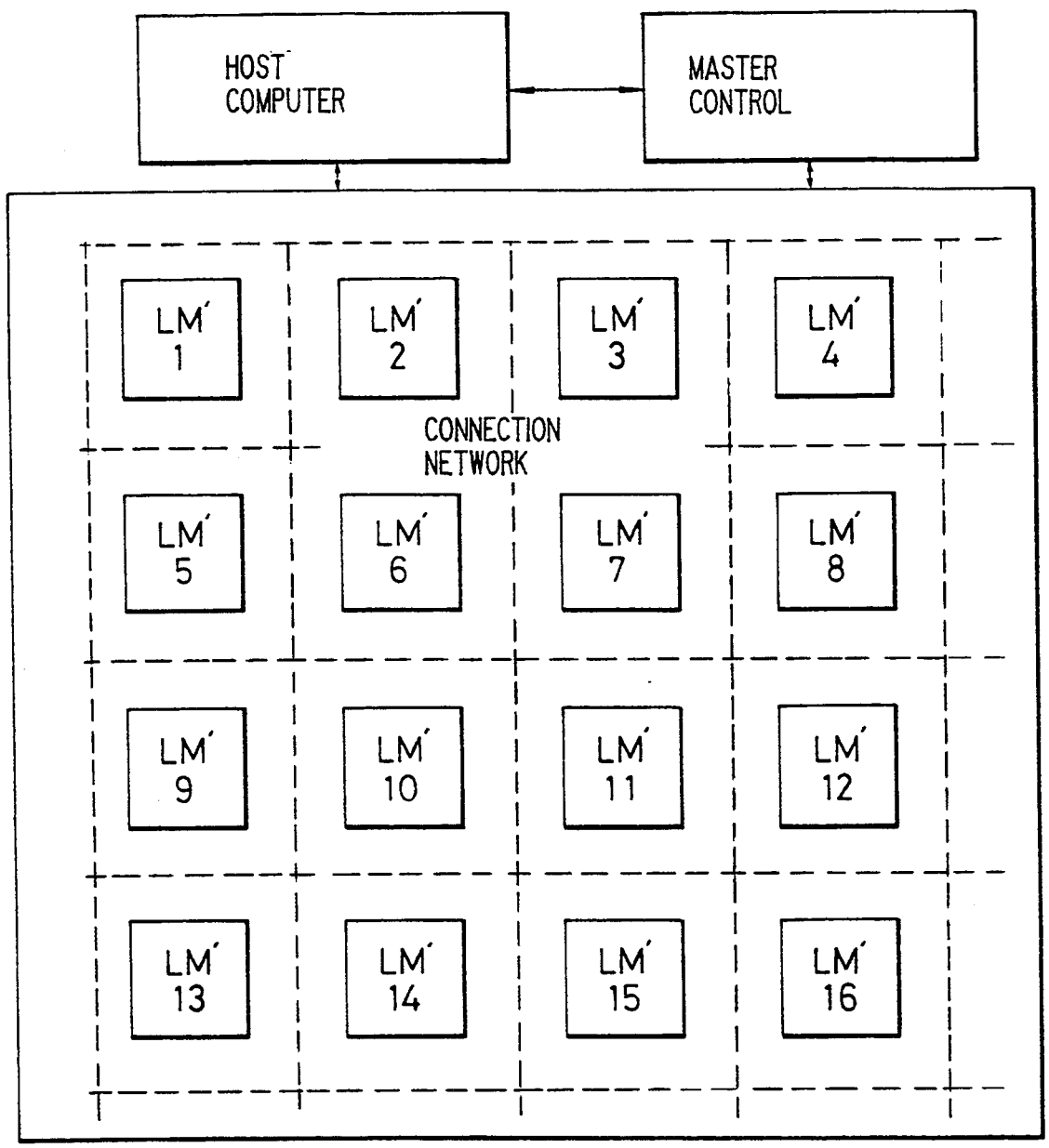
FIG. 98 shows the entire body of a logic simulator constructed with the logic module shown in FIG. 97.
Figure 99:
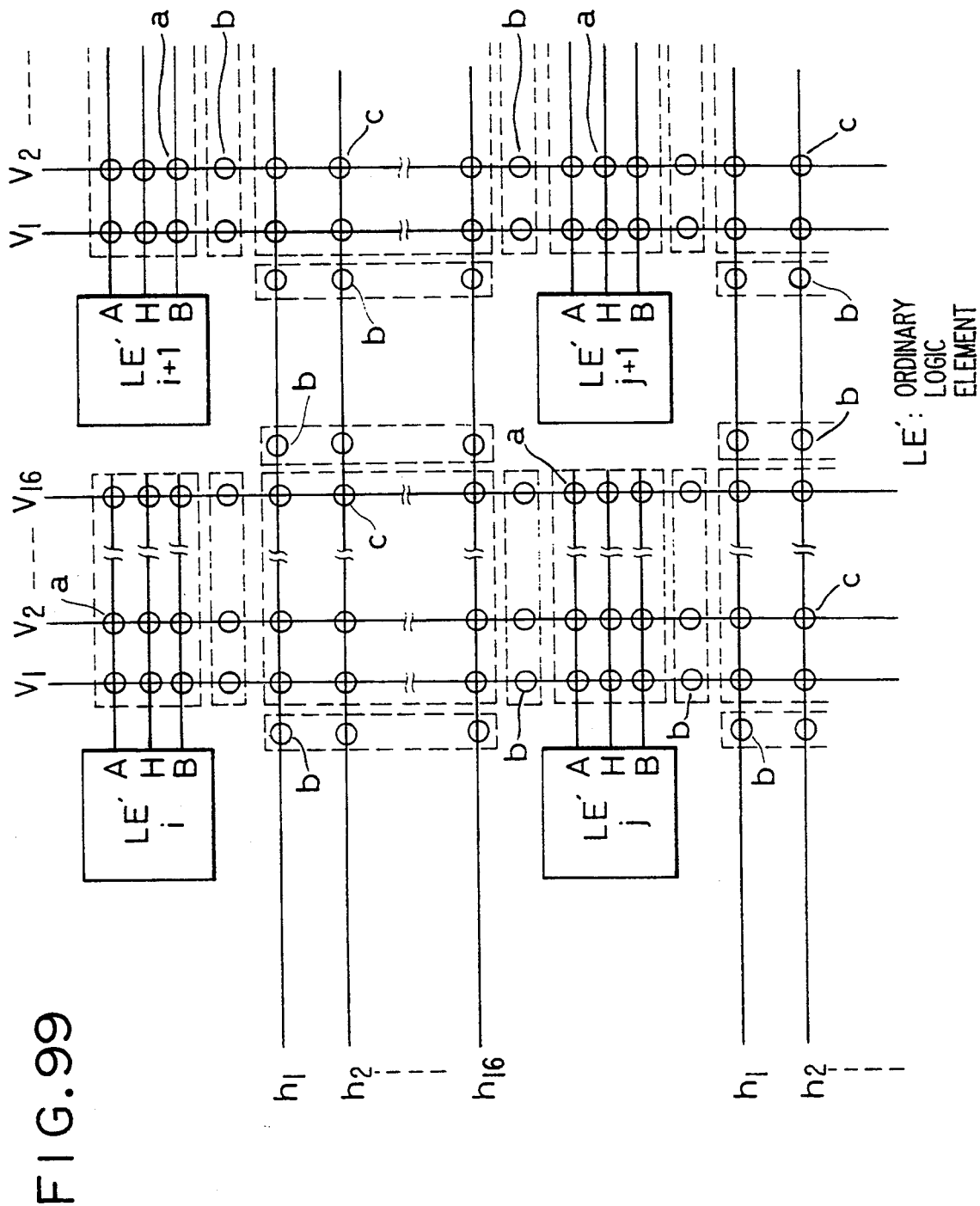
FIG. 99 is a diagram to explain connection relation between logic elements used in the logic module shown in FIG. 97.
Figure 100A:
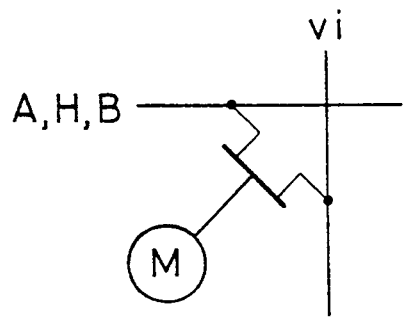
FIGS. 100A to 100C are diagrams to respectively explain functions of connection switches shown in FIG. 99.
Figure 100B:
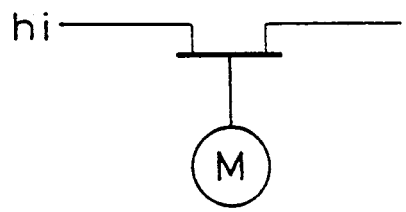
Figure 100C:
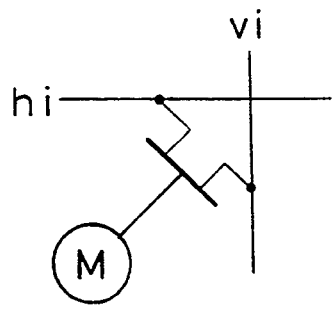

Next, a logic simulator comprising a plurality of multiplex logic modules LM's which are arranged in the matrix form and connected to one another with a wiring network is explained with reference to FIG. 96.

As shown in the same drawing and also described above, each multiplex logic module requires 16 terminal signal lines to the 16 input-output terminals on each side thereof. Moreover, in this embodiment, other 16 signal lines are so arranged as to cross these 16 terminal signal lines.

Figure 101:
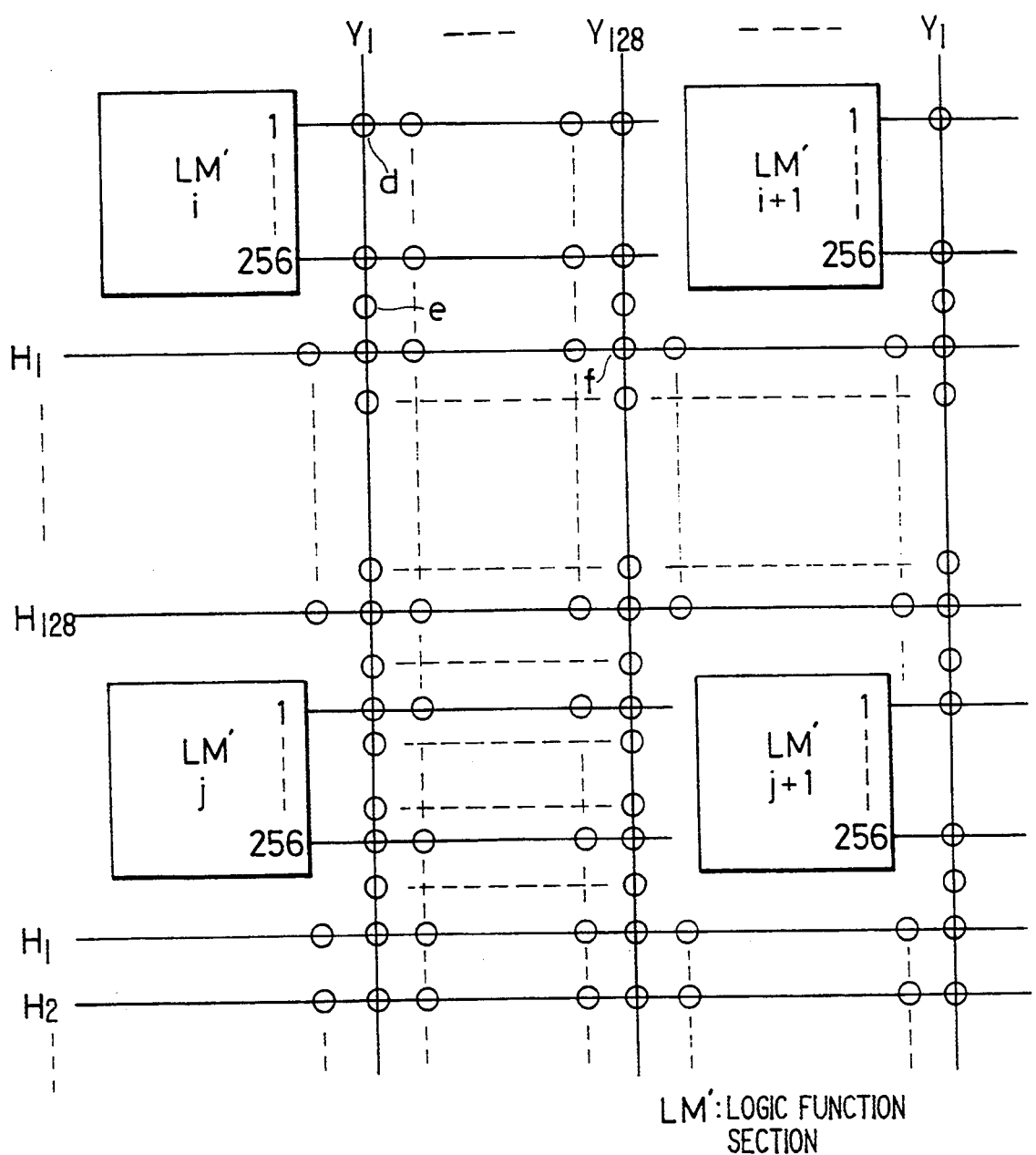
FIG. 101 is a diagram to explain connection relation between the logic modules shown in FIG. 95.

Incidentally, in a conventional example shown in FIG. 101, 128 internal signal lines are provided to signal lines used for terminals on each side of a logic module LM'. On the other hand, in the logic simulator of this embodiment, since 16 crossing signal lines are used in common for the terminal signal lines of two multiplex logic modules LM's facing each other and respectively each logic module LM handles the multiplex signals each produced by multiplexing four signals, 16 (128 lines/4 by signal multiplexing/2) is enough for the number of the crossing signal lines.

In the logic simulator having the above-mentioned construction, 1000 pieces (16 terminals×16 signal lines ×4 sides) of switches s5 for connecting the input-output terminals with the wiring network, 256 pieces (4 directions ×16 signal lines×4 sides) of switches s6 for connecting or disconnecting the signals lines, and 1000 pieces (16 signal lines×16 signal lines×4 sides) of switches s7 for branching the signal lines are required for each multiplex logic module LM. Accordingly, only 600,000 pieces of switches are required in a logic simulator comprising 256 pieces of multiplex logic modules LM's. However, the conventional example shown in FIG. 101 requires 12,000,000 pieces of switches. Thus, according to this embodiment, It becomes possible to produce a logic simulator comprising very compact logic modules.

Incidentally, the switches s5, s6, s7 are respectively operated in the same mechanisms as mentioned in case of the switches s1, s2, s3 with reference to FIGS. 91A to 91C.

As stated above, according to the fourth embodiment, it is possible to provide a logic simulator constructed with the unit-delay multiplexed logic element LE which can select a predetermined pulse signal from multiplex signals each produced by multiplexing four signals and convert them into a multiplexable signal by giving them a logic operation. Therefore, by using the logic simulator, it becomes possible not only to realize an optionally desired logic circuit but also to reduce both numbers of signal lines and switches in the two-dimensional network into about 1/16 ($\frac{1}{4}\times\frac{1}{4}$) respectively as compared with those in the conventional wiring system. Namely, the area occupied by the wiring network in the logic simulator can be greatly reduced.

Incidentally, though only the case where each multiplex signal is produced by multiplexing four signals is explained above, it also possible to use signals more highly multiplexed. Namely, according to the conventional technology, it is possible to produce one multiplex signal by multiplexing 16 signals. Therefore, the numbers of signal lines and switches in the wiring network can be more reduced with such more highly multiplexed signals.

Moreover, though the multiplexing process is carried out with time-shared pulse signals in the fourth embodiment, it is also possible to employ the so-called PAM method or PW method in which the amplitude or time interval of each signal to be processed is suitably controlled. Besides, it is also possible to use carrier waves as the signals by suitably changing the amplitude, frequency or phase thereof.

Namely, according to the fourth embodiment, the logic simulator comprises a unit-delay multiplexed logic element provided with sampling hold means corresponding to each multiplex input signal, the sampling hold means comprising sampling signal generating means for generating a signal to sample only a specific pulse signal from a multiplex input signal, sampling means for sampling the specific pulse signal sampled by the sampling signal generating means in a predetermined simulation cycle, and hold means for holding the specific pulse signal sampled by the sampling means, and converting the signal at start of a new simulation cycle into a restoration signal having a constant level during the new simulation cycle; and further provided with an ordinary logic circuit for outputting a logic output signal produced by giving a predetermined logic operation to the restoration signal outputted from the sampling hold means, and pulse means for sampling the logic output signal at a predetermined timing and outputting an operated multiplexable pulse signal. Therefore, it becomes possible to give a predetermined logic operation only to a desired pulse signal in a group of pulse signals multiplexed on the same signal line, thereby to greatly reduce the number of signal lines in the wiring network.

Moreover, the pulse signal outputted from each row or column of the unit-delay multiplexed logic element array is successively transferred to another row or column of the unit-delay logic elements, moreover, a predetermined logic operation is independently given to each multiplex input signal in each row or column in the unit-delay multiplex logic element array at each simulation cycle. Therefore, it becomes possible to realize an optionally desired logic circuit, further, the area occupied by the wiring network and switches for connecting the unit-delay multiplex logic elements to one another can be greatly reduced.

Various modifications will become possible for those skilled in the art after receiving the teachings of the present disclosure without departing from the scope thereof.

What is claimed is:

1. A logic simulator comprising:

a plurality of stages each having a plurality of logic function sections for realizing functions equivalent to a circuit to be simulated;

a plurality of connection sections for connecting these logic function sections;

a plurality of memory means to receive inputs indicative of data and control information;

a control section for constructing a simulation circuit by controlling said logic function sections and connection sections so as to execute logic simulation by said simulation circuit;

holding means for creating connections of logical switching elements prior to the execution of said logic simulation;

stopping means for stopping a logic simulation upon receipt of an interruption signal produced by an individual logic element; and a host computer for serving as an interface to a designer and for providing a means by which the designer can input the design of the circuit to be simulated.

2. The logic simulator according to claim 1, wherein each logic function section comprises a plurality of logic elements having functions equivalent to one of a combinational circuit or a sequential circuit and connection elements for connecting these logic elements.

3. The logic simulator according to claim 2, wherein each logic element comprises data memory means for storing data equivalent to data to be outputted from an optional logic circuit and control information memory means for storing control information to control the logic element, so that the logic element receives a signal outputted from a logic element on the previous stage as an address signal, holds data stored at an address in the data memory means designated by the address signal based on the control information from the control information memory means, and outputs a unit-delay signal.

4. The logic simulator according to claim 2, wherein The connection section and connection element respectively comprise a plurality of connection lines, switching elements respectively placed on these connection lines, and hold means for holding information to control ON/OFF of each switching element, so that each connection line is connected or disconnected based on the control information held in the hold means.

5. The logic simulator according to claim 2, wherein each logic element includes a universal logic gate, the input terminals of the universal logic gate being respectively connected to the input terminals of the logic element through a plurality of switches so as to realize a predetermined logic function with a function of the logic element by changing connection relation between the input terminals of the universal logic gate and the input terminals of the logic element by suitable ON/OFF operation of these switches.

6. The logic simulator according to claim 2, wherein each of logic elements includes memory means for storing information to decide a logic function and memory means for storing other control information, and having a programmable logic array (PLA) circuit which is so constructed as to develop each logic corresponding to input signals with an AND plane and selectively obtain the output of the AND plane through an OR plane based on the information given in advance to the memory means in accordance with truth values of a logic circuit to be realized, in order to output a unit-delay signal.

7. A unit-delay multiplexed logic element, comprising:

sampling hold means corresponding to each multiplex input signal, which includes:

sampling signal generating means for generating a signal to sample only a specific pulse signal from a multiplex input signal, sampling means for sampling the specific pulse signal sampled by the sampling signal generating means in a predetermined simulation cycle, and hold means for holding the specific pulse signal sampled by the sampling means, and converting the signal start of the new simulation cycle into a restoration signal having a constant level during the new simulation cycle;

an ordinary logic circuit for outputting a logic output signal produced by giving a predetermined logic operation to the restoration signal outputted from the sampling hold means; and pulse means for sampling the output of said ordinary logic circuits output signal at a predetermined timing and outputting an operated multiplexable pulse signal only in response to said specific pulse signal from said sampling signal generating means.

* * * * *